(12) United States Patent
Yun et al.

(10) Patent No.: US 11,695,094 B2
(45) Date of Patent: Jul. 4, 2023

(54) PIXEL AND DISPLAY DEVICE INCLUDING THE SAME

(71) Applicant: Samsung Display Co., Ltd., Yongin-si (KR)

(72) Inventors: Hae Ju Yun, Yongin-si (KR); Yong Sub Shim, Yongin-si (KR); Jin Yool Kim, Yongin-si (KR); Min Seong Yi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 17/188,963

(22) Filed: Mar. 1, 2021

(65) Prior Publication Data

US 2021/0376192 A1 Dec. 2, 2021

(30) Foreign Application Priority Data

May 28, 2020 (KR) .......................... 10-2020-0064178

(51) Int. Cl.
*H01L 33/24* (2010.01)
*H01L 33/58* (2010.01)
*H01L 33/38* (2010.01)

(52) U.S. Cl.
CPC ............ *H01L 33/24* (2013.01); *H01L 33/387* (2013.01); *H01L 33/58* (2013.01)

(58) Field of Classification Search
CPC ........ H01L 33/24; H01L 33/387; H01L 33/58
See application file for complete search history.

(56) References Cited

U.S. PATENT DOCUMENTS

| 9,588,375 | B2 | 3/2017 | Yun et al. | |
|---|---|---|---|---|
| 9,664,937 | B2 | 5/2017 | Lee et al. | |
| 2012/0074414 | A1* | 3/2012 | Lee | ..................... H01L 29/4908 257/E33.012 |
| 2015/0109566 | A1 | 4/2015 | Yun et al. | |
| 2021/0327862 | A1 | 10/2021 | Bae et al. | |

FOREIGN PATENT DOCUMENTS

KR  10-2021-0129790 A  10/2021

OTHER PUBLICATIONS

On top of. (n.d.) Farlex Dictionary of Idioms. (2015). Retrieved Oct. 5, 2022 from https://idioms.thefreedictionary.com/on+top+of (Year: 2015).*

* cited by examiner

*Primary Examiner* — Jay C Chang
*Assistant Examiner* — Mikka Liu
(74) *Attorney, Agent, or Firm* — Lewis Roca Rothgerber Christie LLP

(57) ABSTRACT

A display device includes a pixel in a display area. The pixel includes: a first electrode and a second electrode spaced from each other; a light emitting element between the first electrode and the second electrode, a first bank overlapping with one area of each of the first electrode and the second electrode in a plan view, the first bank including a first sidewall adjacent to the first end portion of the light emitting element and a second sidewall adjacent to the second end portion of the light emitting element; at least one of a third electrode on the first end portion of the light emitting element to connect the first end portion to the first electrode and a fourth electrode on the second end portion to connect the second end portion of the light emitting element to the second electrode.

21 Claims, 38 Drawing Sheets

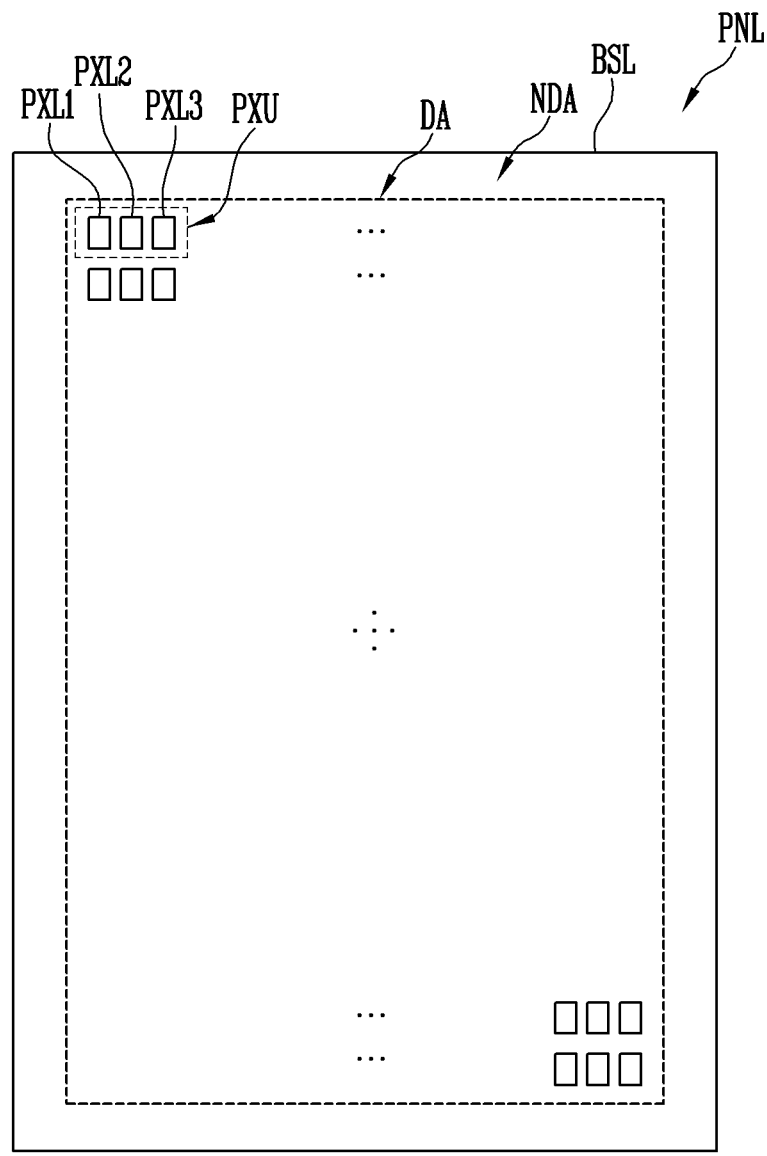

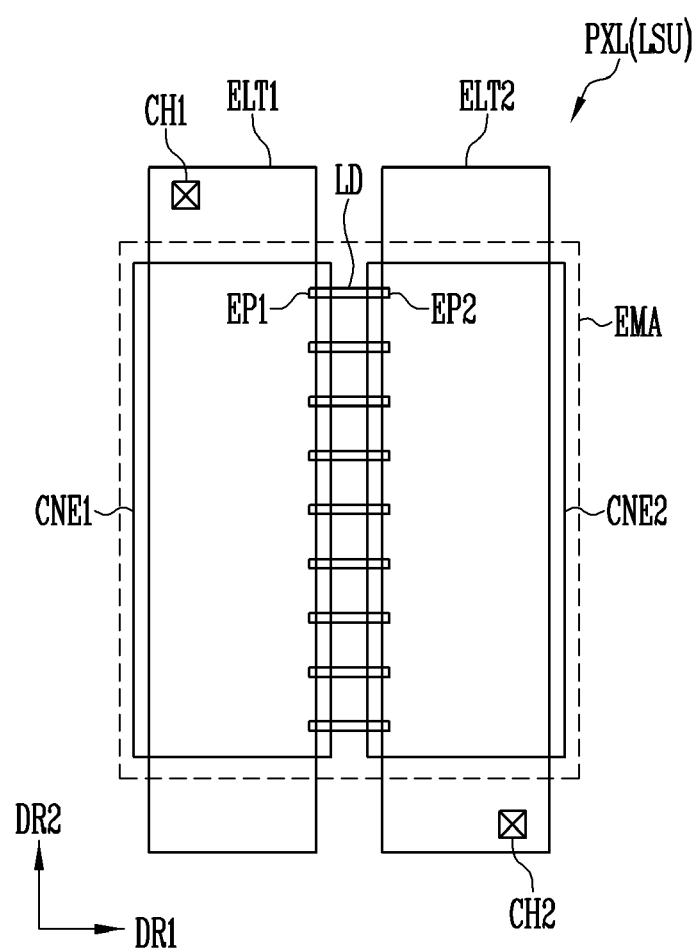

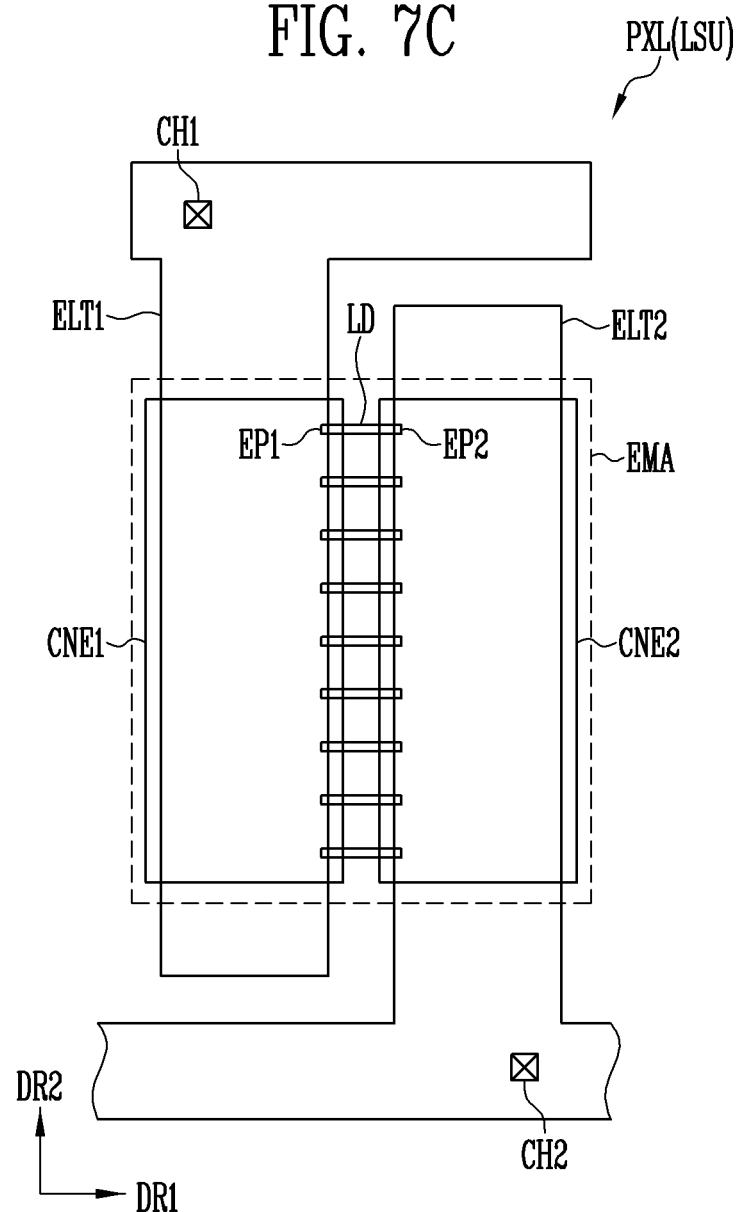

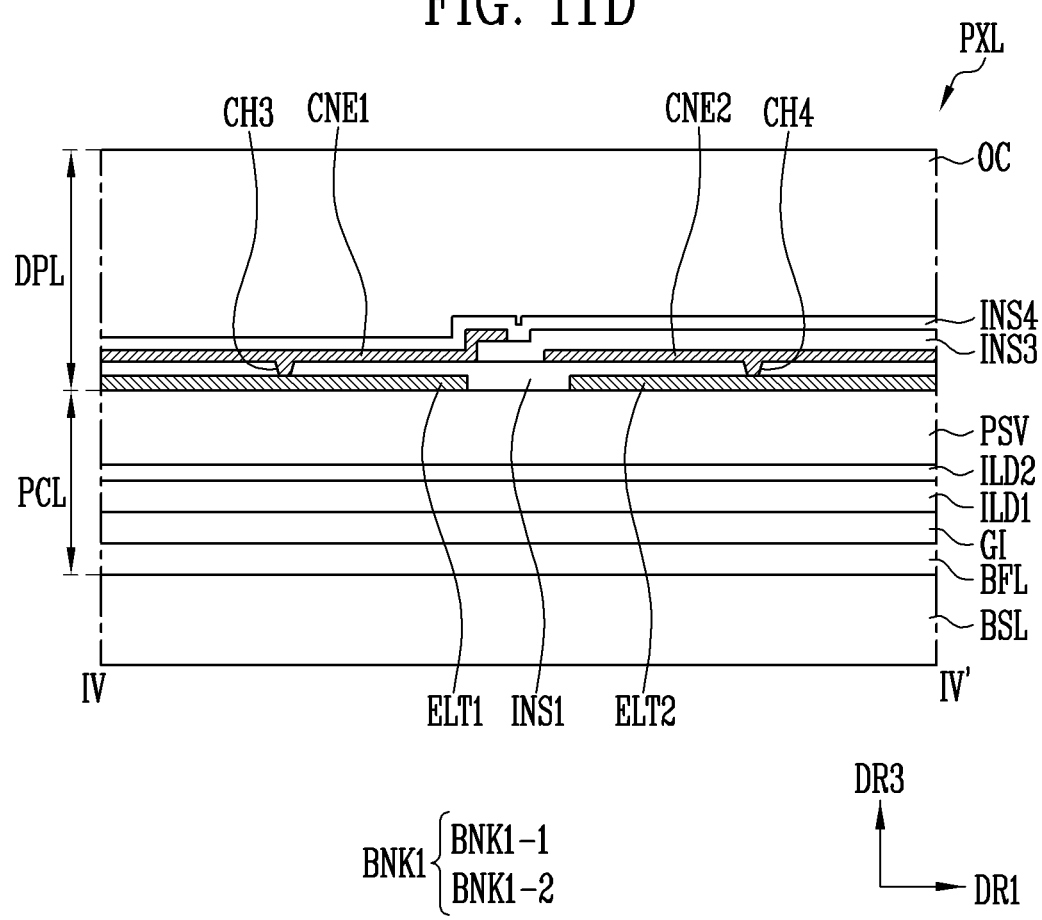

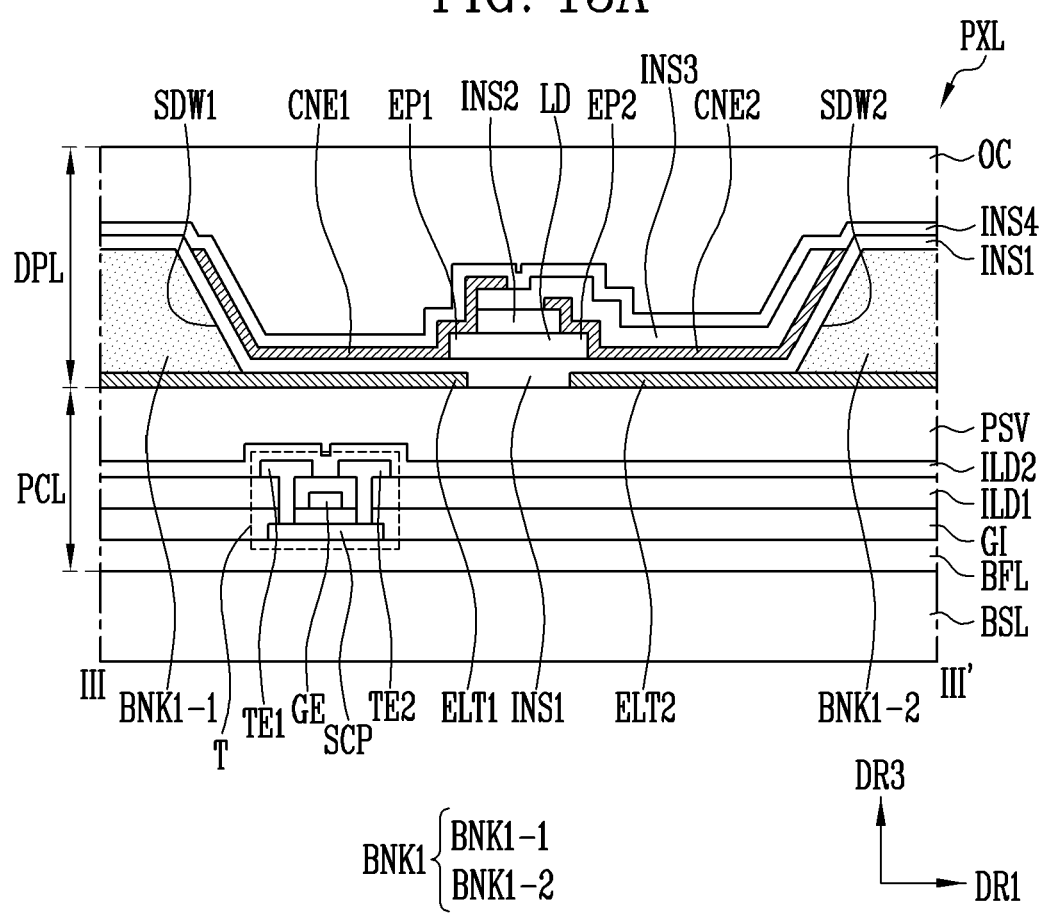

PIXEL AND DISPLAY DEVICE INCLUDING THE SAME

CROSS-REFERENCE TO RELATED APPLICATION

This application claims priority to and the benefit of Korean patent application 10-2020-0064178 filed on May 28, 2020 in the Korean Intellectual Property Office, the entire disclosure of which is incorporated herein by reference.

BACKGROUND

1. Field

The present disclosure generally relates to a pixel and a display device including the same.

2. Related Art

Recently, interest in information displays has increased. Accordingly, research and development of display devices have been continuously conducted.

SUMMARY

One or more example embodiments of the present disclosure provide a pixel including a light emitting element and a display device including the pixel.

In accordance with some embodiments of the present disclosure, there is provided a display device including: a pixel in a display area on a base layer, wherein the pixel includes: a first electrode and a second electrode, the first and second electrodes being spaced from each other; a light emitting element between the first electrode and the second electrode, the light emitting element including a first end portion and a second end portion; a first bank overlapping with one area of each of the first electrode and the second electrode in a plan view, the first bank including a first sidewall adjacent to the first end portion of the light emitting element and a second sidewall adjacent to the second end portion of the light emitting element; at least one of a third electrode on the first end portion of the light emitting element to connect the first end portion to the first electrode and a fourth electrode on the second end portion of the light emitting element to connect the second end portion of the light emitting element to the second electrode; and an insulating layer over the fourth electrode, and wherein one end of at least one of the third electrode, the fourth electrode, and the insulating layer ends at at least one of the first sidewall and the second sidewall.

One end of the third electrode and one end of the fourth electrode may be respectively ended on the first sidewall and the second sidewall such that upper surfaces of the one end of the third electrode and the one end of the fourth electrode are parallel to the base layer.

The display device may further include at least one of: a first insulating layer over the first electrode and the second electrode; a second insulating layer on one area of the light emitting element, the second insulating layer exposing the first end portion and the second end portion of the light emitting element; a third insulating layer over the second insulating layer and the fourth electrode, the third insulating layer including the insulating layer; and a fourth insulating layer on top of the first to fourth electrodes and the light emitting element.

The third insulating layer may have a refractive index greater than those of the first insulating layer and the fourth insulating layer.

One end of the third insulating layer may end at the second sidewall such that an upper surface of the one end is parallel to the base layer.

One end of the third insulating layer may end at a same height as the fourth electrode on the second sidewall.

The second insulating layer may include the same material as the third insulating layer, and be only on top of the one area of the light emitting element.

The display device may further include an overcoat layer on the fourth insulating layer. The overcoat layer may have a refractive index smaller than those of the first to fourth electrodes.

One end of the third electrode may end at a highest height of the first sidewall with respect to the base layer, and one end of the fourth electrode may end at a highest height or the second sidewall with respect to the base layer.

One end of the third electrode ends at a height less than a highest height of the first sidewall with respect to the base layer, and one end of the fourth electrode ends at a height less than a highest height of the second sidewall with respect to the base layer.

The first electrode may be on top of one area of the first bank including the first sidewall, and the second electrode may be on top of another area of the first bank including the second sidewall.

The first electrode may be at bottom of one area of the first bank including the first sidewall, and the second electrode may be at bottom of another area including the second sidewall.

The first bank may include: a (1-1)th bank overlapping with the first electrode and the third electrode in a plan view; and a (1-2)th bank overlapping with the second electrode and the fourth electrode in a plan view, the (1-2)th bank being separated from the (1-1)th bank.

The first bank may surround an area in which the light emitting element is, while having an opening or groove corresponding to the area in which the light emitting element is.

The first electrode and the third electrode may be connected to each other at at least one first contact portion located in an upper area or a lower area of the third electrode in a plan view, and the second electrode and the fourth electrode may be connected to each other at at least one second contact portion located in an upper area or a lower area of the fourth electrode in a plan view.

The display device may further include: at least one first contact hole located at the first contact portion, to connect the first electrode and the third electrode; and at least one second contact hole located at the second contact portion, to connect the second electrode and the fourth electrode.

In accordance with another aspect of the present disclosure, there is provided a pixel including: a first electrode and a second electrode, the first and second electrodes on one surface of a base layer to be spaced from each other; a light emitting element between the first electrode and the second electrode, the light emitting element including a first end portion and a second end portion; a first bank overlapping with one areas of each of the first electrode and the second electrode in a plan view, the first bank including a first sidewall adjacent to the first end portion of the light emitting element and a second sidewall adjacent to the second end portion of the light emitting element; at least one of a third electrode on the first end portion of the light emitting element to connect the first end portion of the light emitting element to the first electrode and a fourth electrode on the second end portion of the light emitting element to connect the second end portion of the light emitting element to the second electrode; and an insulating layer over the fourth electrode, wherein one end of at least one of the third electrode, the fourth electrode, and the insulating layer ends at at least one of the first sidewall and the second sidewall.

One end of at least one of the third electrode and the fourth electrode may end at respective one of the first sidewall and the second sidewall such that an upper surface of each of the one end is parallel to the base layer.

The insulating layer may end at the second sidewall such that an upper surface of the insulating layer is parallel to the base layer.

The first electrode and the second electrode may be on the top of the first bank.

The first electrode and the second electrode may be at the bottom of the first bank.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a plan view illustrating a display device in accordance with one or more example embodiments of the present disclosure.

FIGS. 7A-7D are plan views each illustrating a pixel in accordance with one or more example embodiments of the present disclosure.

FIGS. 11A-11D are sectional views each illustrating a pixel in accordance with one or more example embodiments of the present disclosure.

FIGS. 13A and 13B are sectional views each illustrating a pixel in accordance with one or more example embodiments of the present disclosure.

DETAILED DESCRIPTION

Figure 1A:
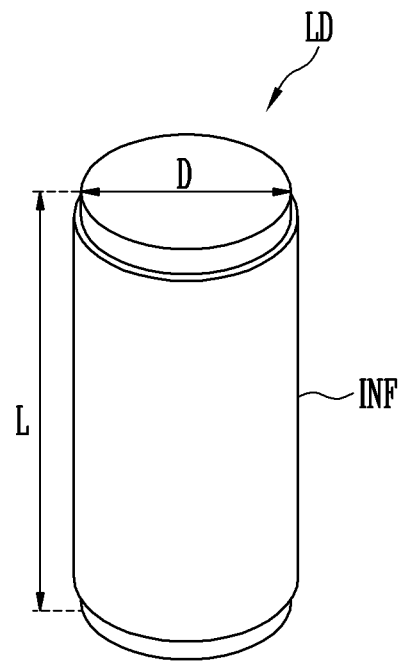
FIGS. 1A and 1B are a perspective view and a sectional view illustrating a light emitting element in accordance with one or more example embodiments of the present disclosure.

The present disclosure may apply various changes and different shape, therefore only illustrate in details with particular examples. As used herein, the singular forms are intended to include the plural forms as well, unless the context clearly indicates otherwise.

The present disclosure is not limited to embodiments disclosed below, and may be implemented in various forms. Each embodiment disclosed below may be independently embodied or be combined with at least another embodiment prior to being embodied.

In the following embodiments and the attached drawings, elements not directly related to the present disclosure are omitted from depiction, and dimensional relationships among individual elements in the attached drawings are illustrated only for ease of understanding but not to limit the actual scale. It should note that in giving reference numerals to elements of each drawing, like reference numerals refer to like elements even though like elements are shown in different drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present. Similarly, the terms related to orientations of an object, such as horizontally or vertically, may apply only when the object is in a particular orientation (e.g., during a normal use) and/or how the object appears in the figures, and it is to be understood that the terms may not apply when the object is rotated or flipped to be in other orientations.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

FIGS. 1A and 1B, 2A and 2B, and 3A and 3B are perspective views and sectional views each illustrating a light emitting element LD in accordance with one or more example embodiments of the present disclosure. Although a rod type light emitting element LD having a cylindrical shape is illustrated in FIGS. 1A-3B, the kind and/or shape of the light emitting element LD in accordance with the present disclosure is not limited thereto.

Referring to FIGS. 1A-3B, the light emitting element LD includes a first semiconductor layer 11, a second semiconductor layer 13, and an active layer 12 interposed between the first and second semiconductor layers 11 and 13. For example, the light emitting element LD may include the first semiconductor layer 11, the active layer 12, and the second semiconductor layer 13, which are sequentially stacked along a length L direction.

The light emitting element LD may be provided in a rod shape extending along one direction. When assuming that an extending direction of the light emitting element LD is the length L direction, the light emitting element LD may have a first end portion EP1 and a second end portion EP2 along the length L direction.

One of the first and second semiconductor layers 11 and 13 may be disposed at the first end portion EP1 of the light emitting element LD. In addition, the other one of the first and second semiconductor layers 11 and 13 may be disposed at the second end portion EP2 of the light emitting element LD.

In some embodiments, the light emitting element LD may be a rod type light emitting element (also referred to as a "rod type light emitting diode") manufactured in a rod shape through an etching process, etc. In this specification, the term "rod shape" may include a rod-like shape or bar-like shape, which is long in the length L direction (i.e., its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a small size in micro scales or nano scales. For example, the light emitting element LD may have a diameter D and/or a length L in a range of micro scales or nano scales. However, the size of the light emitting element LD is not limited thereto. For example, the size of the light emitting element LD may be variously modified according to design conditions of various types of devices, e.g., a display device, and the like, which use, as a light source, a light emitting apparatus using the light emitting element LD.

The first semiconductor layer 11 may be a first conductivity type semiconductor layer. For example, the first semiconductor layer 11 may include at least one N-type semiconductor layer. For example, the first semiconductor layer 11 may include any one semiconductor material from among InAlGaN, GaN, AlGaN, InGaN, AlN, and InN, and include an N-type semiconductor layer doped with a first conductivity type dopant such as Si, Ge or Sn. However, the material constituting the first semiconductor layer 11 is not limited thereto. In addition, the first semiconductor layer 11 may be configured with various materials.

The active layer 12 is formed on the first semiconductor layer 11, and may be formed in a single quantum well structure or a multi-quantum well (MQW) structure. The position of the active layer 12 may be variously changed depending on a kind (or type) of the light emitting element LD. The active layer 12 may emit light having a wavelength of 400 nm to 900 nm, and use a double heterostructure.

A clad layer (not shown) doped with a conductive dopant may be formed on the top and/or the bottom of the active layer 12. For example, the clad layer may be formed as an AlGaN layer or InAlGaN layer. In some embodiments, a material such as AlGaN or AlInGaN may be used to form the active layer 12. In addition, the active layer 12 may be configured with various materials.

The second semiconductor layer 13 is formed on the active layer 12, and may include a semiconductor layer having a type different from that of the first semiconductor layer 11. For example, the second semiconductor layer 13 may include at least one P-type semiconductor layer. For example, the second semiconductor layer 13 may include at least one semiconductor material from among InAlGaN, GaN, AlGaN, InGaN, AlN, and InN, and include a P-type semiconductor layer doped with a second conductivity type dopant such as Mg. However, the material constituting the second semiconductor layer 13 is not limited thereto. In addition, the second semiconductor layer 13 may be configured with various materials.

Figure 1B:
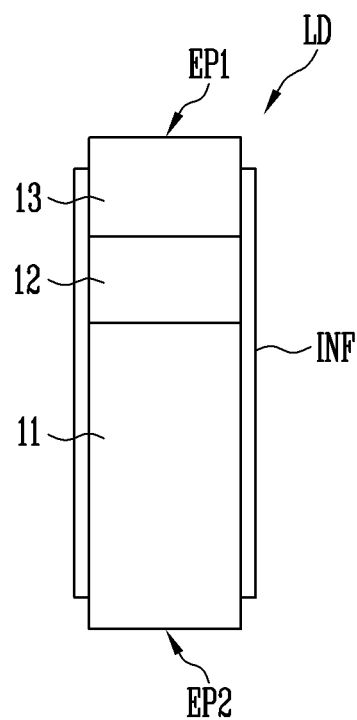

In some embodiments, the first semiconductor layer 11 and the second semiconductor layer 13 may have different lengths (or thicknesses) in the length L direction of the light emitting element LD. For example, the first semiconductor layer 11 may have a length (or thickness) relatively longer (or thicker) than that of the second semiconductor layer 13 along the length L direction of the light emitting element LD. Accordingly, the active layer 12 of the light emitting element LD may be located closer to an upper surface of the second semiconductor layer 13 than a lower surface of the first semiconductor layer 11 as shown in FIGS. 1A and 1B.

When a voltage which is a threshold voltage or more is applied between both ends of the light emitting element LD, the light emitting element LD emits light as electron-hole pairs are combined in the active layer 12. The light emission of the light emitting element LD is controlled by using such a principle, so that the light emitting element LD can be used as a light source for various light emitting apparatuses, including a pixel of a display device.

In some embodiments, the light emitting element LD may further include an additional component, in addition to the first semiconductor layer 11, the active layer 12, the second semiconductor 13, and/or an insulative film INF. For example, the light emitting element LD may additionally include at least one phosphor layer, at least one active layer, at least one semiconductor layer, and/or at least one electrode layer, which are disposed at one end portions of the first semiconductor layer 11, the active layer 12, and/or the second semiconductor layer 12.

Figure 2A:
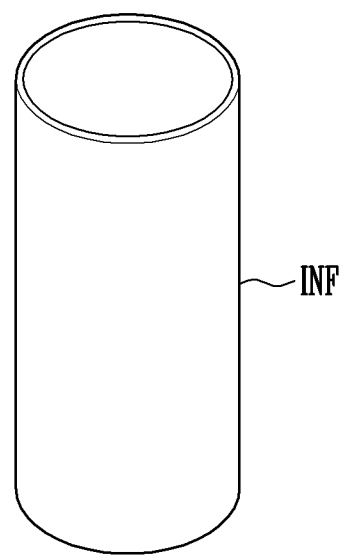
FIGS. 2A and 2B are a perspective view and a sectional view illustrating a light emitting element in accordance with one or more example embodiments of the present disclosure.
Figure 2B:
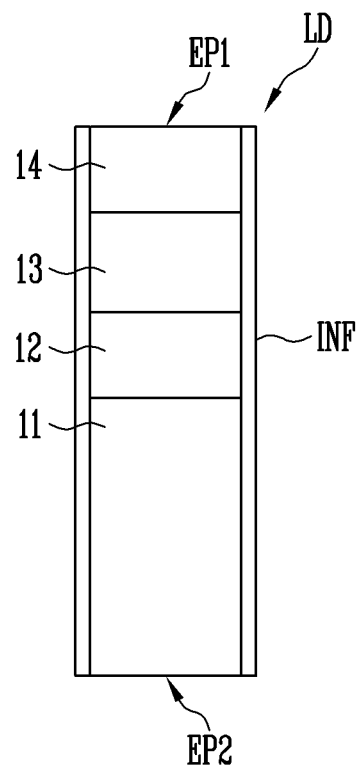

For example, the light emitting element LD may further include an electrode layer 14 disposed at one end of the second semiconductor layer 13 as shown in FIGS. 2A and 2B. The electrode layer 14 may be located at the first end portion EP1 of the light emitting element LD.

Figure 3A:
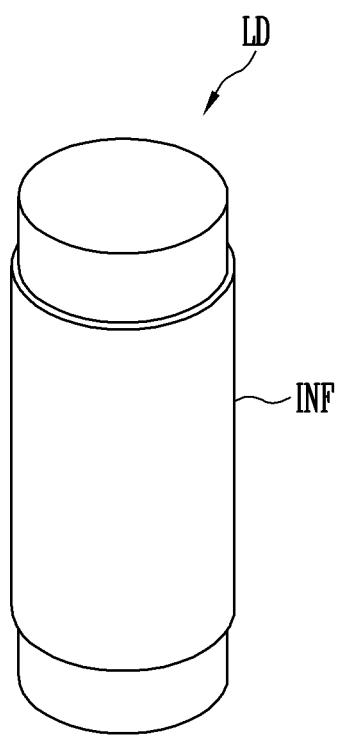
FIGS. 3A and 3B are a perspective view and a sectional view illustrating a light emitting element in accordance with one or more example embodiments of the present disclosure.
Figure 3B:
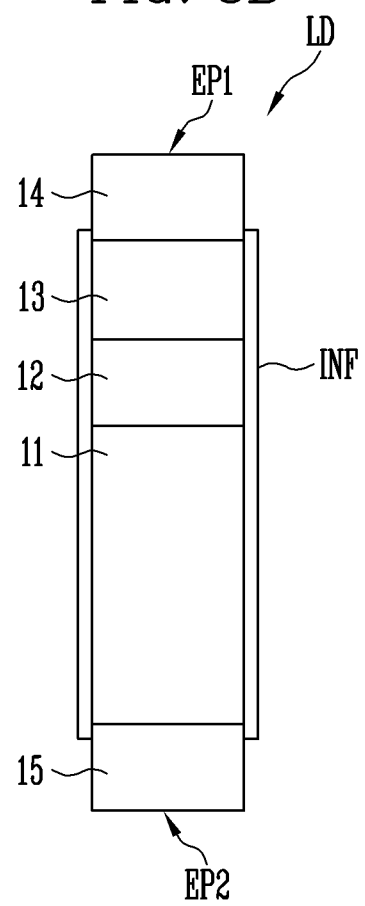

In addition, the light emitting element LD may further include another electrode 15 disposed at one end of the first semiconductor layer 11 as shown in FIGS. 3A and 3B. For example, the electrode layers 14 and 15 may be respectively disposed at the first and second end portions EP1 and EP2 of the light emitting element LD.

The electrode layers 14 and 15 may be ohmic contact electrodes, but the present disclosure is not limited thereto. For example, the electrode layers 14 and 15 may be Schottky contact electrodes.

Also, the electrode layers 14 and 15 may include a metal or metal oxide. For example, the electrode layers 14 and 15 may include one or mixture of chromium (Cr), titanium (Ti), aluminum (Al), gold (Au), nickel (Ni), any oxide or alloy thereof, and indium tin oxide (ITO). The electrode layers 14 and 15 may include the same material or different materials.

The electrode layers 14 and 15 may be substantially transparent or translucent. Accordingly, light generated in the light emitting element LD may be emitted to the outside of the light emitting element LD by being transmitted through the electrode layers 14 and 15. In another embodiment, when light generated in the light emitting element LD is not transmitted through the electrode layers 14 and 15 but emitted to the outside of the light emitting element LD through an area except both the end portions of the light emitting element LD, the electrode layers 14 and 15 may include an opaque metal.

In some embodiments, the light emitting element LD may further include the insulative film INF provided on a surface of the light emitting element LD. The insulative film INF may be formed on the surface of the light emitting element LD to surround an outer surface (e.g., an outer peripheral surface or an outer circumferential surface) of at least the active layer 12. In addition, the insulative film INF may further surround areas (e.g., peripheral areas) of the first and second semiconductor layers 11 and 13.

When the light emitting element LD includes the electrode layers 14 and 15, the insulative film INF may at least partially surround outer surfaces (e.g., outer peripheral surfaces or outer circumferential surfaces) of the electrode layers 14 and 15, or may not surround the outer surfaces (e.g., outer peripheral surfaces or outer circumferential surfaces) of the electrode layers 14 and 15. In some embodiments, the insulative film INF may be selectively formed on surfaces of the electrode layers 14 and 15.

The insulative film INF may expose both the end portions of the light emitting element LD in the length L direction of the light emitting element LD. For example, the insulative film INF may expose at least one of the first and second semiconductor layers 11 and 13 and the electrode layers 14 and 15 at the first and second end portions EP1 and EP2 of the light emitting element LD. In another embodiment, the insulative film INF may not be provided to the light emitting element LD.

When the insulative film INF is provided to cover the outer surface of the light emitting element LD, for example, an outer peripheral surface (e.g., an outer circumferential surface) of the active layer 12, the insulative film INF may prevent the active layer 12 from being short-circuited with at least one electrode (not shown) (e.g., a first or second electrode of the pixel). Accordingly, the electrical stability of the light emitting element LD can be ensured. In description of each embodiment of the present disclosure, the term "connection (or coupling)" may inclusively mean physical and/or electrical connection (or coupling). Also, the term "connection (or coupling)" may inclusively mean direct or indirect connection (or coupling), and integral or non-integral connection (or coupling).

The insulative film INF may include a transparent insulating material. For example, the insulative film INF may include at least one insulating material from among $SiO_2$ or silicon oxide (SiOx), $Si_3N_4$ or silicon nitride (SiNx), aluminum oxide ($Al_2O_3$) and titanium dioxide ($TiO_2$), but the present disclosure is not limited thereto. In some embodiments, the material constituting the insulative film INF is not particularly limited, and the insulative film INF may be configured with various insulating materials.

When the insulative film INF is provided on the surface of the light emitting element LD, a surface defect of the light emitting element LD may be reduced or minimized, thereby improving the lifespan and efficiency of the light emitting element LD. Also, when the insulative film INF is formed in each light emitting element LD, the insulative film INF can prevent an unwanted short circuit occurring between a plurality of light emitting elements LD even when the plurality of light emitting elements LD are densely disposed.

In some embodiments of the present disclosure, the light emitting element LD may be fabricated through a surface treatment process. For example, when a plurality of light emitting elements LD are mixed in a liquid solution (or solvent) to be supplied to each light emitting area (e.g., a light emitting area of each pixel), each light emitting element LD may be surface-treated such that the light emitting elements LD are not unequally condensed in the solution but equally dispersed in the solution.

In some embodiments, the insulative film INF itself may be formed as a hydrophobic layer by using a hydrophobic material, or a hydrophobic layer made of a hydrophobic material may be additionally formed on the insulative film. In some embodiments, the hydrophobic material may be a material containing fluorine to exhibit hydrophobicity. Also, in some embodiments, the hydrophobic material may be applied in the form of a self-assembled monolayer (SAM) to the light emitting elements LD. The hydrophobic material may include octadecyl trichlorosilane, fluoroalkyl trichlorosilane, perfluoroalkyl triepoxysilane, etc. Also, the hydrophobic material may be a commercialized material containing fluorine, such as Teflon™ or Cytop™, or a material corresponding thereto.

A light emitting apparatus including the light emitting element LD may be used in various types of devices which require a light source, including a display device. For example, When a plurality of light emitting elements LD are disposed in a light emitting area of each pixel of a display panel, the light emitting elements LD may be used as a light source of the pixel. However, the application field of the light emitting element LD is not limited to the above-described examples. For example, the light emitting element LD may be used in other types of devices that require a light source, such as a lighting device.

Figure 4A:
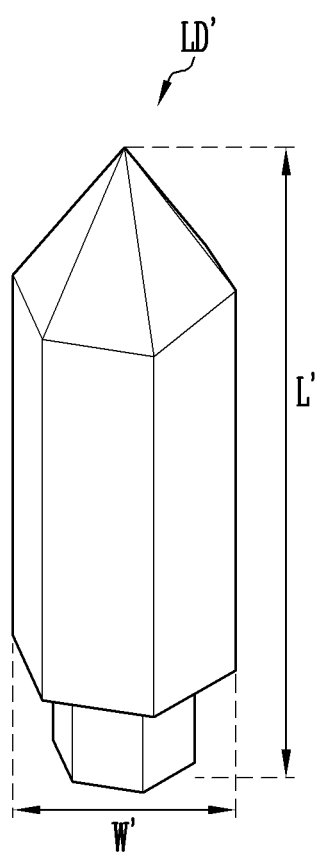
FIGS. 4A and 4B are a perspective view and a sectional view illustrating a light emitting element in accordance with one or more example embodiments of the present disclosure.
Figure 4B:
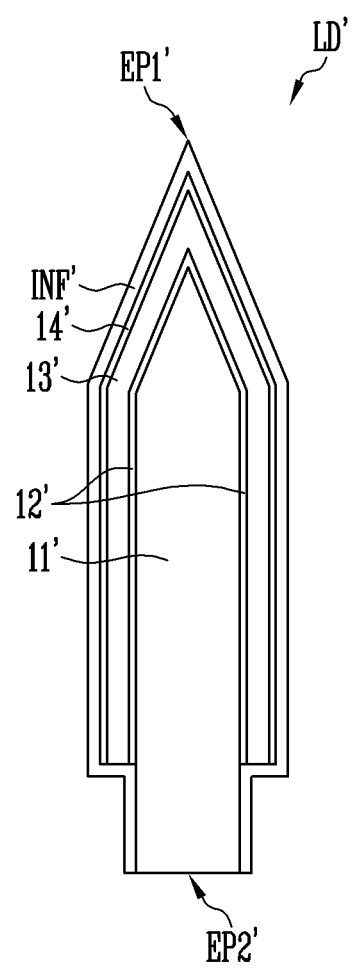

FIGS. 4A and 4B are a perspective view and a sectional view illustrating a light emitting element LD' in accordance with one or more example embodiments of the present disclosure. In some embodiments, a light emitting element LD' having a structure different from those of the light emitting elements LD shown in FIGS. 1A-3B, e.g., a light emitting element having a core-shell structure is illustrated in FIGS. 4A and 4B. For example, in the present disclosure, the kind, structure, and/or shape of the light emitting element LD/LD' may be variously modified. In the example embodiment shown in FIGS. 4A and 4B, components similar or identical to those of the embodiments shown in FIGS. 1A-3B (e.g., components corresponding to each other) are designated by like reference numerals, and their detailed descriptions will be omitted.

Referring to FIGS. 4A and 4B, the light emitting element LD' may include a first semiconductor layer 11', a second semiconductor layer 13', and an active layer 12' interposed between the first semiconductor layer 11' and the second semiconductor layer 13'. In some embodiments, the first semiconductor layer 11' may be disposed in a central area of the light emitting element LD', and the active layer 12' may be disposed on a surface of the first semiconductor layer 11' to surround at least one area of the first semiconductor layer 11' along the edge or periphery of the first semiconductor layer 11'. In addition, the second semiconductor layer 13' may be disposed on a surface of the active layer 12' to surround at least one area of the active layer 12' along the edge or periphery of the active layer 12'.

Also, the light emitting element LD' may selectively further include an electrode layer 14' surrounding at least one area of the second semiconductor layer 13' along the edge or periphery of the second semiconductor layer 13' and/or an insulative film INF' disposed on an outermost surface of the light emitting element LD'. For example, the light emitting element LD' may further include the electrode layer 14' disposed on a surface of the second semiconductor layer 13' to surround at least one area of the second semiconductor layer 13', and the insulative film INF' disposed on a surface of the electrode layer 14' to surround at least one area of the electrode layer 14' along the edge or periphery of the electrode layer 14' and an area of the first semiconductor layer 11'.

In some embodiments, the insulative film INF' may be provided on the surface of the light emitting element LD' to cover a portion of an outer surface (e.g., an outer peripheral surface or an outer circumferential surface) of the first semiconductor layer 11' and an outer surface (e.g., outer peripheral surfaces or an outer circumferential surface) of the electrode layer 14'. In some embodiments, after the insulative film INF' is formed to cover the entire outer surface (e.g., outer peripheral surface or outer circumferential surface) of the electrode layer 14' included in the light emitting element LD', the insulative film INF' may be partially removed to expose one area of the electrode layer 14' for the purpose of electrical connection with an electrode (not shown) (e.g., a first electrode of a pixel). The insulative film INF' may include a transparent insulating material.

The light emitting element LD' in accordance with the above-described embodiment may be a light emitting element having a core-shell structure (also, referred to as a "core-shell light emitting diode) manufactured through a growth process, etc. For example, the light emitting element LD' may have a core-shell structure including the first semiconductor layer 11', the active layer 12', the second semiconductor layer 13', the electrode layer 14', and the insulative film INF', which are sequentially disposed in a direction from the center to the outside of the light emitting element LD'. In some embodiments, the light emitting element LD' may not include at least one of the electrode layer 14' and the insulative film INF'.

In some embodiments, the light emitting element LD' may include a polypyramid shape extending in any one direction. For example, at least one area of the light emitting element LD' may have a hexagonal pyramid shape. However, in some embodiments, the shape of the light emitting element LD' may be variously modified.

When assuming that an extending direction of the light emitting element LD' is a length L direction, the light emitting element LD' may have a first end portion EP1' and a second end portion EP2' along the length L' direction. One of the first and second semiconductor layers 11' and 13' (or an electrode layer surrounding any one of the first and second semiconductor layers 11' and 13') may be disposed at the first end portion EP1' of the light emitting element LD', and the other one of the first and second semiconductor layers 11' and 13' (or an electrode layer surrounding the other one of the first and second semiconductor layers 11' and 13') may be disposed at the second end portion of the light emitting element LD'.

In some embodiments, the first end portion EP1 of the light emitting element LD may have a core-shell structure protruding in a polypyramid shape (e.g., a hexagonal polypyramid shape), and the light emitting element LD' may be a light emitting diode having a size in micro scale or nano scale. For example, the light emitting element LD' may have a shape obtained by combining a polypyramid and a hexagonal prism, and have a small size in a range of micro scale to nano scale, e.g., a width W and/or a length L' in a range of micro scale or nano scale. However, the size, shape, and the like of the light emitting element LD' may be variously modified according to design conditions of various types of devices, e.g., a display device, and the like, which use, as a light source, a light emitting apparatus using the light emitting element LD'.

In some embodiments, the first semiconductor layer 11' may be located at a core, i.e., the center (or central area) of the light emitting element LD'. In addition, the light emitting element LD' may be provided in a shape corresponding to that of the first semiconductor layer 11'. For example, when the first semiconductor layer 11' has a hexagonal pyramid shape at one end portion of an upper side, the light emitting element LD' may have a hexagonal pyramid shape at one end portion (e.g., the first end portion EP1') of an upper side of the light emitting element LD'.

The active layer 12' may be provided and/or formed in a shape surrounding the outer surface (e.g., the outer peripheral surface or the outer circumferential surface) of the first semiconductor layer 11'. For example, the active layer 12' may be provided and/or formed in a shape surrounding the other area except one end portion (e.g., one end portion of a lower side) of the first semiconductor layer 11' in the length L' direction of the light emitting element LD'.

The second semiconductor layer 13' may be provided and/or formed in a shape surrounding an outer surface (e.g., an outer peripheral surface or an outer circumferential surface) of the active layer 12', and include a semiconductor layer having a type different from that of the first semiconductor layer 11'. For example, when the first semiconductor layer 11' includes an N-type semiconductor layer, the second semiconductor layer 13' may include a P-type semiconductor layer.

In some embodiments, the light emitting element LD' may further include the electrode layer 14' surrounding the outer surface (e.g., the outer peripheral surface or the outer circumferential surface) of the second semiconductor layer 13'. The electrode layer 14' may be an ohmic contact electrode or a Schottky contact electrode, which is electrically connected to the second semiconductor layer 13'.

As described above, the light emitting element LD' is formed in the core-shell structure having a shape in which both ends of the light emitting element LD' protrude, and includes the first semiconductor layer 11' provided at the center thereof, the active layer 12' surrounding the first semiconductor layer 11', and the second semiconductor layer 13' surrounding the active layer 12'. Also, the light emitting element LD' may selectively further include the electrode layer 14' surrounding the second semiconductor layer 13'. One end of the electrode layer 14' may be disposed at the first end portion EP1' of the light emitting element LD', and one end of the first semiconductor layer 11' may be disposed at the second end portion EP2' of the light emitting element LD'.

The above-described light emitting element LD/LD' may be used in various types of devices which require a light source, including a display device. For example, at least one light emitting element LD/LD' is disposed in each pixel of a display panel, to be used as a light source.

In some embodiments, each pixel may include at least one rod type light emitting element LD or at least one light emitting element LD' having a core-shell structure, or complexly include the rod type light emitting element LD and the light emitting element LD' having the core-shell structure. In another embodiment, each pixel may include another light emitting element having a kind and/or shape, which is different from that of the rod type light emitting element LD or the light emitting element LD' having the core-shell structure.

FIG. 5 is a plan view illustrating a display device in accordance with one or more example embodiments of the present disclosure. In FIG. 5, a display device, for example, a display panel PNL provided in the display device will be illustrated as an example of an electronic device which can use, as a light source, the light emitting element LD/LD' described in the embodiments shown in FIGS. 1A-4B. For example, each pixel unit PXU of the display panel PNL and each pixel constituting the pixel unit PXU may include at least one light emitting element LD/LD'.

For convenience, in FIG. 5, a structure of the display panel PNL will be briefly illustrated based on a display area DA. However, in some embodiments, at least one driving circuit (e.g., a scan driver), lines, and/or pads, which are not shown in the drawing, may be further disposed in the display panel PNL.

Referring to FIG. 5, the display panel PNL in accordance with the one or more example embodiments of the present disclosure may include a base layer BSL and pixels arranged on the base layer BSL. The pixels may include first color pixels PXL1, second color pixels PXL2, and/or third color pixels PXL3. Hereinafter, when at least one pixel from among the first color pixels PXL1, the second color pixels PXL2, and the third color pixels PXL3 is arbitrarily designated or when two or more kinds of pixels from among the first color pixels PXL1, the second color pixels PXL2 are inclusively designated, the pixel or the pixels will be referred to as a "pixel PXL" or "pixels PXL."

In some embodiments, the display panel PNL and the base layer BSL for forming the same may include the display area DA for displaying an image and a non-display area NDA except the display area DA in the base layer BSL and surrounding the display area DA along the edge or periphery of the display area DA. In addition, the pixels PXL may be disposed in the display area DA on the base layer BSL.

The display area DA may be disposed in a central area of the display panel PNL, and the non-display area NDA may be disposed in an edge area of the display panel PNL to surround the display area DA along the edge or periphery of the display area DA. However, the positions of the display area DA and the non-display area NDA are not limited thereto, and may be changed. The display area DA may constitute a screen on which an image is displayed, and the non-display area NDA may be the other area except the display area DA in the base layer BSL.

The base layer BSL constitutes a base member of the display panel PNL, and may be a rigid or flexible substrate or film. For example, the base layer BSL may be a rigid substrate made of glass or tempered glass, a flexible substrate (or thin film) made of plastic or a metallic material, or at least one-layer insulating layer. The material and/or property of the base layer BSL is not particularly limited.

In some embodiments, the base layer BSL may be substantially transparent. The term "substantially transparent" may mean that light can be transmitted with a suitable transmittance (e.g., a predetermined transmittance) or more. In another embodiment, the base layer BSL may be translucent or opaque. In some embodiments, the base layer BSL may include a reflective material.

One area on the base layer BSL may be defined as the display area DA such that the pixels PXL are arranged therein, and the other area may be defined as the non-display area NDA. For example, the base layer BSL may include the display area DA including a plurality of pixel areas in which the respective pixels PXL are formed, and the non-display area NDA disposed at the periphery of the display area DA. Various lines, pads, and/or a built-in circuit, which are connected to the pixels PXL of the display area DA, may be disposed in the non-display area NDA.

The pixels PXL may be arranged in the display area DA. For example, the pixels PXL may be regularly arranged in the display area DA according to a stripe structure, a PENTILE® structure, or the like. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA by using various structures and/or methods.

In some embodiments, there may be two or more kinds of pixels PXL emitting lights of different colors. For example, first color pixels PXL1 emitting light of a first color, second color pixels PXL2 emitting light of a second color, and third color pixels PXL3 emitting light of a third color may be arranged in the display area DA. In addition, at least one first color pixel PXL1, a least one second color pixel PXL2, and at least one third color pixel PXL3, which are disposed adjacent to each other, may constitute one pixel unit PXU capable of emitting lights of various colors.

In some embodiments, the first color pixel PXL1 may be a red pixel emitting red light, the second color pixel PXL2 may be a green pixel emitting green light, and the third pixel PXL3 may be a blue pixel emitting blue light. In some embodiments, the first color pixel PXL1, the second color pixel PXL2, and the third color pixel PXL3 respectively have, as light sources, a light emitting element of the first color, a light emitting element of the second color, and a light emitting element of the third color, so that the light emitting elements can respectively emit lights of the first color, the second color, and the third color. In another embodiment, the first color pixel PXL1, the second color pixel PXL2, and the third color pixel PXL3 have light emitting elements emitting light of the same color, and may include light conversion layers and/or color filters of different colors, which are disposed on the respective light emitting elements, to respectively emit lights of the first color, the second color, and the third color.

However, the color, kind, and/or number of pixels PXL constituting each pixel unit PXU are not particularly limited. For example, the color of light emitted by each pixel PXL may be variously changed.

Each pixel PXL may include at least one light source driven by a control signal (e.g., at least one predetermined control signal, e.g., a scan signal and a data signal) and/or a power source (e.g., at least one predetermined power source, e.g., a first power source and a second power source). In some embodiments, the light source may include at least one light emitting element LD in accordance with any one embodiment from among the embodiments shown in FIGS. 1A-3B, e.g., at least one micro rod type light emitting element LD having a small size in nano scales or micro scales, and/or at least one light emitting element LD' in accordance with the embodiment shown in FIGS. 4A and 4B, e.g., at least one micro light emitting element LD' having a core-shell structure, which has a small size in a range of nano scale to micro scale. In addition, various types of light emitting elements LD may be used as the light source of the pixel PXL.

Also, each pixel PXL may have a structure in accordance with at least one embodiment from among various embodiments which will be described below. For example, each pixel PXL may have a structure in accordance with any one embodiment from among embodiments disclosed in FIGS. 6A-15B, or have a structure obtained by combining at least two embodiments from among the above mentioned embodiments.

In some embodiments, each pixel PXL may be configured as an active pixel. However, the kind, structure, and/or driving method of pixels PXL which can be applied to the display device of the present disclosure are not particularly limited. For example, each pixel PXL may be configured as a pixel of a passive or active light emitting display device using various structures and/or driving methods.

FIGS. 6A-6G are circuit diagrams each illustrating a pixel PXL in accordance with one or more example embodiments of the present disclosure. For example, FIGS. 6A-6G illustrate different embodiments of a pixel PXL which can be applied to an active display device. However, the kinds of the pixel PXL and the display device, to which the embodiments of the present disclosure can be applied, are not limited thereto.

In some embodiments, each of the pixels PXL shown in FIGS. 6A-6G may be any one of the first color pixel PXL1, the second color pixel PXL2, and the third color pixel PXL3, which are provided in the display panel PNL shown in FIG. 5. In addition, the first color pixel PXL1, the second color pixel PXL2, and the third color pixel PXL3 may substantially have the same structure or similar structures.

Figure 6A:
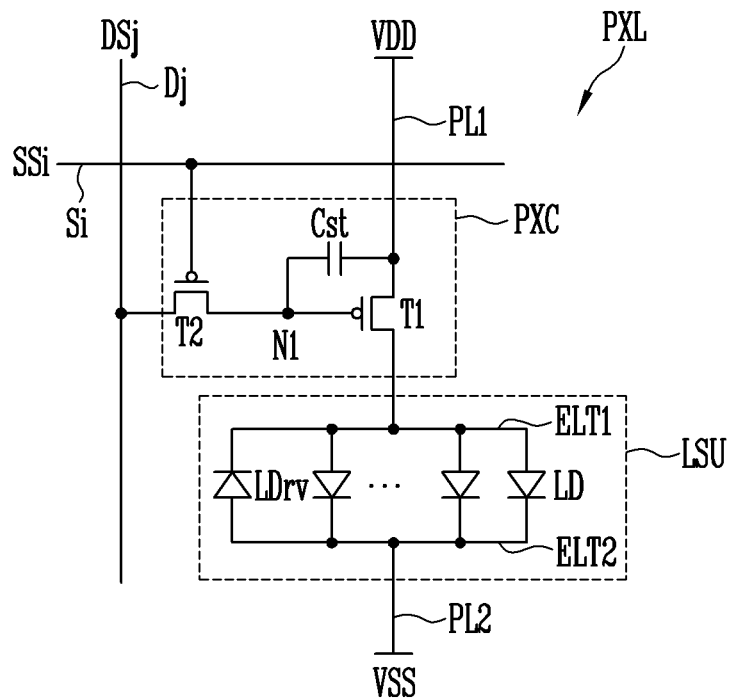
FIGS. 6A-6G are circuit diagrams each illustrating a pixel in accordance with one or more example embodiments of the present disclosure.

First, referring to FIG. 6A, the pixel PXL includes a light source unit LSU for generating light with a luminance corresponding to a data signal. Also, the pixel PXL may selectively further include a pixel circuit PXC for driving the light source unit LSU.

The light source unit LSU may include at least one light emitting element LD, i.e., a plurality of light emitting elements LD connected between a first power source VDD and a second power source VSS. For example, the light source unit LSU may include a first electrode ELT1 (also, referred to as a "first pixel electrode" or "first alignment electrode") connected to the first power source VDD via the pixel circuit PXC and a first power line PL1, a second electrode ELT2 (also, referred to as a "second pixel electrode" or "second alignment electrode") connected to the second power source VSS through a second power line PL2, and a plurality of light emitting elements LD connected in parallel in the same direction (e.g., a forward direction) between the first and second electrodes ELT1 and ELT2. In some embodiments, the first electrode ELT1 may be an anode electrode, and the second electrode ELT2 may be a cathode electrode.

Each of the light emitting elements LD may include a first end portion (e.g., a P-type end portion) connected to the first power source VDD through the first electrode ELT1 and/or the pixel circuit PXC and the first power line PL1, and a second end portion (e.g., an N-type portion) connected to the second power source VSS through the second electrode ELT2. For example, the light emitting elements LD may be connected in parallel in a forward direction between the first and second electrodes ELT1 and ELT2 of the light source unit LSU. Each of the light emitting elements LD connected in the first direction between the first power source VDD and the second power source VSS may form a valid light source, and the valid light sources may constitute the light source unit LSU of the pixel PXL.

The first power source VDD and the second power source VSS may have different potentials such that the light emitting elements LD can emit light. For example, the first power source VDD may be set as a high-potential power source, and the second power source VSS may be set as a low-potential power source. A difference between the first power source VDD and the second power source VSS may be set to a threshold voltage or more of the light emitting elements LD during at least an emission period of the pixel PXL.

One end portions (e.g., P-type end portions) of the light emitting elements LD constituting each light source unit LSU may be commonly connected to the pixel circuit PXC through one electrode (e.g., the first electrode ELT1 of each pixel) of the light source unit LSU, and may be connected to the first power source VDD through the pixel circuit PXC and the first power line PL1. In addition, the other end portions (e.g., N-type end portions) of the light emitting elements LD may be commonly connected to the second power source VSS through the second electrode ELT2 of each pixel PX and the second power line PL2.

The light emitting elements LD may emit light with a luminance corresponding to a driving current supplied through the corresponding pixel circuit PXC. For example, during each frame period, the pixel circuit PXC may supply, to the light source unit LSU, a driving current corresponding to a grayscale value to be expressed in a corresponding frame. The driving current supplied to the light source unit LSU may be divided to flow through the light emitting elements LD connected in parallel in the forward direction. Accordingly, each light emitting device LD emits light with a luminance corresponding to a current flowing therethrough, so that the light source unit LSU can emit light with a luminance corresponding to the driving current.

In some embodiments, the light source unit LSU may further include at least one invalid light source in addition to the light emitting elements LD forming the respective valid light sources. For example, at least one reverse-direction light emitting element LDrv may be further connected between the first and second electrodes ELT1 and ELT2.

Each reverse-direction light emitting element LDrv along with the light emitting elements LD forming the valid light sources are connected in parallel between the first and second electrodes ELT1 and ELT2. Each reverse-direction light emitting element LDrv may be connected in a direction (e.g., a reverse direction) opposite to that of the light emitting elements LD between the first and second electrodes ELT1 and ELT2. For example, an N-type end portion of the reverse-direction light emitting element LDrv may be connected to the first power source VDD via the first electrode ELT1, the pixel circuit PXC and the first power line PL1, and a P-type end portion of the reverse-direction light emitting element LDrv may be connected to the second power source VSS via the second electrode ELT2 and the second power line PL2. The reverse-direction light emitting element LDrv maintains an inactivated state even when a driving voltage (e.g., a predetermined driving voltage (e.g., a forward driving voltage)) is applied between the first and second electrodes ELT1 and ELT2. Accordingly, the reverse-direction light emitting element LDrv can substantially maintain a non-emission state (e.g., a reverse biased state).

In some embodiments, at least one pixel PXL may further include at least one invalid light source (not shown) which is not completely connected between the first and second electrodes ELT1 and ELT2. For example, at least one pixel PXL may further include at least one invalid light emitting element located in the light source unit LSU, the at least one invalid light emitting element having first and second end portions EP1 and EP2 that are not completely connected to the first and second electrodes ELT1 and ELT2.

The pixel circuit PXC is connected between the first power source VDD and the first electrode ELT1 of the light source unit LSU. The pixel circuit PXC may be connected to a scan line Si and a data line Dj of the corresponding pixel PXL. For example, when assuming that the pixel PXL is disposed on an ith (i is a natural number) horizontal line (row) and a jth (j is a natural number) vertical line (column) of the display area DA, the pixel circuit PXC of the pixel PXL may be connected to an ith scan line Si and a jth data line Dj of the display area DA.

In some embodiments, the pixel circuit PXC may include a plurality of transistors and at least one capacitor. For example, the pixel circuit PXC may include a first transistor T1, a second transistor T2, and a storage capacitor Cst.

The first transistor T1 is connected between the first power source VDD and the light source unit LSU. For example, a first electrode (e.g., a source electrode) of the first transistor T1 may be connected to the first power source VDD, and a second electrode (e.g., a drain electrode) of the first transistor T1 may be connected to the first electrode ELT1. In addition, a gate electrode of the first transistor T1 is connected to a first node N1. The first transistor T1 controls a driving current supplied to the light source unit LSU, corresponding to a voltage of the first node N1. For example, the first transistor T1 may be a driving transistor which controls a driving current of the pixel PXL.

The second transistor T2 is connected between the data line Dj and the first node N1. For example, a first electrode (e.g., a source electrode) of the second transistor T2 may be connected to the data line Dj, and a second electrode (e.g., a drain electrode) of the second transistor T2 may be connected to the first node N1. In addition, a gate electrode of the second transistor T2 may be connected to the scan line Si. The second transistor T2 is turned on when a scan signal SSi having a gate-on voltage (e.g., a low level voltage) is supplied from the scan line Si, to electrically connect the data line Dj and the first node N1.

A data signal DSj of a corresponding frame is supplied to the data line Dj for each frame period. The data signal DSj is transferred to the first node N1 through the second transistor T2 turned on during a period in which the scan signal SSi having the gate-on voltage is supplied. For example, the second transistor T2 may be a switching transistor for transferring each data signal DSj (e.g., during each data period) to the inside of the pixel PXL.

One electrode of the storage capacitor Cst is connected to the first power voltage VDD, and the other electrode of the storage capacitor Cst is connected to the first node N1. The storage capacitor Cst charges to a voltage (or stores a charge) corresponding to the data signal DSj supplied to the first node N1 during each frame period.

Although, a case where both the transistors, e.g., the first and second transistors T1 and T2 included in the pixel circuit PXC are P-type transistors is illustrated in FIG. 6A, the present disclosure is not limited thereto. For example, at least one of the first and second transistors T1 and T2 may be changed to an N-type transistor.

Figure 6B:
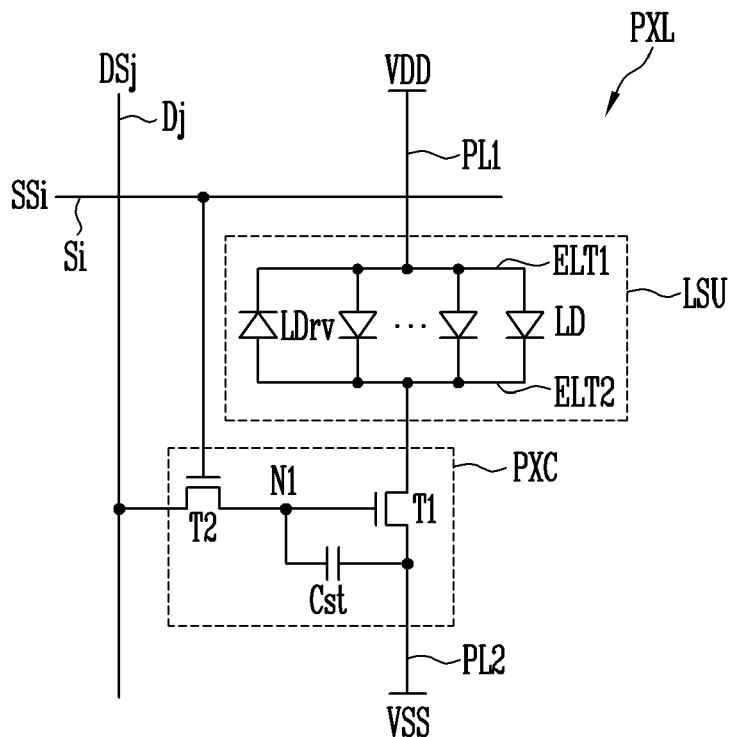

For example, as shown in FIG. 6B, each of the first and second transistors T1 and T2 may be an N-type transistor. The gate-on voltage of the scan signal SSi for writing the data signal DSj supplied to the data line Dj for each frame period may be a high level voltage (also, referred to as a "gate high voltage"). Similarly, the voltage of the data signal DSj for turning on the first transistor T1 may be a voltage having a level opposite to that of the embodiment shown in FIG. 6A. For example, while the data signal DSj having a lower voltage is supplied as a grayscale value to be expressed becomes higher in the embodiment shown in FIG. 6A, the data signal DSj having a higher voltage may be supplied as a grayscale value to be expressed becomes higher in the embodiment shown in FIG. 6B. In another embodiment, the first and second transistors T1 and T2 may be transistors having different conductivity types. For example, one of the first and second transistors T1 and T2 may be a P-type transistor, and the other one of the first and second transistors T1 and T2 may be an N-type transistor.

In some embodiments, the connection position of the pixel circuit PXC with the light source unit LSU may be changed. For example, as shown in FIG. 6B, when both the first and second transistors T1 and T2 constituting the pixel circuit PXC are N-type transistors, the pixel circuit PXC may be connected between the light source unit LSU and the second power source VSS, and the storage capacitor Cst may be connected between the first node N1 and the second power source VSS. However, the present disclosure is not limited thereto. For example, in another embodiment, although the pixel circuit PXC is configured with N-type transistors, the pixel circuit PXC may be connected between the first power source VDD and the light source unit LSU, and/or the storage capacitor Cst may be connected between the first power source VDD and the first node N1.

A configuration and an operation of the pixel PXL shown in FIG. 6B is substantially similar to that of the pixel circuit 144 shown in FIG. 6A, except that connection positions of some components (e.g., the storage capacitor Cst) and voltage levels of control signals (e.g., the scan signal SSi and the data signal DSj) are changed due to a change in type (e.g., P-type or N-type) of the first and second transistors T1 and T2. Therefore, detailed descriptions of the pixel PXL shown in FIG. 6B will be omitted.

However, the structure of the pixel circuit PXC is not limited to the embodiments shown in FIGS. 6A and 6B. For example, the pixel circuit PXC may be configured like the embodiment shown in FIG. 6C or 6D. In addition, the pixel circuit PXC may configured as a pixel circuit using various structures and/or various driving methods.

Figure 6C:
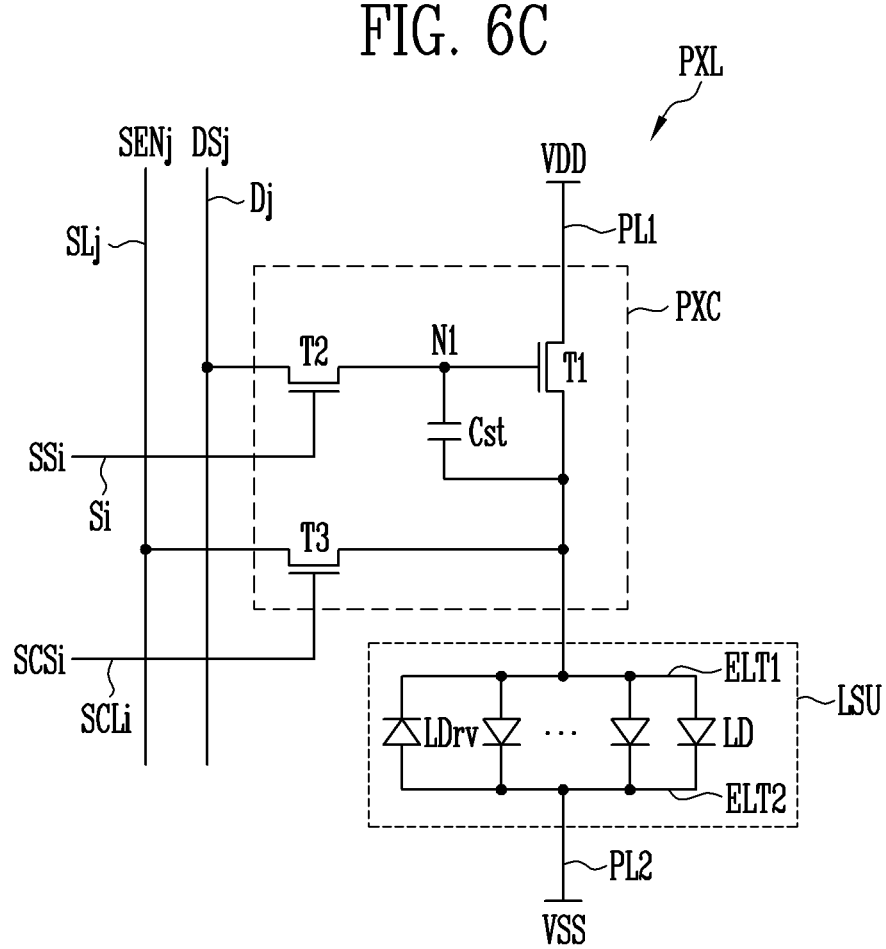

Referring to FIG. 6C, the pixel circuit PXC may be further connected to a sensing control line SCLi and a sensing line SLj. For example, the pixel circuit PXC of the pixel PXL disposed on the ith horizontal line (e.g., row) and the jth vertical line (e.g., column) of the display area DA may be connected to an ith sensing control line SCLi and a jth sensing line SLj of the display area DA. The pixel circuit PXC may further include a third transistor T3. In another embodiment, the sensing line SLj may be omitted, and a characteristic of the corresponding pixel PXL (or adjacent pixel) may be detected by detecting a sensing signal SENj through the data line Dj.

The third transistor T3 is connected between the first transistor T1 or the first electrode ELT1 of the light source unit LSU and the sensing line SLj. For example, one electrode of the third transistor T3 may be connected to one electrode (e.g., a source electrode) of the first transistor T1 or the first electrode ELT1 of the light source unit LSU, and another electrode of the third transistor T3 may be connected to the sensing line SLj. In some embodiments, when the sensing line SLj is omitted, the another electrode of the third transistor T3 may be connected to the data line Dj.

A gate electrode of the third transistor T3 is connected to the sensing control line SCLi. When the sensing control line SCLi is omitted, the gate electrode of the third transistor T3 may be connected to the scan line Si. The third transistor T3 is turned on by a sensing control signal SCSi having a gate-on voltage (e.g., a high level voltage), which is supplied to the sensing control line SCLi during a sensing period (e.g., a predetermined sensing period), to electrically connect the sensing line SLj and the first transistor T1 (e.g., a source electrode of the first transistor T1) or the first electrode ELT1 of the light source unit LSU.

In some embodiments, the sensing period may be a period in which a characteristic (e.g., a threshold voltage of the first transistor T1, etc.) of each of the pixels PXL disposed in the display area DA is extracted. During the sensing period, the first transistor T1 may be turned on by supplying a reference voltage (e.g., a predetermined reference voltage), at which the first transistor T1 may be turned on, to the first node N1 through the data line Dj and the second transistor T2 or by connecting each pixel PXL to a current source, etc. In addition, the first transistor T1 may be connected to the sensing line SLj when the third transistor T3 is turned on by supplying the sensing control signal SCSi having the gate-on voltage to the third transistor T3. Subsequently, the sensing signal SENj may be acquired through the sensing line SLj, and a characteristic of each pixel PXL, including the threshold voltage of the first transistor T1, etc. may be detected by using the sensing signal SENj. Information on the characteristic of each pixel PXL may be used to convert image data such that a characteristic deviation between the pixels PXL disposed in the display area DA can be compensated.

Although an embodiment in which the first, second, and third transistors T1, T2, and T3 are all N-type transistors has been disclosed in FIG. 6C, the present disclosure is not limited thereto. For example, at least one of the first, second, and third transistors T1, T2, and T3 may be changed to a P-type transistor. Also, although an embodiment in which the light source unit LSU is connected between the pixel circuit PXC and the second power source VSS has been disclosed in FIG. 6C, the present disclosure is not limited thereto. For example, in another embodiment, the light source unit LSU may be connected between the first power source VDD and the pixel circuit PXC.

Figure 6D:
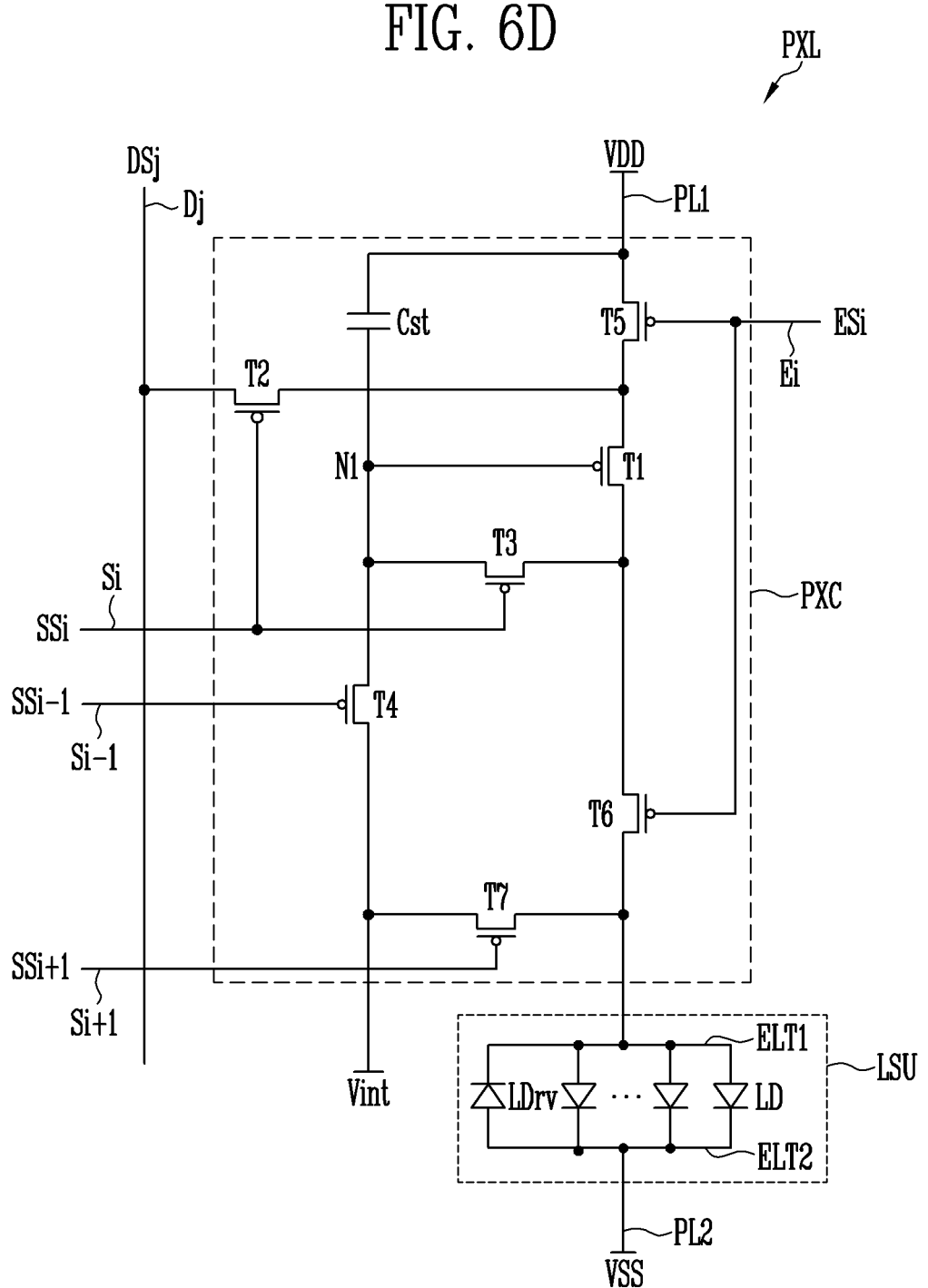

Referring to FIG. 6D, a pixel circuit PXC may be further connected to at least another scan line or at least another control line in addition to a scan line Si of a corresponding scan line. For example, the pixel circuit PXC of the pixel PXL disposed on the ith horizontal line (e.g., row) of the display area DA may be further connected to an (i−1)th scan line Si−1 (e.g., a previous scan line) and/or an (i+1)th scan line Si+1 (e.g., a next scan line). Also, the pixel circuit PXC may be further connected to another power source in addition to the first and second power sources VDD and VSS. For example, the pixel circuit PXC may be connected to an initialization power source Vint. In some embodiments, the pixel circuit PXC may include first to seventh transistors T1 to T7 and a storage capacitor Cst.

The first transistor T1 is connected between the first power source VDD and the light source unit LSU. For example, one electrode (e.g., a source electrode) of the first transistor T1 may be connected to the first power source VDD through the fifth transistor T5 and the first power line PL1, and another electrode (e.g., a drain electrode) of the first transistor T1 may be connected to one electrode (e.g., the first electrode ELT1) of the light source unit LSU via the sixth transistor T6. In addition, a gate electrode of the first transistor T1 is connected to a first node N1. The first transistor T1 controls a driving current supplied to the light source unit LSU, corresponding to a voltage of the first node N1.

The second transistor T2 is connected between the data line Dj and the one electrode (e.g., the source electrode) of the first transistor T1. In addition, a gate electrode of the second transistor T2 is connected to the corresponding scan line Si. The second transistor T2 is turned on when a scan signal SSi having a gate-on voltage (e.g., a low level voltage) is supplied from the scan line Si, to electrically connect the data line Dj to the one electrode (e.g., the source electrode) of the first transistor T1. Therefore, when the second transistor T2 is turned on, a data signal DSj supplied from the data line Dj is transferred to the first transistor T1.

The third transistor T3 is connected between the another electrode (e.g., the drain electrode) of the first transistor T1 and the first node N1. In addition, a gate electrode of the third transistor T3 is connected to the corresponding scan line Si. The third transistor T3 is turned on when a scan signal SSi having a gate-on voltage (e.g., a low level voltage) is supplied from the scan line Si, to connect the first transistor T1 in a diode form (e.g., diode-connected). Therefore, the first transistor T1 is turned on in the form in which the first transistor T1 is diode-connected during a period in which the scan signal SSi having the gate-on voltage is supplied, and accordingly, the data signal DSj from the data line Dj is supplied to the first node N1 by sequentially passing through the second transistor T2, the first transistor T1, and the third transistor T3. Therefore, a voltage (or charge) corresponding to the data signal DSj and the threshold voltage of the first transistor T1 is charged (or stored) in the storage capacitor Cst.

The fourth transistor T4 is connected between the first node N1 and the initialization power source Vint. In addition, a gate electrode of the fourth transistor T4 is connected to a previous scan line, e.g., the (i−1)th scan line Si−1. The fourth transistor T4 is turned on when a scan signal SSi−1 having a gate-on voltage (e.g., a low level voltage) is supplied to the (i−1)th scan line Si−1, to transfer a voltage of the initialization power source Vint to the first node N1.

In some embodiments, the voltage of the initialization power source Vint may be less than or equal to the lowest possible voltage for the data signal DSj. Before a data signal DSj of a corresponding frame is supplied to each pixel PXL, the first node N1 is initialized to the voltage of the initialization power source Vint (e.g., supplied to the first node N1 via the fourth transistor T4), by the scan signal SSi−1 having the gate-on voltage supplied to the (i−1)th scan line Si−1 to turn on the fourth transistor T4. Accordingly, the first transistor T1 is diode-connected in a forward direction during a period in which the scan signal SSi having the gate-on voltage is supplied to the ith scan line Si, regardless of the voltage of a data signal DSj of a previous frame. Accordingly, the data signal DSj of the corresponding frame is transferred to the first node N1.

The fifth transistor T5 is connected between the first power source VDD and the first transistor T1 (e.g., the source electrode of the first transistor T1). In addition, a gate electrode of the fifth transistor T5 is connected to a corresponding emission control line, e.g., an ith emission control line Ei. The fifth transistor T5 is turned off when an emission control signal ESi having a gate-off voltage (e.g., a high level voltage) is supplied to the emission control line Ei, and is turned on in other cases.

The sixth transistor T6 is connected between the first transistor T1 (e.g., the drain electrode of the first transistor T1) and the light source unit LSU (e.g., the first electrode ELT1 of the light source unit LSU). In addition, a gate electrode of the sixth transistor T6 is connected to the corresponding emission control line, e.g., the ith emission control line Ei. The sixth transistor T6 is turned off when an emission control signal ESi having a gate-off voltage (e.g., a high level voltage) is supplied to the emission control line Ei, and is turned on in other cases.

The fifth and sixth transistors T5 and T6 may control the emission period of the pixel PXL. For example, when the fifth and sixth transistors T5 and T6 are turned on, a current path may be formed, through which a driving current flows from the first power source VDD to the second power source VSS by sequentially passing through the fifth transistor T5, the first transistor T1, the sixth transistor T6, and the light source unit LSU. In addition, when the fifth transistor T5 and/or the sixth transistor T6 are/is turned off, the light emission of the pixel PXL may be prevented while the current path is blocked.

The seventh transistor T7 is connected between the one electrode (e.g., the first electrode ELT1) of the light source unit LSU and the initialization power source Vint. In addition, a gate electrode of the seventh transistor T7 is connected to a scan line, e.g., the (i+1)th scan line Si+1 (e.g., the next scan line) for selecting pixels PXL of a next horizontal line. The seventh transistor T7 is turned on when a scan signal SSi+1 having a gate-on voltage (e.g., a low level voltage) is supplied to the (i+1)th scan line Si+1, to supply the voltage of the initialization power source Vint to the one electrode (e.g., the first electrode ELT1) of the light source unit LSU. Accordingly, the voltage of the one electrode of the light source unit LSU is initialized during each initialization period in which the voltage of the initialization power source Vint is transferred to the light source unit LSU.

In some embodiments, a control signal for controlling an operation of the seventh transistor T7 and/or the initialization power source Vint may be variously changed. For example, in another embodiment, the gate electrode of the seventh transistor T7 may be connected to a scan line of a corresponding horizontal line, i.e., the ith scan line Si or a scan line of a previous horizontal line, e.g., the (i−1)th scan line Si−1. The second transistor T7 is turned on when a scan signal SSi or SSi−1 having a gate-on voltage is supplied to the ith scan line Si or the (i−1)th scan line Si−1, to supply the voltage of the initialization power source Vint to the one electrode of the light source unit LSU. Accordingly, the pixel PXL can emit light with a more uniform luminance, corresponding to the data signal DSj during each frame period. In some embodiments, the fourth transistor T4 and the seventh transistor T7 may be respectively connected to initialization power sources having different potentials. In some embodiments, a plurality of initialization power source may be supplied to the pixel, and the first node N1 and the first electrode ELT1 may be initialized by initialization power sources having different potentials.

The storage capacitor Cst is connected between the first power source VDD and the first node N1. The storage capacitor Cst stores a voltage (or charge) corresponding to the data signal DSj supplied to the first node N1 and the threshold voltage of the first transistor T1 in each frame period.

Although a case where all the transistors, e.g., the first to seventh transistors T1 to T7 included in the pixel circuit PXC are P-type transistors has been illustrated in FIG. 6D, the present disclosure is not limited thereto. For example, at least one of the first to seventh transistors T1 to T7 may be changed to an N-type transistor.

Figure 6E:
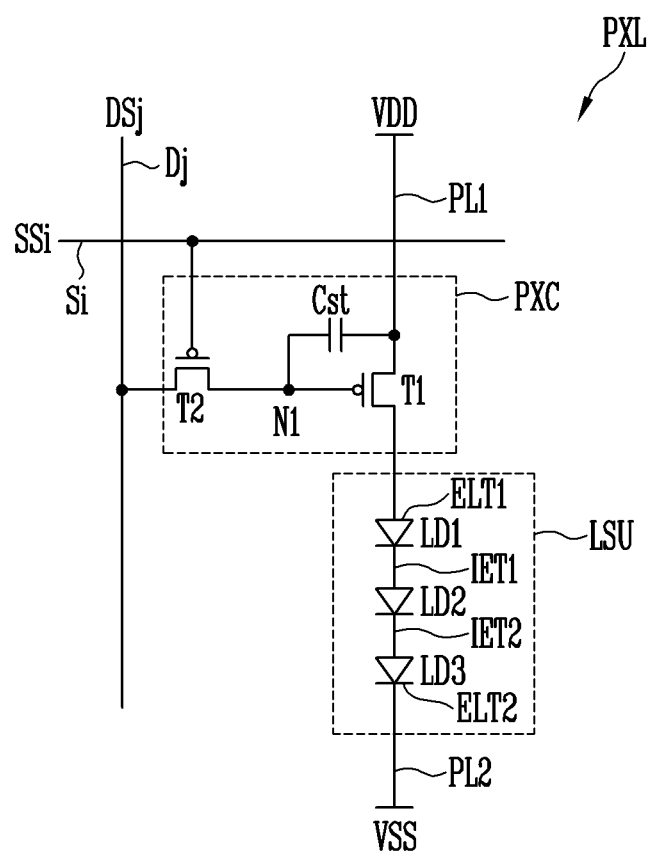
Figure 6F:
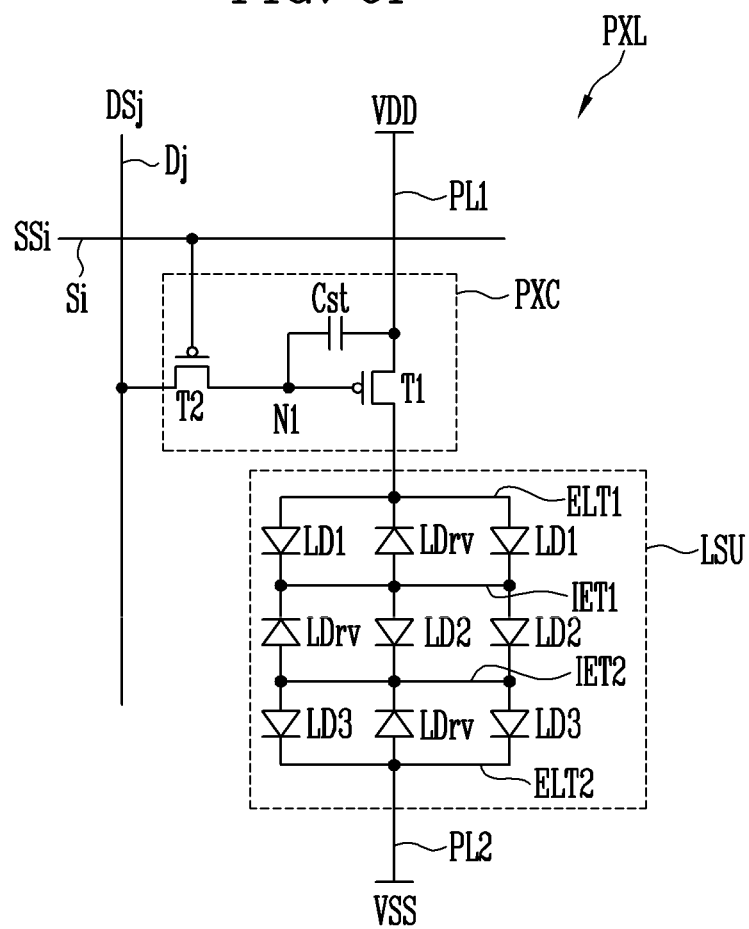
Figure 6G:
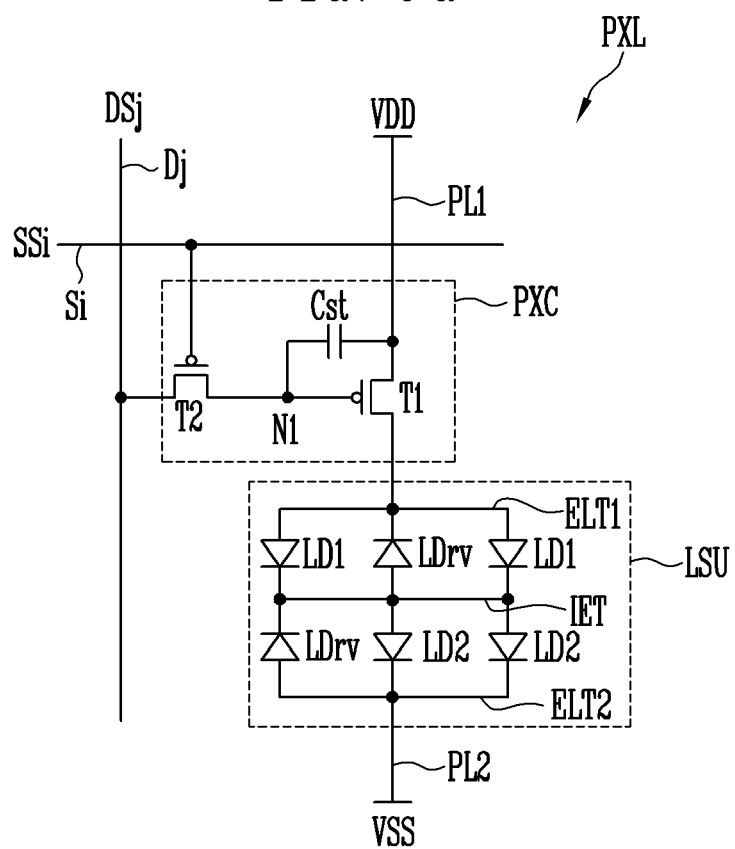

Also, although an embodiment in which all the valid light sources, i.e., the light emitting elements LD constituting each light source unit LSU are connected in parallel has been illustrated in FIGS. 6A-6D, the present disclosure is not limited thereto. For example, in another embodiment of the present disclosure, a light source unit LSU of each pixel PXL may include a serial structure having at least two stages as shown in FIGS. 6E-6G. In the embodiments shown in FIGS. 6E-6G, detailed descriptions of components (e.g., the pixel circuit PXC) similar or identical to those of the embodiments shown in FIGS. 6A-6D will be omitted.

Referring to FIG. 6E, the light source unit LSU may include at least two light emitting elements connected in series to each other. For example, the light source unit LSU may include a first light emitting element LD1, a second light emitting element LD2, and a third light emitting element LD3, which are connected in series in a forward direction between the first power source VDD and the second power source VSS. Each of the first, second, and third light emitting elements LD1, LD2, and LD3 may form a valid light source.

Hereinafter, when a specific light emitting element from among the first, second, and third light emitting elements LD1, LD2, and LD3 is designated, the corresponding light emitting element will be referred to as a "first light emitting element LD1," a "second light emitting element LD2," or a "third light emitting element LD3." In addition, when at least one light emitting element from among the first, second, and third light emitting elements LD1, LD2, and LD3 is arbitrarily designated or when the first, second, and third light emitting elements LD1, LD2, and LD3 are inclusively designated, the corresponding light emitting element or the corresponding light emitting elements will be referred to as a "light emitting element LD" or "light emitting elements LD."

A first end portion (e.g., a P-type end portion) of the first light emitting element LD1 is connected to the first power source VDD via a first electrode (i.e., a first pixel electrode) ELT1 of the light source unit LSU, etc. In addition, a second end portion (e.g., an N-type end portion) of the first light emitting element LD1 is connected to a first end portion (e.g., a P-type end portion) of the second light emitting element LD2 through a first intermediate electrode IET1 of the light source unit LSU.

The first end portion of the second light emitting element LD2 is connected to the second end portion of the first light emitting element LD1 via the first intermediate electrode IET1. In addition, a second end portion (e.g., an N-type end portion) of the second light emitting element LD2 is connected to a first end portion (e.g., a P-type end portion) of the third light emitting element LD3 through a second intermediate electrode IET2 of the light source unit LSU.

The first end portion of the third light emitting element LD3 is connected to the second end portion of the second light emitting element LD2 via the second intermediate electrode IET2. In addition, a second end portion (e.g., an N-type end portion) of the third light emitting element LD3 may be connected to the second power source VSS via a second electrode (i.e., a second pixel electrode) ELT2 of the light source unit LSU. In the above-described manner, the first, second, and third light emitting elements LD1, LD2, and LD3 may be sequentially connected in series between the first and second electrodes ELT1 and ELT2 of the light source unit LSU.

Although an embodiment in which the light emitting elements LD are connected in a three-stage serial structure has been illustrated in FIG. 6E, the present disclosure is not limited thereto. For example, in another embodiment of the present disclosure, two light emitting elements LD may be connected in a two-stage serial structure, or four light emitting elements LD may be connected in a four or more-stage serial structure.

When assuming that the same luminance is expressed using light emitting elements under the same condition (e.g., the same size and/or the same number), in a light source unit LSU having a structure in which the light emitting elements LD are connected in series, a voltage applied between first and second electrodes ELT1 and ELT2 may increase, and the magnitude of driving current flowing through the light source unit LSU may decrease, as compared with a light source unit LSU having a structure in which the light emitting elements LD are connected in parallel.

In some embodiments, at least one serial stage may include a plurality of light emitting elements LD connected in parallel to each other. The light source unit LSU may be configured in a serial/parallel hybrid structure. For example, the light source unit may be configured as shown in the embodiment shown in FIG. 6F or FIG. 6G.

Referring to FIG. 6F, at least one serial stage constituting a light source unit LSU may include a plurality of light emitting elements LD connected in parallel in a forward direction. For example, the light source unit LSU may include at least one first light emitting element LD1 disposed in a first serial stage (also, referred to as a "first stage"), at least one second light emitting element LD2 disposed in a second serial stage (also, referred to as a "second stage") subsequent to the first serial stage, and at least one third light emitting element LD3 disposed in a third serial stage (also, referred to as a "third stage") subsequent to the second serial stage. In addition, at least one of the first, second, and third serial stages may include a plurality of light emitting elements LD connected in a forward direction.

Although the light source unit LSU configured with the light emitting elements LD disposed in the three serial stages has been illustrated in FIG. 6F, the present disclosure is not limited thereto. For example, as shown in FIG. 6G, a light source unit LSU may include a plurality of light emitting elements LD disposed in only two serial stages (i.e., a first serial stage and a second serial stage). For example, the light source unit LSU may include at least one first light emitting element LD1 which is disposed in the first serial stage and has a first end portion (e.g., a P-type end portion) and a second end portion (e.g., an N-type end portion), which are respectively connected to a first electrode ELT1 and an intermediate electrode IET of the light source unit LSU, and at least one second light emitting element LD2 which is disposed in the second serial stage and has a first end portion (e.g., a P-type end portion) and a second end portion (e.g., an N-type end portion), which are respectively connected to the intermediate electrode IET and a second electrode ELT2 of the light source unit LSU. In addition, at least one of the first and second serial stages may include a plurality of light emitting elements LD connected in a forward direction.

In addition, a number of serial stages constituting the light source unit LSU may be variously changed. For example, the light source unit LSU may include a plurality of light emitting elements LD distributed in four or more serial stages. Also, a number of light emitting elements LD connected in the forward direction in each serial stage may be variously changed.

In some embodiments, the pixels PXL arranged in the display area DA may include light emitting elements LD of which numbers are equal or similar to each other. For example, in a process of supplying light emitting elements LD to each pixel PXL, the light emitting elements LD may be aligned by controlling a light emitting element ink (or "light emitting element solution") including the light emitting elements LD to be applied to an emission area of each pixel PXL with a uniform amount, and controlling a uniform electric field to be applied in each pixel PXL. Accordingly, the light emitting elements LD can be relatively uniformly supplied and aligned in the pixels PXL.

In some embodiments, as shown in FIGS. 6F and 6G, each pixel PXL may further include at least one reverse-direction light emitting element LDrv disposed at least one serial stage. For example, at least one of the plurality of serial stages may further include at least one reverse-direction light emitting element LDrv connected in a direction opposite to that of the light emitting elements LD.

However, although the reverse-direction light emitting element LDrv is connected to at least one serial stage, a driving current of the pixel PXL flows by sequentially passing through the serial stages, when at least one valid light source (e.g., the first light emitting element LD1, the second light emitting element LD2, and/or the third light emitting element LD3) connected in the forward direction to the serial stage is disposed. Accordingly, the light source unit LSU emits light with a luminance corresponding to the driving current.

Like the above-described embodiments, each light source unit LSU may include a plurality of light emitting elements LD connected in the forward direction between the first and second power sources VDD and VSS to form respective valid light sources. In some embodiments, a connection structure between the light emitting elements LD may be variously modified. For example, the light emitting elements LD may be connected only in series or parallel to each other, or may be connected in a serial/parallel hybrid structure.

As described above, the pixel PXL may include a pixel circuit PXC having various structures and/or a light source unit LSU having various structures. In addition, the structure of the pixel PXL which can be applied to the present disclosure is not limited to the embodiments shown in FIGS. 6A-6G, and each pixel PXL may have various structures. In addition, when each pixel PXL is configured in a passive light emitting display device, etc., the pixel circuit PXC may be omitted, and each of the first and second electrodes ELT1 and ELT2 may be directly connected to the scan line Si, the data line Dj, the first power line PL1, the second power line PL2, another signal line or power line, or the like.

Figure 7B:
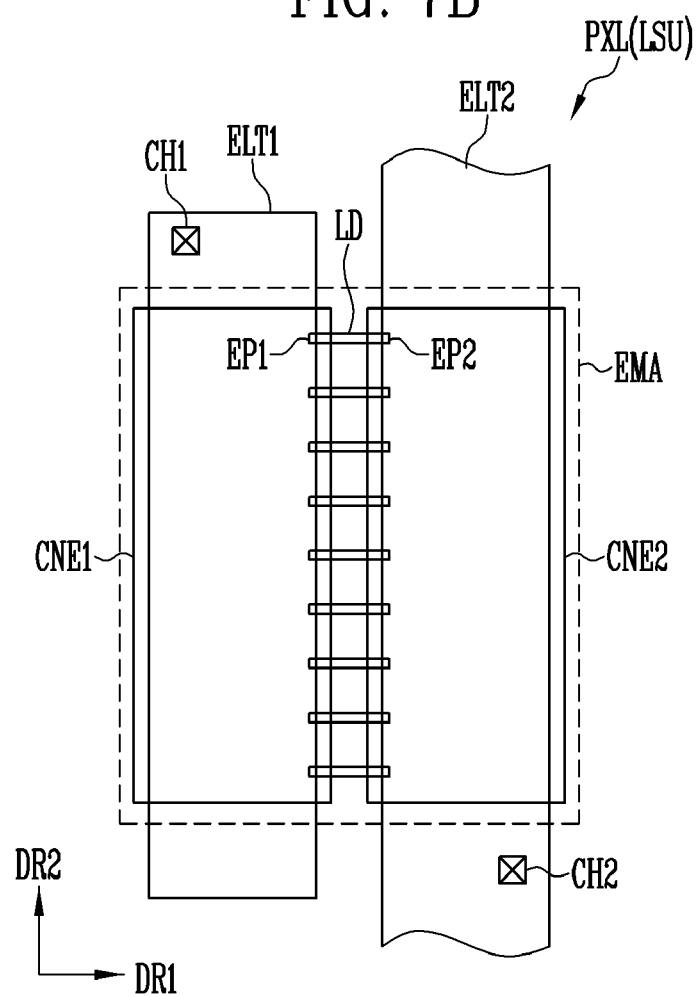
Figure 7D:
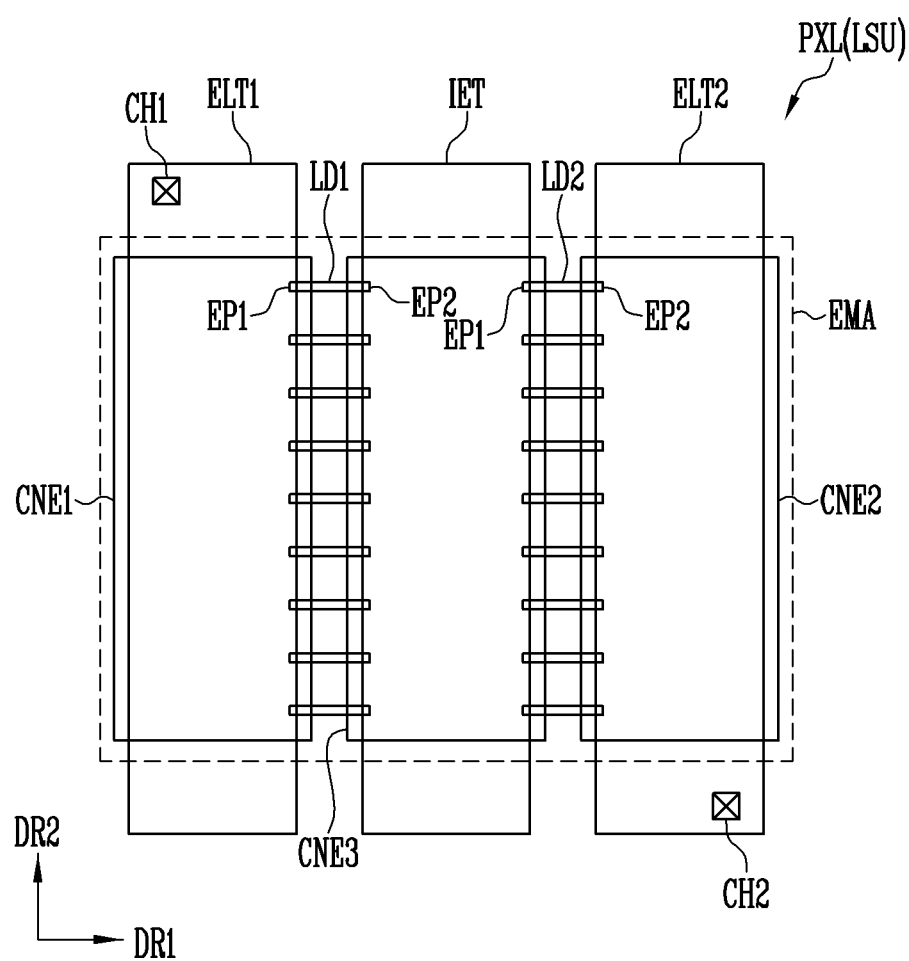

FIGS. 7A-7D are plan views each illustrating a pixel PXL in accordance with one or more example embodiments of the present disclosure. For example, FIGS. 7A-7C illustrate embodiments of a pixel PXL including a light source unit LSU having a parallel structure, and illustrate different embodiments related to shapes of first and second electrodes ELT1 and ELT2. In addition, FIG. 7D illustrates an embodiment of a pixel PXL including a light source unit having a serial/parallel hybrid structure.

In FIGS. 7A-7D, a structure of each pixel PXL will be described based on a light source unit LSU of the pixel PXL. However, in some embodiments, each pixel PXL may selectively further include circuit elements connected to the light source unit LSU (e.g., a plurality of circuit elements constituting each pixel circuit PXC).

Also, in FIGS. 7A-7D, an embodiment will be illustrated, in which each light source unit LSU is connected to a power line (e.g., a predetermined power line (e.g., a first power line PL1 and/or a second power line PL2)), a circuit element (e.g., a predetermined circuit element (e.g., at least one circuit element constituting a pixel circuit PXC)), and/or a signal line (e.g., a predetermined signal line (e.g., a scan line Si and/or a data line Dj)) through first and second contact holes CH1 and CH2. However, the present disclosure is not limited thereto. For example, in another embodiment, at least one of the first and second electrodes ELT1 and ELT2 of each pixel PXL does not pass through a contact hole and/or an intermediate line but may be directly connected a predetermined power line and/or a predetermined signal line.

First, referring to FIGS. 5-7C, the pixel PXL may include a first electrode ELT1 and a second electrode ELT2, which are disposed in each emission area EMA, and at least one light emitting element LD disposed between the first and second electrodes ELT1 and ELT2 (e.g., a plurality of light emitting elements LD connected in parallel between the first and second electrodes ELT1 and ELT2). For example, when the light emitting element LD is described as being disposed between the first and second electrodes ELT1 and ELT2, it may mean that, when viewed on a plane (e.g., in a plan view), at least one area of the light emitting element LD is located in an area between the first and second electrodes ELT1 and ELT2. In addition, the pixel PXL may further include a first contact electrode CNE1 (also, referred to as a "third electrode") and a second contact electrode CNE2 (also, referred to as a "fourth electrode"), which electrically connect the light emitting element LD between the first and second electrodes ELT1 and ELT2.

The first electrode ELT1 and the second electrode ELT2 may be disposed in each pixel area in which each pixel PXL is provided and/or formed. For example, the first electrode ELT1 and the second electrode ELT2 may be disposed in the emission area EMA of each pixel PXL.

In some embodiments, each pixel area may inclusively mean a pixel circuit area in which circuit elements for constituting a corresponding pixel PXL are disposed, and the emission area EMA in which a light source unit LSU of the pixel PXL is disposed. In addition, the emission area EMA may be an area in which light emitting elements LD (e.g., valid light sources connected in a forward direction between the first and second electrodes ELT1 and ELT2) constituting the light source unit LSU of each pixel PXL are disposed. Also, electrodes (e.g., predetermined electrodes (e.g., the first and second electrodes ELT1 and ELT2 and/or the first and second contact electrodes CNE1 and CNE2)) connected to the light emitting elements LD or one areas of the electrodes may be disposed in the emission area EMA.

The emission area EMA may be surrounded by a light blocking and/or reflective bank structure (e.g., a pixel defining layer and/or a black matrix) formed between adjacent pixels PXL to define each pixel area and the emission area EMA therein. For example, a bank structure (corresponding to a "second bank BNK2" shown in FIGS. 8A and 8B) surrounding the emission area EMA may be disposed at the periphery of the emission area EMA.

The first and second electrodes ELT1 and ELT2 may be disposed to be spaced from each other. For example, the first and second electrodes ELT1 and ELT2 may be spaced from each other at a distance (e.g., spaced from each other at a predetermined distance) along a first direction DR1 in each emission area EMA to be disposed in parallel to each other. In some embodiments, the first direction DR1 may be a horizontal direction (or row direction), but the present disclosure is not limited thereto.

In some embodiments, the first electrode ELT1 and/or the second electrode ELT2 may have a pattern separated for each pixel PXL or have a pattern commonly connected in a plurality of pixels PXL. For example, as shown in FIG. 7A, the first and second electrodes ELT1 and ELT2 may have an independent pattern of which both ends are disconnected from the electrodes of the adjacent pixels PXL at the outside of a corresponding emission area EMA or the inside of the emission area EMA. In another embodiment, as shown in FIGS. 7B and 7C, the first electrode ELT1 has an independent pattern of which both ends are disconnected from the electrodes of the adjacent pixels PXL at the outside of a corresponding emission area EMA or the inside of the emission area EMA, and the second electrode ELT2 may have one end portion extending along the first direction DR1 or a second direction DR2, to be integrally connected to a second electrode ELT2 of another pixel PXL adjacent in the first direction DR1 or the second direction DR2. In some embodiments, the second direction DR2 may be a vertical direction (or column direction) crossing the first direction DR1, but the present disclosure is not limited thereto.

In some embodiments, in a process of forming the pixel PXL, for example, before the light emitting elements LD are completely aligned, first electrodes ELT1 of pixels PXL (e.g., adjacent pixels PXL in the second direction) disposed in the display area DA may be connected to each other, and second electrodes ELT2 of the pixels PXL (e.g., adjacent pixels PXL in the second direction) may be connected to each other. For example, before the light emitting elements LD are completely aligned, the first electrodes ELT1 of the pixels PXL may be integrally or non-integrally formed and be electrically connected to each other, and the second electrodes ELT2 of the pixels PXL may be integrally or non-integrally formed and be electrically connected to each other. When the first electrodes ELT1 or the second electrodes ELT2 of the pixels PXL are non-integrally connected to each other, the first electrodes ELT1 or the second electrodes ELT2 may be electrically connected to each other by at least one contact hole and/or a bridge pattern.

The first and second electrodes ELT1 and ELT2 may be respectively supplied with a first alignment signal (or first alignment voltage) and a second alignment signal (or second alignment voltage) when the light emitting elements LD are aligned. For example, any one of the first and second electrodes ELT1 and ELT2 may be supplied with an alignment signal in an AC form, and the other one of the first and second electrodes ELT1 and ELT2 may be supplied with an alignment voltage (e.g., a ground voltage) having a constant voltage level.

For example, an alignment signal (e.g., a predetermined alignment signal) may be applied to the first and second electrodes ELT1 and ELT2 when the light emitting elements LD are aligned. Accordingly, an electric field may be formed between the first and second electrodes ELT1 and ELT2. The light emitting elements LD supplied to the emission area EMA of each pixel area (e.g., the emission area EMA of each pixel PXL) may be self-aligned between the first and second electrodes ELT1 and ELT2. After the light emitting elements LD are completely aligned, the connection between at least the first electrodes ELT1 is disconnected between pixels PXL (e.g., adjacent pixels PXL in the second direction), so that the pixels PXL can be formed in a form in which the pixels PXL can be individually driven.

The first and second electrodes ELT1 and ELT2 may have various shapes. For example, as shown in FIGS. 7A and 7B, each the first and second electrodes ELT1 and ELT2 may have a bar shape extending along any one direction. For example, each of the first and second electrodes ELT1 and ELT2 may have a bar shape extending along the second direction DR2 crossing (or orthogonal to) the first direction DR1.

In another embodiment, as shown in FIG. 7C, the first and second electrodes ELT1 and ELT2 may have a bar shape extending along the second direction DR2 in the emission area EMA, and extending along the first direction DR1 at the outside or periphery of the emission area EMA. For example, the first electrode ELT1 may have a structure bent at an upper end of the emission area EMA to extend along the first direction DR1, and the second electrode ELT2 may have a structure bent at a lower end of the emission area EMA to extend along the first direction DR1.

In addition, the shapes and/or structures of the first and second electrodes ELT1 and ELT2 may be variously modified. For example, the first electrode ELT1 and/or the second electrode ELT2 may be formed as a spiral or circular electrode.

Although an embodiment in which one first electrode ELT1 and one second electrode ELT2 are disposed in each emission area EMA has been disclosed in FIGS. 7A-7C, the number and/or arrangement structure of the first and second electrodes ELT1 and ELT2 arranged in each pixel PXL may be variously modified. For example, in another embodiment, a plurality of first electrodes ELT1 and/or a plurality of second electrodes ELT2 may be arranged in the emission area EMA of each pixel PXL.

When a plurality of first electrodes ELT1 are arranged in one pixel PXL, the first electrodes ELT1 may be integrally or non-integrally connected to each other. For example, the first electrodes ELT1 of adjacent pixels PXL in the second direction may be integrally connected to each other, or may be connected to each other by a bridge pattern located in a layer (e.g., a circuit layer in which the pixel circuit PXC is disposed) different from that thereof. Similarly, when a plurality of second electrodes ELT2 are arranged in one pixel PXL, the second electrodes ELT2 may be integrally or non-integrally connected to each other. For example, the second electrodes ELT2 of adjacent pixels PXL in the second direction may be integrally connected to each other, or may be connected to each other by a bridge pattern located in a layer different from that thereof.

In the present disclosure, the shape, number, arrangement direction, and/or arrangement relationship of the first and second electrodes ELT1 and ELT2 arranged in each pixel PXL may be variously modified.

The first electrode ELT1 may be electrically connected to a circuit element (e.g., a predetermined circuit element (e.g., at least one transistor constituting the pixel circuit PXC)), a power line (e.g., a predetermined power line (e.g., the first power line PL1)), and/or a signal line (e.g., a predetermined signal line (e.g., the scan line Si, the data line Dj, or a predetermined control line)). However, the present disclosure is not limited thereto. For example, in another embodiment, the first electrode ELT1 may be directly connected to the power line (e.g., a predetermined power line) or the signal line (e.g., a predetermined signal line).

In some embodiments, the first electrode ELT1 may be electrically connected to a circuit element (e.g., a predetermined circuit element) disposed on the bottom thereof through the first contact hole CH1, and may be electrically connected to a first line through the circuit element. The first line may be the first power line PL1 for supplying the voltage from the first power source VDD, but the present disclosure is not limited thereto. For example, the first line may be a signal line to which a first driving voltage (e.g., a predetermined first driving signal (e.g., a scan signal, a data signal, a predetermined control signal, or the like)) is supplied.

The second electrode ELT2 may be electrically connected to a circuit element (e.g., a predetermined circuit element (e.g., at least one transistor constituting the pixel circuit PXC)), a power line (e.g., a predetermined power line (e.g., the second power line PL2)), and/or a signal line (e.g., a predetermined signal line (e.g., the scan line Si, the data line Dj, or a predetermined control line)) through the second contact hole CH2. However, the present disclosure is not limited thereto. For example, in another embodiment, the second electrode ELT2 may be directly connected to the power line (e.g., a predetermined power line) or the signal line (e.g., a predetermined signal line).

In some embodiments, the second electrode ELT2 may be electrically connected to a second line disposed on the bottom thereof through the second contact hole CH2. The second line may be the second power line PL2 for supplying the voltage from the second power source VSS, but the present disclosure is not limited thereto. For example, the second line may be a signal line to which a driving signal (e.g., a predetermined driving signal (e.g., a scan signal, a data signal, a predetermined control signal, or the like)) is supplied.

Each of the first and second electrodes ELT1 and ELT2 may be configured as a single layer or a multi-layer. For example, the first electrode ELT1 may include at least one reflective electrode layer including a reflective conductive material, and selectively further include at least one transparent electrode layer and/or at least one conductive capping layer. Similarly, the second electrode ELT2 may include at least one reflective electrode layer including a reflective conductive material, and selectively further include at least one transparent electrode layer and/or at least one conductive capping layer. The reflective conductive material may be a metal having high reflexibility in a visible ray wavelength band, e.g., at least one various metallic materials including aluminum (Al), gold (Au), and silver (Ag), but the present disclosure is not limited thereto.

The light emitting elements LD may be disposed between the first electrode ELT1 and the second electrode ELT2. For example, the light emitting elements LD may be connected in parallel between the first electrode ELT1 and the second electrode ELT2. For example, each light emitting element LD may be aligned in the first direction DR1 between the first electrode ELT1 and the second electrode ELT2, to be electrically connected between the first and second electrodes ELT1 and ELT2.

Although a case where all the light emitting elements LD are uniformly aligned in the first direction DR1 has been illustrated in FIGS. 7A-7D, the present disclosure is not limited thereto. For example, at least one of the light emitting elements LD may be arranged in an oblique direction inclined with respect to the first and second directions DR1 and DR2 between the first and second electrodes ELT1 and ELT2.

In some embodiments, each light emitting element LD may be a light emitting element having a size in micro scale, e.g., a small size in a range of nano scale to micro scale or nano scale, which uses a material having an inorganic crystalline structure. For example, each light emitting element LD may be a micro light emitting element having a small size in a range of nano scale to micro scale as shown in FIGS. 1A-4B. However, the kind and/or size of the light emitting element LD may be variously modified according to design conditions of each light emitting apparatus, e.g., each pixel PXL using the light emitting element LD as a light source.

Each light emitting element LD may include a first end portion EP1 disposed toward the first electrode ELT1 and a second end portion EP2 disposed toward the second electrode ELT2. In some embodiments, each light emitting element LD may overlap with the first electrode ELT1 and/or the second electrode ELT2, or may not overlap with the first electrode ELT1 and/or the second electrode ELT2. For example, the first end portion EP1 of the light emitting element LD may overlap with the first electrode ELT1, or may not overlap with the first electrode ELT1. Similarly, the second end portion EP2 of the light emitting element LD may overlap with the second electrode ELT2, or may not overlap with the second electrode ELT2.

In some embodiments, the first end portion EP1 of each light emitting element LD may be connected to the first electrode ELT1, and the second end portion EP2 of each light emitting element LD may be connected to the second electrode ELT2. For example, the first end portion EP1 of each light emitting element LD may be electrically connected to the first electrode ELT1 through the first contact electrode CNE1, and the second end portion EP2 of each light emitting element LD may be electrically connected to the second electrode ELT2 through the second contact electrode CNE2. In another embodiment, the first end portion EP1 of each light emitting element LD may be in direct contact with the first electrode ELT1, to be electrically connected to the first electrode ELT1. Similarly, the second end portion EP2 of each light emitting element LD may be in direct contact with the second electrode ELT2, to be electrically connected to the second electrode ELT2. The first contact electrode CNE1 and/or the second contact electrode CNE2 may be selectively formed.

In some embodiments, the light emitting elements LD may be prepared in a form in which the light emitting elements LD are dispersed in a solution (e.g., a predetermined solution), to be supplied to each pixel area (e.g., the emission area EMA of each pixel PXL) through an inkjet printing process, a slit coating process, or the like. For example, the light emitting elements LD may be supplied to the emission area EMA of each pixel while being mixed with a volatile solvent. When an alignment voltage (e.g., a predetermined alignment voltage or alignment signal) is applied to the first and second electrodes ELT1 and ELT2 of the pixels PXL, the light emitting elements LD are aligned between the first and second electrodes ELT1 and ELT2, while an electric field is being formed between the first and second electrodes ELT1 and ELT2. After the light emitting elements LD are aligned, the light emitting elements LD may be stably arranged between the first and second electrodes ELT1 and ELT2 by volatilizing the solvent or removing the solvent in another manner.

In some embodiments, the first contact electrode CNE1 and the second contact electrode CNE2 may be respectively formed on both end portions, e.g., the first and second end portions EP1 and EP2 of the light emitting elements LD. Accordingly, the light emitting elements LD can be more stably connected between the first and second electrodes ELT1 and ELT2.

The first contact electrode CNE1 may be disposed on the first electrode ELT1 and the first end portion EP1 of at least one light emitting element LD adjacent thereto to overlap with the first electrode ELT1 and the light emitting element LD. For example, the first contact electrode CNE1 may be disposed on the first electrode ELT1 and the first end portions EP1 of a plurality of light emitting elements LD adjacent thereto to overlap with the first electrode ELT1 and the first end portions EP1 of the light emitting elements LD.

The first contact electrode CNE1 may electrically connect the first electrode ELT1 to the first end portions EP1 of the light emitting elements LD. Also, the first contact electrode CNE1 may stably fix the first end portions EP1 of the light emitting elements LD. In another embodiment, when the first contact electrode CNE1 is not formed, the first end portions EP1 of the light emitting elements LD may be disposed to overlap with the first electrode ELT1 adjacent thereto, to be directly connected to the first electrode ELT1.

The second contact electrode CNE2 may be disposed on the second electrode ELT2 and the second end portion EP2 of at least one light emitting element LD to overlap with the second electrode ELT2 and the second end portion EP2 of the light emitting element LD. For example, the second contact electrode CNE2 may be disposed on the second electrode ELT2 and the second end portions EP2 of a plurality of light emitting elements LD adjacent thereto to overlap with the second electrode ELT2 and the second end portions EP2 of the light emitting elements LD.

The second contact electrode CNE2 may electrically connect the second electrode ELT2 to the second end portions EP2 of the light emitting elements LD. Also, the second contact electrode CNE2 may stably fix the second end portions EP2 of the light emitting elements LD. In another embodiment, when the second contact electrode CNE2 is not formed, the second end portions EP2 of the light emitting elements LD may be disposed to overlap with the second electrode ELT2 adjacent thereto, to be directly connected to the second electrode ELT2.

When the light source unit LSU includes at least two serial stages, at least one additional electrode may be further formed in the emission area EMA of each pixel PXL. For example, when the light source unit LSU of a pixel PXL is configured in a serial/parallel hybrid structure including two serial stages, the pixel PX may further include an intermediate electrode IET disposed between the first and second electrodes ELT1 and ELT2 as shown in FIG. 7D. The intermediate electrode IET may be disposed to be spaced from the first and second electrodes ELT1 and ELT2 between the first and second electrodes ELT1 and ELT2. The intermediate electrode IET may be electrically connected to the first electrode ELT1 and the second electrode ELT2 respectively through at least one first light emitting element LD1 and at least one second light emitting element LD2. In addition, the pixel PXL may selectively further include a third contact electrode CNE3 for stably connecting the intermediate electrode IET to second end portions EP2 of the first light emitting elements LD1 and first end portions EP1 of the second light emitting elements LD2.

In the above-described embodiments, each light emitting element LD connected in a forward direction between the first and second electrodes ELT1 and ELT2 may form a valid light source of a corresponding pixel PXL. In addition, the valid light sources may constitute a light source unit LSU of the corresponding pixel PXL.

For example, when the first power source VDD (or a predetermined first control signal including a scan signal, a data signal, or the like) is applied to the first end portions EP1 of the light emitting elements LD via the first power line PL1, the first electrode ELT1, and/or the first contact electrode CNE1, and the second power source VSS (or a predetermined second control signal including a scan signal, a data signal, or the like) is applied to the second end portions EP2 of the light emitting elements LD via the second power line, the second electrode ELT2, and/or the second contact electrode CNE2, the light emitting elements LD connected in the forward direction between the first and second electrodes ELT1 and ELT2 emit light. Accordingly, light is emitted from the pixel PXL.

Figure 8A:
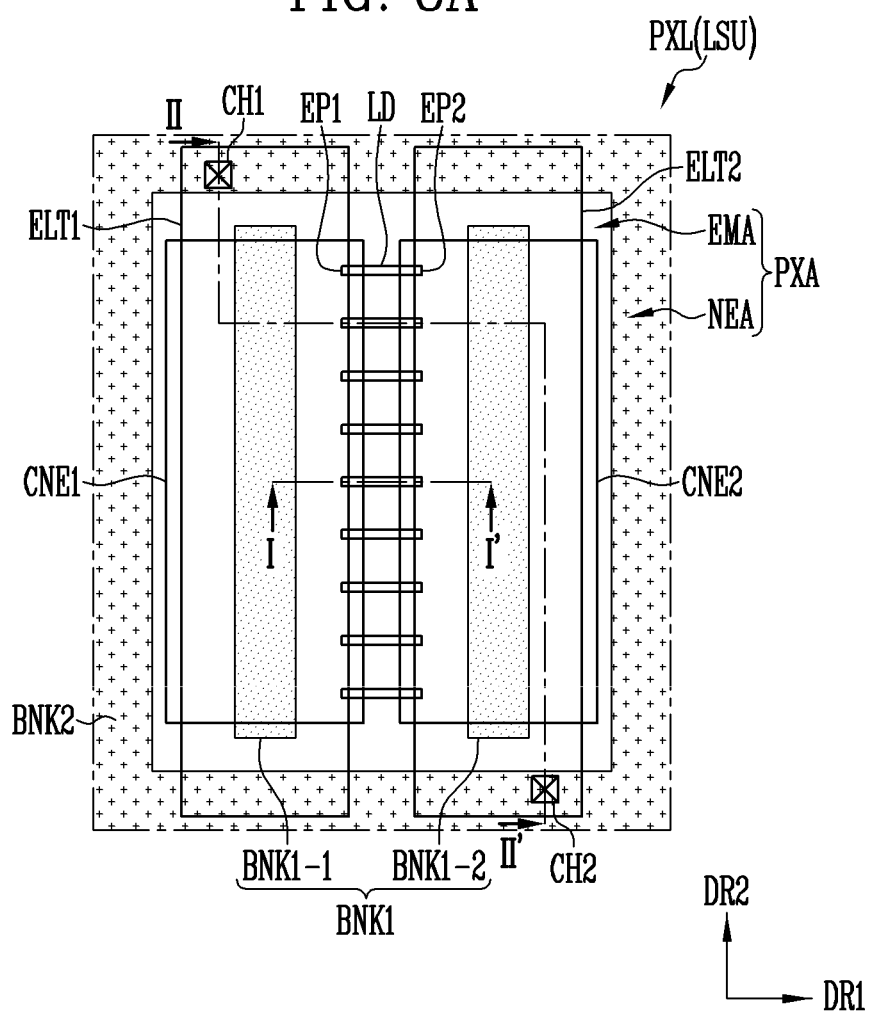
FIGS. 8A and 8B are plan views each illustrating a pixel in accordance with one or more example embodiments of the present disclosure.
Figure 8B:
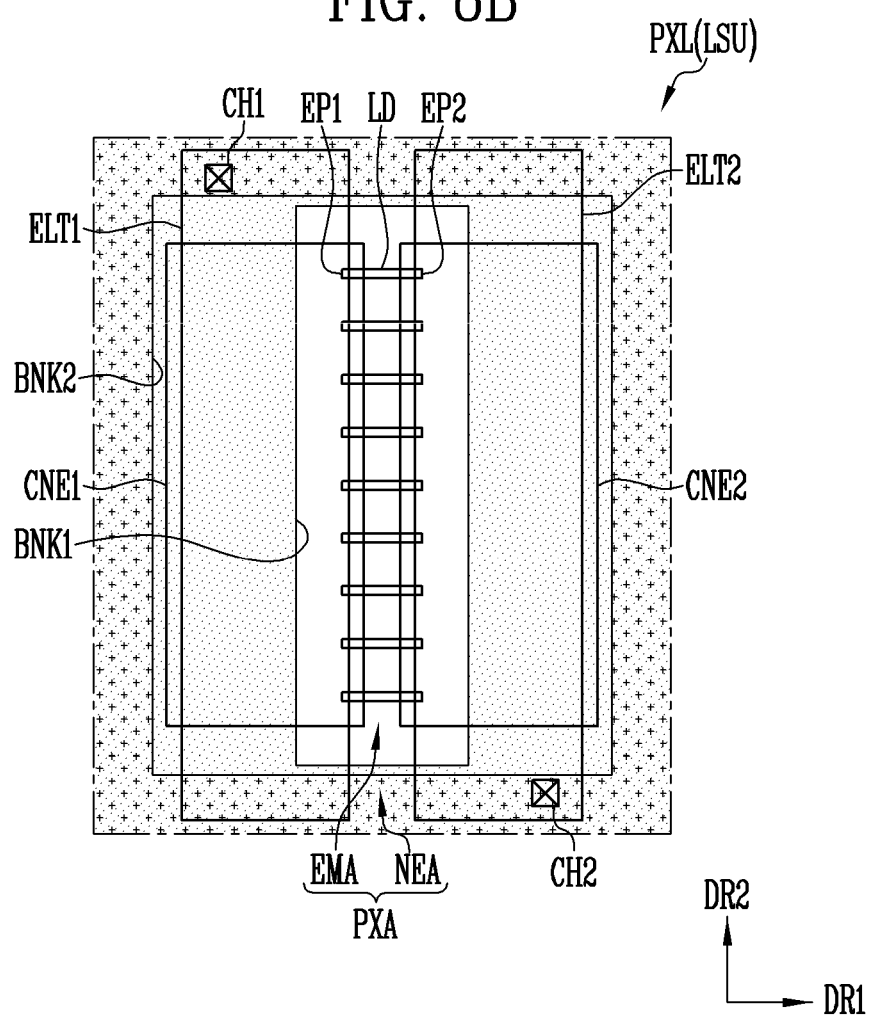

FIGS. 8A and 8B are plan views each illustrating a pixel PXL in accordance with one or more example embodiments of the present disclosure. For example, FIGS. 8A and 8B disclose a pixel PXL which further includes a first bank BNK1 and a second bank BNK2. For example, FIGS. 8A and 8B illustrate different embodiments of a shape and/or a position of the first bank BNK1.

Although a modified embodiment of the pixel PXL shown in FIG. 7A is disclosed in FIGS. 8A and 8B, the pixel PXL applicable to the first and second banks BNK1 and BNK2 is not limited thereto. For example, the first and second banks BNK1 and BNK2 shown in FIGS. 8A and 8B may be applied to the pixels PXL shown in FIGS. 7A-7D, or be applied to pixels PXL having other structures in addition to the pixels PXL shown in FIGS. 7A-7D.

Referring to FIGS. 7A-8B, each pixel PXL may further include a first bank BNK1 overlapping with the first electrode ELT1 and the second electrode ELT2 and a second bank BNK2 surrounding each emission area EMA.

The first bank BNK1 (also, referred to as a "partition wall") may be disposed to overlap with one areas of the first and second electrodes ELT1 and ELT2. For example, the first bank BNK1 may be disposed on the bottom of the first and second electrodes ELT1 and ELT2 to overlap with one area of each of the first and second electrodes ELT1 and ELT2 when viewed on a plane. In another embodiment, the first bank BNK1 may be disposed on the top of the first and second electrodes ELT1 and ELT2 to overlap with one area of each of the first and second electrodes ELT1 and ELT2 when viewed on a plane.

The first bank BNK1 is used to form a wall structure at the periphery of light emitting elements LD, and may be formed with separated patterns or an integrated pattern. For example, as shown in FIG. 8A, the first bank BNK1 may include a (1-1)th bank BNK1-1 and a (1-2)th bank BNK1-2, which are separated from each other. When viewed on a plane, the (1-1)th bank BNK1-1 may overlap with the first electrode ELT1 and the first contact electrode CNE1, and the (1-2)th bank BNK1-2 may overlap with the second electrode ELT2 and the second contact electrode CNE2.

In another embodiment, as shown in FIG. 8B, the first bank BNK1 may have a shape surrounding an area in which light emitting elements LD are disposed while having an opening or groove corresponding to the area in which the light emitting elements LD are disposed. For example, the first bank BNK1 may be disposed in a peripheral area of the area in which the light emitting elements LD are disposed to overlap with one area of each of the first and second electrodes ELT1 and ELT2 and the second bank BNK2. The first bank BNK1 may be formed in at least a portion of an emission area EMA and an area including a non-emission area NEA at the periphery of the emission area EMA. The non-emission area NEA may mean the other area except the emission area EMA in each pixel area PXA.

When the first bank BNK1 is disposed on the bottom of one area of each of the first and second electrodes ELT1 and ELT2, the first and second electrodes ELT1 and ELT2 may protrude in an upper direction in the area in which the first bank BNK1 is formed. The first bank BNK1 along with the first and second electrodes ELT1 and ELT2 may constitute a reflective bank (also, referred to as a "reflective partition wall"). For example, the first and second electrodes ELT1 and ELT2 and/or the first bank BNK1 may be formed of a material having reflexibility, or at least one material layer having reflexibility may be formed on a protruding sidewall of the first and second electrodes ELT1 and ELT2 and/or the first bank BNK1. Accordingly, light emitting from the first and second end portions EP1 and EP2 of the light emitting elements LD facing the first and second electrodes ELT1 and ELT2 may be guided to face a front direction of the display panel PNL. The front direction of the display panel PNL may include a direction (e.g., an upper direction of the pixel PXL) perpendicular to the display panel PNL. In addition, the front direction of the display panel PNL may inclusively mean a direction belonging to a predetermined viewing angle range. As described above, when one area of each of the first and second electrodes ELT1 and ELT2 protrudes in the upper direction by using the first bank BNK1, the ratio of lights facing the front direction of the display panel PNL from among lights generated in the pixel PXL is increased, so that the light efficiency of the pixel PXL may be improved.

In some embodiments, the first bank BNK1 may be disposed on the top of the first and second electrodes ELT1 and ELT2. The first and second electrodes ELT1 and ELT2 may be formed substantially flat, or may be formed to have an uneven surface.

The second bank BNK2 is a structure defining the emission area EMA of each pixel PXL, and may be, for example, a pixel defining layer. For example, the second bank BNK2 may be disposed in a boundary area of each pixel area PXA in which each pixel PXL is provided and/or an area between adjacent pixels PXL, to surround the emission area EMA of the pixel PXL.

The second bank BNK2 may partially overlap with the first electrode ELT1 and/or the second electrode ELT2, or may not overlap with the first electrode ELT1 and/or the second electrode ELT2. For example, the first electrode ELT1 and/or the second electrode ELT2 may extend up to the non-emission area NEA to overlap with the second bank BNK2, or be disconnected in the emission area EMA not to overlap with the second bank BNK2.

Also, the second bank BNK2 may overlap with the first contact hole CH1 and/or the second contact hole CH2, or may not overlap with the first contact hole CH1 and/or the second contact hole CH2. For example, the first contact hole CH1 and/or the second contact hole CH2 may be formed in the non-emission area NEA to overlap with the second bank BNK2, or may be formed in the emission area EMA not to overlap with the second bank BNK2.

The second bank BNK2 includes at least one light blocking material and/or at least one reflective material, to prevent light leakage between adjacent pixels PXL. For example, the second bank BNK2 may include at least one black matrix material (e.g., at least one light blocking material currently known to those of ordinary skill in the art) from among various kinds of black matrix materials, and/or a color filter material of a specific color. For example, the second bank BNK2 may be formed of a black opaque pattern to block transmission of light. In some embodiments, a reflective layer (not shown) may be formed on a surface (e.g., a sidewall of the second bank BNK2 such that the light efficiency of the pixel PXL can be further improved.

Also, in a process of supplying light emitting elements LD to each pixel PXL, the second bank BNK2 may serve as a dam structure defining each emission area EMA to which the light emitting elements LD are to be supplied. For example, each emission area EMA is partitioned by the second bank BNK2, so that a desired kind and/or a desired amount of light emitting ink can be supplied to the emission area EMA.

In some embodiments, in a process of forming first banks BNK1 of pixels PXL, the second bank BNK2 may be concurrently formed (or simultaneously formed) in the same layer as the first banks BNK1. In another embodiment, the second bank may be formed in the same layer as first banks BNK1 or be formed in a layer different from that of the first banks BNK1 through a process separate from the process of forming the first banks BNK1. For example, the second bank BNK2 may be formed on the top of the first bank BNK1.

Figure 9A:
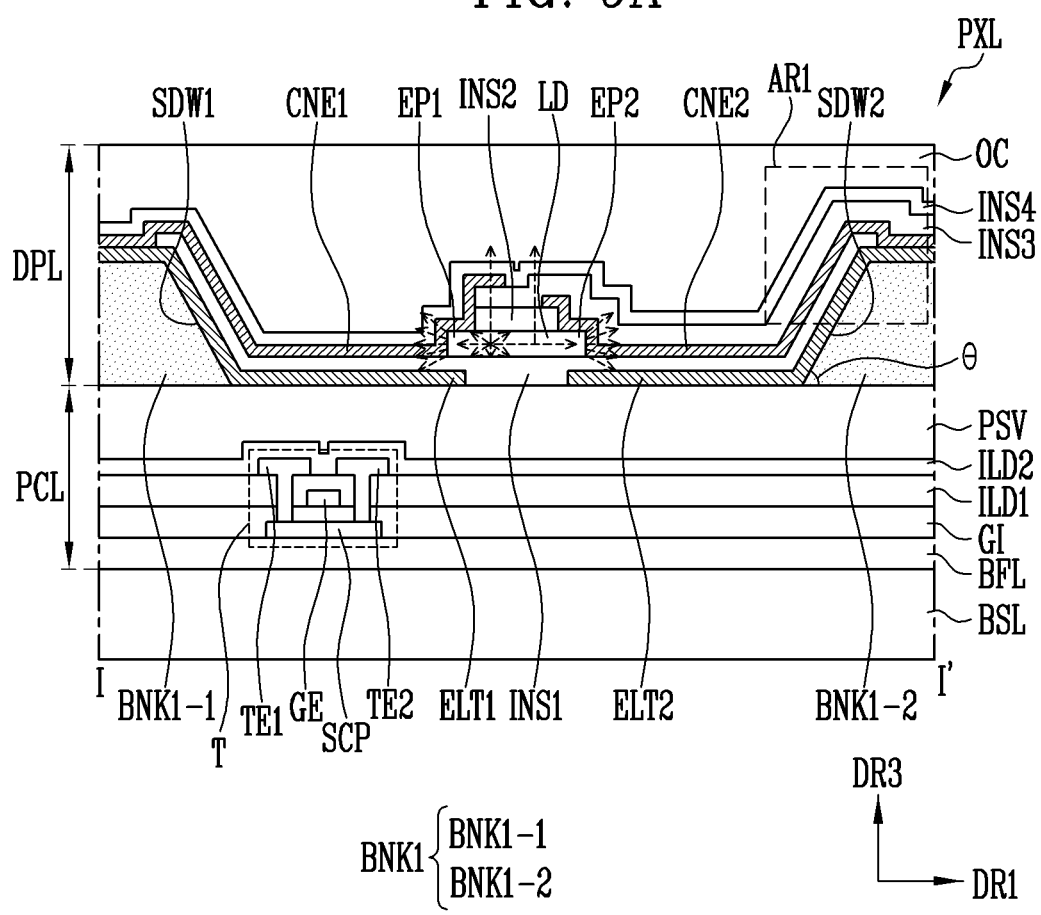
FIGS. 9A-9C are sectional views each illustrating a pixel in accordance with one or more example embodiments of the present disclosure.
Figure 9B:
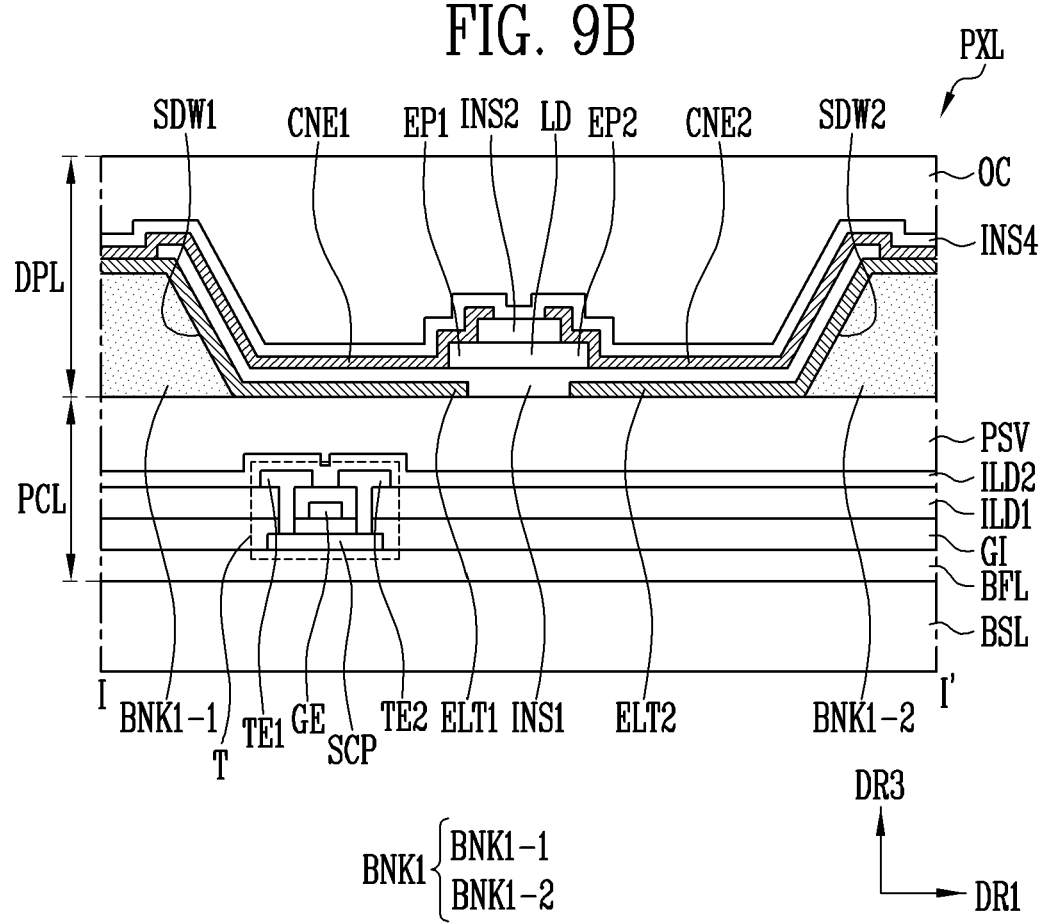
Figure 9C:
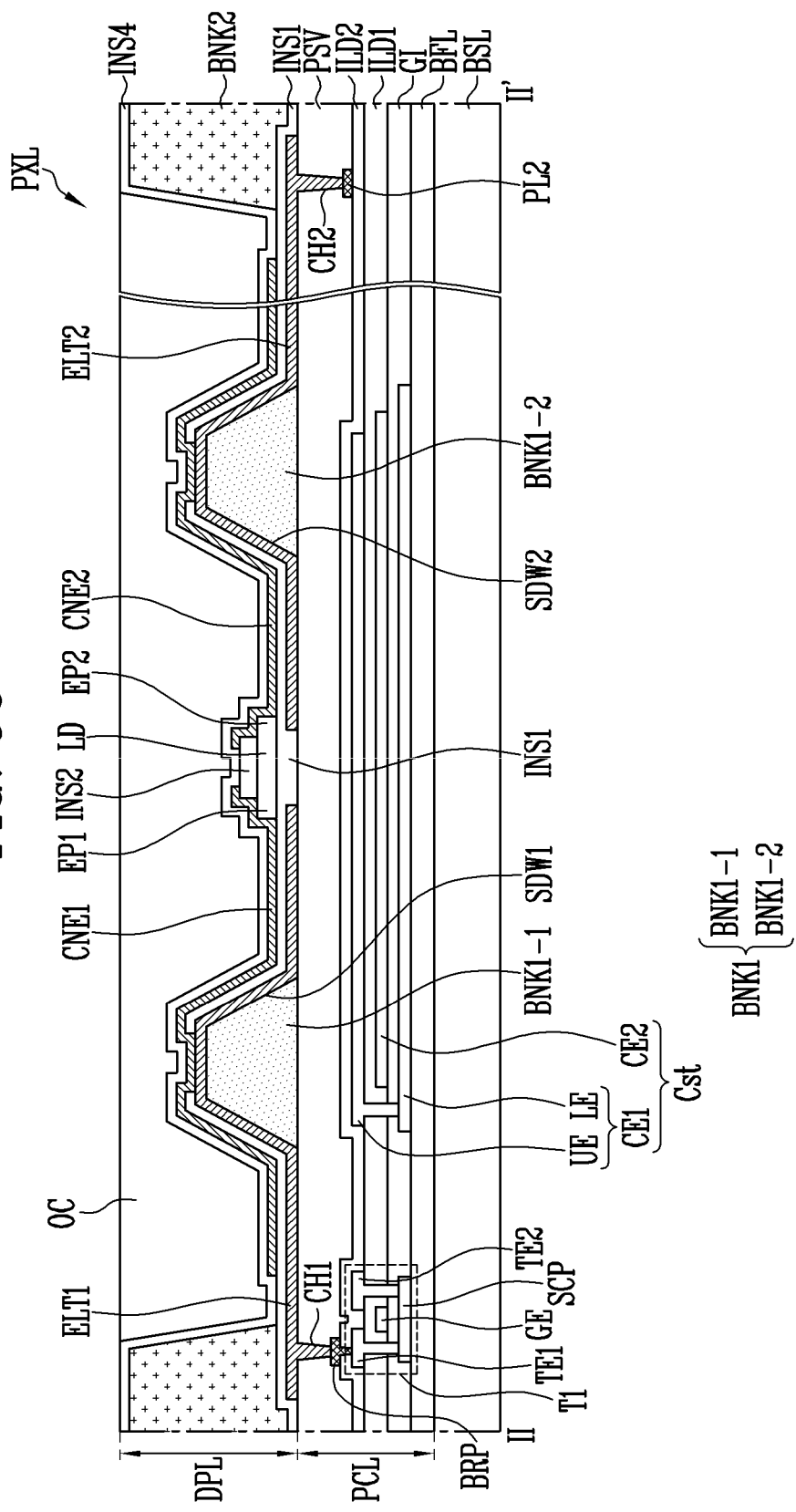

FIGS. 9A-9C are sectional views each illustrating a pixel in accordance with one or more example embodiments of the present disclosure. For example, FIGS. 9A and 9B illustrate different embodiments of a section of the pixel PXL taken along the line I-I' shown in FIG. 8A, and FIG. 9C illustrates an embodiment of a section of the pixel PXL taken along the line II-II' shown in FIG. 8A. In some embodiments, the pixels PXL arranged in the display area DA may substantially have the same sectional structure or similar sectional structures.

In order to show various circuit elements constituting a pixel circuit PXC, an arbitrary transistor T from among the circuit elements will be illustrated in FIGS. 9A and 9B, and a transistor (e.g., the first transistor T1 and the storage capacitor Cst, which are shown in FIGS. 6A and 6B) connected to a first electrode ELT1 from among the circuit elements will be illustrated in FIG. 9C. Hereinafter, when it is unnecessary to distinguish and specify the first transistor T1, the first transistor T1 will be inclusively designated as a "transistor T."

The structures and/or positions for each layer of the transistors T and the storage capacitor Cst are not limited to the embodiment shown in FIGS. 9A-9C, and may be variously changed in some embodiments. Also, in some embodiments, the transistors T constituting each pixel circuit PXC may substantially have the same structure or similar structures, but the present disclosure is not limited thereto. For example, in another embodiment, at least one of the transistors T constituting the pixel circuit PXC may have a sectional structure different from that of the other transistors T, and/or be disposed in or at a layer different from that of the other transistors T.

Figure 9D:
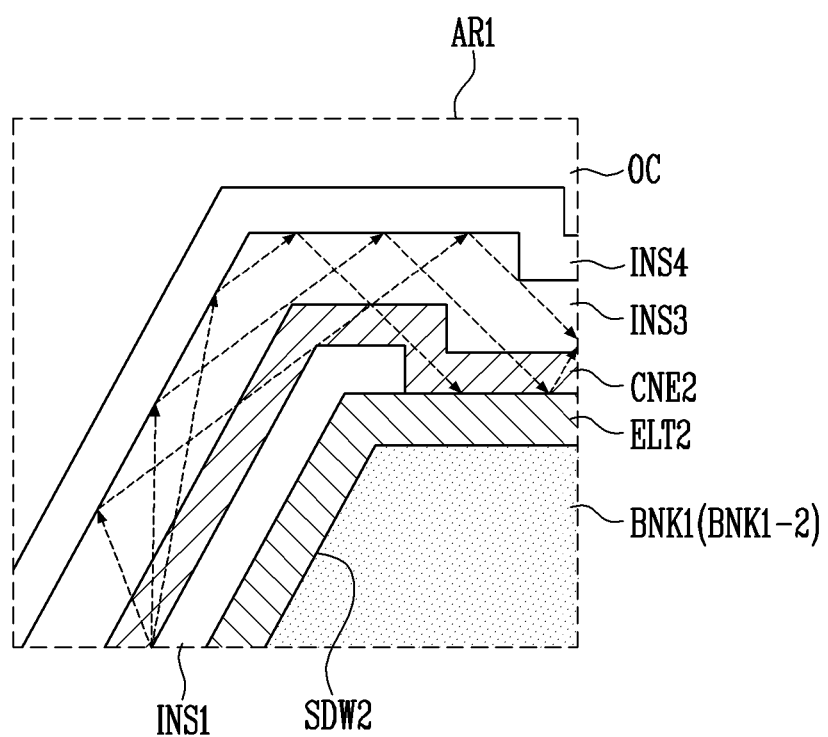
FIG. 9D is an enlarged view of one area shown in FIG. 9A.

FIG. 9D is an enlarged view of one area shown in FIG. 9A. For example, FIG. 9D illustrates an enlarged view of area AR1 shown in FIG. 9A and an example propagation path of some of lights passing through the area AR1.

First, referring to FIGS. 5-9C, the pixel PXL and the display device having the same in accordance with the embodiments of the present disclosure may include a circuit layer PCL and a display layer DPL, which are disposed on one surface of the base layer BSL to overlap with each other. For example, the display area DA may include the circuit layer PCL disposed on the one surface of the base layer BSL and the display layer DPL on the circuit layer PCL.

In some embodiments, circuit elements constituting a pixel circuit PXC of each pixel PXL and various lines connected thereto may be disposed in or at the circuit layer PCL. In addition, electrodes (e.g., first and second electrodes ELT1 and ELT2 and/or first and second contact electrodes CNE1 and CNE2) constituting a light source unit LSU of each pixel PXL may be disposed in or at the display layer DPL.

The circuit layer PCL may include at least one circuit element electrically connected to light emitting elements LD of each pixel PXL. For example, the circuit layer PCL may include a plurality of transistors T and a storage capacitor Cst, which are disposed in each pixel area PXA to constitute a pixel circuit PXC of a corresponding pixel PXL. Also, the circuit layer PCL may further include at least one power line and/or a signal line, connected each pixel circuit PXC and/or each light source unit LSU. For example, the circuit layer PCL may include a first power line PL1, a second power line PL2, a scan line Si of each pixel PXL, and a data line Dj of each pixel PXL. In some embodiments, when the pixel circuit PXC is omitted, and the light source unit LSU of each pixel PXL is directly connected to the first and second power lines PL1 and PL2 (or predetermined signal lines), the circuit layer PCL may be omitted.

Also, the circuit layer PCL may include a plurality of insulating layers. For example, the circuit layer PCL may include a buffer layer BFL, a gate insulating layer GI, a first interlayer insulating layer ILD1, a second interlayer insulating layer ILD2, and/or a passivation layer PSV, which are sequentially stacked on the one surface of the base layer BSL. Also, the circuit layer PCL may selectively further include at least one light blocking pattern (not shown) and the like, which are disposed on the bottom of at least some transistors T.

The buffer layer BFL may prevent an impurity from being diffused into each circuit element. The buffer layer BFL may be configured as a single layer, but may be configured as a multi-layer including at least two layers. When the buffer layer BFL is provided as the multi-layer, the layers may be formed of the same material or may be formed of different materials. Various circuit elements such as transistors T and a storage capacitor Cst and various lines connected to the circuit elements may be disposed on the buffer layer BFL. In some embodiments, the buffer layer BFL may be omitted. At least one circuit element and/or at least one line may be directly disposed on the one surface of the base layer BSL.

Each transistor T includes a semiconductor pattern SCP (also, referred to as a "semiconductor layer" or "active layer"), a gate electrode GE, and first and second transistor electrodes TE1 and TE2. Although an embodiment in which each transistor T includes the first and second transistor electrodes TE1 and TE2 formed separately from the semiconductor pattern SCP is illustrated in FIGS. 9A-9C, the present disclosure is not limited thereto. For example, in another embodiment, the first transistor electrode TE1 and/or the second transistor electrode TE2, provided in at least transistor T, may be integrated with each semiconductor pattern SCP.

The semiconductor pattern SCP may be disposed on the buffer layer BFL. For example, the semiconductor pattern SCP may be disposed between the base layer BSL on which the buffer layer BFL is formed and the gate insulating layer GI. The semiconductor pattern SCP may include a first region in contact with each first transistor electrode TE1, a second region in contact with each second transistor electrode ET2, and a channel region located between the first and second regions. In some embodiments, one of the first and second regions may be a source region, and the other one of the first and second regions may be a drain region.

In some embodiments, the semiconductor pattern SCP may be a semiconductor pattern made of poly-silicon, amorphous silicon, oxide semiconductor, etc. In addition, the channel region of the semiconductor pattern SCP is a semiconductor pattern undoped with an impurity, and may be an intrinsic semiconductor. Each of the first and second regions of the semiconductor pattern SCP may be a semiconductor pattern doped with an impurity (e.g. a predetermined impurity).

In some embodiments, the semiconductor patterns SCP of the transistors T constituting each pixel circuit PXC may be substantially made of the same material or similar materials. For example, the semiconductor patterns SCP of the transistors T may be made of any one material from among poly-silicon, amorphous silicon, and an oxide semiconductor.

In another embodiment, some and the others of the transistors T may include semiconductor patterns SCP made of different materials. For example, the semiconductor patterns SCP of some transistors from among the transistors T may be made of poly-silicon or amorphous silicon, and the semiconductor patterns SCP of the other transistors from among the transistors T may be made of an oxide semiconductor.

The gate insulating layer GI may be disposed over the semiconductor pattern SCP. For example, the gate insulating layer GI may be disposed between the semiconductor pattern SCP and the gate electrode GE. The gate insulating layer GI may be configured as a single layer or a multi-layer, and may include at least one inorganic insulating material and/or at least one organic insulating material. For example, the gate insulating layer GI may include various organic/inorganic insulating materials including silicon nitride (SiNx), silicon oxide (SiOx), etc.

The gate electrode GE may be disposed on the gate insulating layer GI. For example, the gate electrode GE may be disposed to overlap with the semiconductor pattern SCP with the gate insulating layer GI interposed therebetween. The transistor T having a top-gate structure according to one or more example embodiments is illustrated in FIGS. 9A-9C. In another embodiment, the transistor T may have a bottom-gate structure. The gate electrode GE may be disposed to overlap with the semiconductor pattern SCP on the bottom of the semiconductor pattern SCP.

The first interlayer insulating layer ILD1 may be disposed over the gate electrode GE. For example, the first interlayer insulating layer ILD1 may be disposed between the gate electrode GE and the first and second transistor electrodes TE1 and TE2. The first interlayer insulating layer ILD1 may be configured as a single layer or a multi-layer, and may include at least one inorganic insulating material and/or at least one organic insulating material. For example, the first interlayer insulating layer ILD1 may include various organic/inorganic insulating materials including silicon nitride (SiNx), silicon oxide (SiOx), etc. However, the material constituting the first interlayer insulating layer ILD1 is not particularly limited.

The first and second transistor electrodes TE1 and TE2 may be disposed on each semiconductor pattern SCP with at least one first interlayer insulating layer ILD1 interposed therebetween. For example, the first and second transistor electrodes TE1 and TE2 may be disposed on different end portions of the semiconductor pattern SCP with the gate insulating layer GI and the first interlayer insulating layer ILD1 interposed therebetween. The first and second transistor electrodes TE1 and TE2 may be electrically connected to each semiconductor pattern SCP. For example, the first and second transistor electrodes TE1 and TE2 may be respectively connected to the first and second regions of the semiconductor pattern SCP through contact holes penetrating the gate insulating layer GI and the first interlayer insulating layer ILD1. In some embodiments, any one of the first and second transistor electrodes TE1 and TE2 may be a source electrode, and the other one of the first and second transistor electrodes TE1 and TE2 may be a drain electrode.

At least one transistor T provided in the pixel circuit PXC may be connected to at least one pixel electrode. For example, the first transistor T1 shown in FIGS. 6A-6C or the sixth and seventh transistors T6 and T7 shown in FIG. 6D may be electrically connected to a first electrode ELT1 of a corresponding pixel PXL through a contact hole (e.g., a first contact hole CH1 and/or a bridge pattern BRP) penetrating the passivation layer PSV.

The storage capacitor Cst includes a first capacitor electrode CE1 and a second capacitor electrode CE2, which overlap with each other. Each of the first and second capacitor electrodes CE1 and CE2 may be configured as a single layer or a multi-layer. Also, at least one of the first and second capacitor electrodes CE1 and CE2 may be disposed in or at the same layer as the at least one electrode or the semiconductor pattern SCP, which constitutes the first transistor T1.

For example, the first capacitor electrode CE1 may be configured as a multi-layered electrode including a lower electrode LE disposed in or at the same layer as the semiconductor pattern SCP of the first transistor T1, and an upper electrode UE which is disposed in or at the same layer as the first and second transistor electrodes TE1 and TE2 of the first transistor T1 and is electrically connected to the lower electrode LE. In addition, the second capacitor electrode CE2 may be configured as a single-layered electrode which is disposed in or at the same layer as the gate electrode GE of the first transistor T1 and is disposed between the lower electrode LE and the upper electrode UE of the first capacitor electrode CE1.

However, the structure and/or position of each of the first and second capacitor electrodes CE1 and CE2 may be variously modified. For example, in another embodiment, any one of the first and second capacitor electrodes CE1 and CE2 may include a conductive pattern disposed in or at a layer different from that of the electrodes (e.g., the gate electrode and the first and second transistor electrodes TE1 and TE2) and the semiconductor pattern SCP, which constitute the first transistor T1. For example, the first capacitor electrode CE1 or the second capacitor electrode CE2 may have a single- or multi-layered structure including a conductive pattern disposed on the top of the second interlayer insulating layer ILD2.

In some embodiments, at least one signal line and/or at least one power line, connected to each pixel PXL, may be disposed in or at the same layer as one electrode of the circuit elements constituting the pixel circuit PXC. For example, the scan line Si of each pixel PXL may be disposed in or at the same layer as the gate electrodes GE of the transistors T, and the data line Dj of each pixel PXL may be disposed in or at the same layer as the first and second transistor electrodes TE1 and TE2 of the transistors T.

The first power line PL1 and/or the second power line PL2 may be disposed in or at the same layer as the gate electrodes GE or the first and second transistor electrodes TE1 and TE2 of the transistors T, or be disposed in or at a layer different from that of the gate electrodes GE or the first and second transistor electrodes TE1 and TE2 of the transistors T. For example, the second power line PL2 for supplying the second power source VSS may be disposed on the second interlayer insulating layer ILD2, to be at least partially covered by the passivation layer PSV. The second power line PL2 may be electrically connected to a second electrode ELT2 of a light source unit LSU disposed on the top of the passivation layer PSV through a second contact hole CH2 penetrating the passivation layer PSV. However, the position and/or structure of the first power line PL1 and/or the second power line PL2 may be variously modified. For example, in another embodiment, the second power line PL2 may be disposed in or at the same layer as the gate electrodes GE or the first and second transistor electrodes TE1 and TE2 of the transistors T, to be electrically connected to the second electrode ELT2 through at least one bridge pattern (not shown) and/or the second contact hole CH2.

The second interlayer insulating layer ILD2 may be disposed on the top of the first interlayer insulating layer ILD1, and cover the first and second transistor electrodes TE1 and TE2 and/or the storage capacitor Cst, which are located on the first interlayer insulating layer ILD1. The second interlayer insulating layer ILD2 may be configured as a single layer or a multi-layer, and may include at least one inorganic material and/or at least one organic material. For example, the second interlayer insulating layer ILD2 may include various organic/inorganic insulating materials including silicon nitride (SiNx), silicon oxide (SiOx), etc., but the material constituting the second interlayer insulating layer ILD2 is not particularly limited. The bridge pattern BRP for connecting at least one circuit element (e.g., the first transistor T1) provided in the pixel circuit PXC, the first power line PL1, and/or the second power line PL2 may be disposed on the second interlayer insulating layer ILD2.

However, in some embodiments, the second interlayer insulating layer ILD2 may be omitted. The bridge pattern BRP shown in FIG. 9C, etc. may be omitted, and the second power line PL2 may be disposed in or at a layer in which one electrode of the transistor T is disposed.

The passivation layer PSV may be disposed over the circuit elements including the transistors T and the storage capacitor Cst and/or the lines including the first and second power lines PL1 and PL2. The passivation layer PSV may be configured as a single layer or a multi-layer, and may include at least one inorganic insulating material and/or at least one organic insulating material. For example, the passivation layer PSV may include at least one organic insulating layer, and substantially planarize a surface of the circuit layer PCL. The display layer DPL may be disposed on the top of the passivation layer PSV.

The display layer DPL may include a light source unit LSU of each pixel PXL. The display layer DPL may include at least one pair of first and second electrodes ELT1 and ELT2 disposed in an emission area EMA of each pixel PXL to constitute each light emitting unit LSU, and at least one light emitting element LD connected between the first electrode ELT1 and the second electrode ELT2.

Although one light emitting element LD is illustrated in each of FIGS. 9A-9C, each pixel PXL may include a plurality of light emitting elements LD connected in a forward direction between the first and second electrodes ELT1 and ELT2, like the embodiments shown in FIGS. 6A-8B. Therefore, in descriptions of the embodiments shown in FIGS. 9A-9C and other embodiments which will be described later, each embodiment will be described by assuming that the pixel PXL includes a plurality of light emitting elements LD. However, in some embodiments, the pixel PXL may include only a single light emitting element LD.

Also, the display layer DPL may further include first and second contact electrodes CNE1 and CNE2 for more stably connecting the light emitting elements LD between the first and second electrodes ELT1 and ELT2, a first bank BNK1 for allowing one area of each of the first and second electrodes ELT1 and ELT2 and/or the first and second contact electrodes CNE1 and CNE2 to protrude in an upper direction, and a second bank BNK2 surrounding each emission area EMA. In addition, the display layer DPL may further include at least one conductive layer and/or at least one insulating layer.

For example, the display layer DPL may include the first bank BNK1, the first and second electrodes ELT1 and ELT2, a first insulating layer INS1, the light emitting elements LD, a second insulating layer INS2, the first and second contact electrodes CNE1 and CNE2, a fourth insulating layer INS4, and an overcoat layer OC, which are sequentially disposed and/or formed on the top of the circuit layer PCL. In some embodiments, the first and second contact electrodes CNE1 and CNE2 may be disposed in or at different layers to be separated from each other. The display layer DPL may further include a third insulating layer INS3 interposed between the first and second contact electrodes CNE1 and CNE2 (see, for example, FIG. 9E).

In some embodiments, the position of the second bank BNK2 on a section may be variously changed. In some embodiments, the second bank BNK2 may be formed on the first insulating layer INS1, but the present disclosure is not limited thereto. For example, in another embodiment, the second bank BNK2 may be disposed in or at the same layer as the first bank BNK1. Also, the second bank BNK2 may overlap with the first bank BNK1 or may not overlap with the first bank BNK1.

The first bank BNK1 may be disposed on the one surface of the base layer BSL, on which the circuit layer PCL is selectively formed. The first bank BNK1 may be formed with separated patterns or an integrated pattern. The first bank BNK1 may protrude in a height direction (e.g., a third direction DR3) of the base layer BSL on the one surface of the base layer BSL, on which the circuit layer PCL is formed.

The first bank BNK1 may include first and second sidewalls SDW1 and SDW2 (also, referred to as "first and second inclined surfaces") facing both end portions of the light emitting elements LD. For example, the first bank BNK1 may include the first sidewall SDW1 located at a distance adjacent to first end portions EP1 of the light emitting elements LD to face the first end portions EP1, and the second sidewall SDW2 located at a distance adjacent to second end portions EP2 of the light emitting elements LD to face the second end portions EP2.

In some embodiments, the first bank BNK1 may have various shapes. In some embodiments, the first bank BNK1 may be a bank structure having a regular tapered structure. For example, as shown in FIGS. 9A-9C, the first bank BNK1 may be formed to have an inclined surface inclined at a constant angle (or a substantially constant angle) θ respect to the base layer BSL. For example, the first bank BNK1 may have an inclined surface inclined at an angle (e.g., a predetermined angle) θ in a range of about 20 degrees to 80 degrees (e.g., about 40 degrees to 45 degrees) with respect to the base layer BSL. The first and second side walls SDW1 and SDW2 may have an inclination of a certain angle θ.

However, the present disclosure is not limited thereto. For example, in another embodiment, the first bank BNK1 may have the first and second sidewalls SDW1 and SDW2 having a curved shape, a stepped shape, etc. For example, the first bank BNK1 may have a section having a semicircular shape, a semi-elliptical shape, etc.

The electrodes and the insulating layers, which are disposed on the top of the first bank BNK1, may have a shape corresponding to the first bank BNK1. For example, the first electrode ELT1 and the first contact electrode CNE1 may be disposed on the top of one area of the first bank BNK1, which includes the first sidewall SDW1 of the first bank BNK1 (e.g., a first sidewall SDW1 of a (1-1)th bank BNK1-1), and include an inclined surface or a curved surface, which has a shape corresponding to that of the first sidewall SDW1. The second electrode ELT2 and the second contact electrode CNE2 may be disposed on the top of another area of the first bank BNK1, which includes the second sidewall SDW2 of the first bank BNK1 (e.g., a second sidewall SDW2 of a (1-2)th bank BNK1-2), and include an inclined surface or a curved surface, which has a shape corresponding to that of the second sidewall SDW2. Similarly, the first insulating layer INS1, the third insulating layer INS3, and/or the fourth insulating layer INS4 may be disposed over the first sidewall SDW1 and/or the second sidewall SDW2 of the first bank BNK1, and include an inclined surface or a curved surface, which has a shape corresponding to that of the first sidewall SDW1 and/or the second sidewall SDW2.

The first bank BNK1 may include an insulating material including at least one inorganic material and/or at least one organic material. For example, the first bank BNK1 may include at least one inorganic layer including various inorganic insulating materials including silicon nitride (SiNx), silicon oxide (SiOx), etc. Alternatively, the first bank BNK1 may include at least one organic layer and/or at least one photoresist layer, including various organic insulating materials, or may be configured as a single- or multi-layered insulator complexly including organic/inorganic materials. The material and/or pattern shape of the first bank BNK1 may be variously modified.

In some embodiments, the first bank BNK1 may serve as a reflective member. For example, the first bank BNK1 along with the first and second electrodes ELT1 and ELT2 provided on the top thereof may serve as a reflective member for improving the light efficiency of the pixel PXL by guiding light emitting from each light emitting element LD in a desired direction (e.g., an upper direction of the pixel PXL, which includes the third direction DR3).

The first and second electrodes ELT1 and ELT2 constituting pixel electrodes of each pixel PXL may be disposed on the top of the first bank BNK1. In some embodiments, the first and second electrodes ELT1 and ELT2 may have a shape corresponding to the first bank BNK1. For example, the first and second electrodes ELT1 and ELT2 may protrude in the height direction of the base layer BSL while having each inclined surface or each curved surface, which corresponds to the first bank BNK1.

Each of the first and second electrodes ELT1 and ELT2 may include at least one conductive material. For example, each of the first and second electrodes ELT1 and ELT2 may include at least one metal or any alloy including the same from among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the present disclosure is not limited thereto. For example, each of the first and second electrodes ELT1 and ELT2 may include other conductive materials including carbon nano tubes, graphene, etc. For example, each of the first and second electrodes ELT1 and ELT2 may include at least one of various conductive materials, to have conductivity, and the material constituting each of the first and second electrodes ELT1 and ELT2 is not particularly limited. Also, the first and second electrodes ELT1 and ELT2 may include the same conductive material or include different conductive materials.

Also, each of the first and second electrodes ELT1 and ELT2 may be configured as a single layer or a multi-layer. For example, each of the first and second electrodes ELT1 and ELT2 may include a reflective electrode layer including a reflective conductive material. Also, each of the first and second electrodes ELT1 and ELT2 may selectively further include at least one of at least one transparent electrode layer disposed on the top and/or the bottom of the reflective electrode layer and at least one conductive capping layer covering the top of the reflective electrode layer and/or the transparent electrode layer.

In some embodiments, the reflective electrode layer may be made of a conductive material having uniform reflexibility. For example, the reflective electrode layer may be made of at least one metal or any alloy including the same from among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, but the present disclosure is not limited thereto. For example, the reflective electrode layer included in each of the first and second electrodes ELT1 and ELT2 may be made of various reflective conductive materials.

When each of the first and second electrodes ELT1 and ELT2 includes a reflective electrode layer, the ratio of lights advancing in a direction in which an image is displayed (e.g., the front direction of the display panel PNL) from among lights emitted from both ends, i.e., the first and second end portions EP1 and EP2 of each light emitting element LD, may be increased. For example, when the first and second electrodes ELT1 and ELT2 are disposed to face the first and second end portions EP1 and EP2 of the light emitting elements LD while having an inclined surface or a curved surface, which corresponds to the first and second sidewalls SDW1 and SDW2 of the first bank BNK1, lights emitted from the first and second end portions EP1 and EP2 of each light emitting element LD may be reflected by adjacent first and second electrodes ELT1 and ELT2 to further advance in the front direction of the display panel PNL (e.g., a direction in a predetermined viewing angle range, including the third direction DR3). Accordingly, lights generated in the light emitting elements LD can be more efficiently used.

In addition, the transparent electrode layer may be made of various transparent conductive materials. For example, the transparent electrode layer may include at least one of ITO, IZO, ITZO, ZnO, AZO, GZO, ZTO, and FTO, but the present disclosure is not limited thereto. In some embodiments, each of the first and second electrodes ELT1 and ELT2 may be configured as a triple-layer having a stacked structure of ITO/Ag/ITO. When each of the first and second electrodes ELT1 and ELT2 is configured as a multi-layer, a voltage drop caused by signal delay (RC delay) may be reduced or minimized. Accordingly, a desired voltage can be effectively transferred to the light emitting elements LD.

Additionally, each of the first and second electrodes ELT1 and ELT2 may include a conductive capping layer covering the reflective electrode layer and/or the transparent electrode layer. Thus, the reflective electrode layer, etc. of each of the first and second electrode layers ELT1 and ELT2 can be prevented from being damaged due to a failure occurring in a manufacturing process of the pixel PXL, etc. However, the conductive capping layer may be selectively included in each of the first and second electrode layers ELT1 and ELT2. In some embodiments, the conductive capping layer may be omitted. Also, the conductive capping layer may be considered as a component of each of the first and second electrode layers ELT1 and ELT2, or may be considered as a separate component disposed on the first and second electrode layers ELT1 and ELT2.

The first insulating layer INS1 may be disposed over one areas of the first and second electrodes ELT1 and ELT2. For example, the first insulating layer INS1 may be formed to cover one area of each of the first and second electrodes ELT1 and ELT2, and include an opening exposing another area of each of the first and second electrodes ELT1 and ELT2. For example, the first insulating layer INS1 may include an opening formed on an upper surface of the first bank BNK1 to expose a portion of the first electrode ELTI and another opening formed on an upper surface of the first bank BNK1 to expose a portion of the second electrode ELT2. The first and second electrodes ELT1 and ELT2 may be electrically connected respectively to the first and second contact electrodes CNE1 and CNE2 in an area in which the first insulating layer INS1 is opened. In some embodiments, the first insulating layer INS1 may be omitted. The light emitting elements LD may be directly disposed on the passivation layer PSV and/or one end of each of the first and second electrodes ELT1 and ELT2.

In some embodiments, the first insulating layer INS1 may be primarily formed to entirely cover the first and second electrodes ELT1 and ELT2. After light emitting elements LD are supplied and aligned on the first insulating layer INS1, the first insulating layer INS1 may be partially opened to expose one areas of the first and second electrodes ELT1 and ELT2. For example, the first insulating layer INS1 may have an opening exposing one area of each of the first and second electrodes ELT1 and ELT2 on the upper surface of the first bank BNK1, and at least partially cover inclined surfaces or curved surfaces of the first and second electrodes ELT1 and ELT2. In another embodiment, the first insulating layer INS1 may be patterned in the form of a separate pattern locally disposed only on the bottom of light emitting elements LD, after the light emitting elements LD are completely supplied and aligned.

The first insulating layer INS1 may be formed to cover the first and second electrodes ELT1 and ELT2 after the first and second electrodes ELT1 and ELT2 are formed. Accordingly, the first and second electrodes ELT1 and ELT2 can be prevented from being damaged in a subsequent process.

The first insulating layer INS1 may be configured as a single layer or a multi-layer, and include at least one inorganic insulating material and/or at least one organic insulating material. For example, the first insulating layer INS1 may include various organic/inorganic insulating materials including silicon nitride (SiNx), silicon oxide (SiOx), aluminum oxide ($Al_2O_3$), etc.

Light emitting elements LD may be supplied and aligned in an emission area EMA in which the first insulating layer INS1 and the like are formed. Meanwhile, before the light emitting elements LD are supplied, the second bank BNK2 may be formed at the periphery of the emission area EMA. For example, the second bank BNK2 may be formed in the display area DA to surround each emission area EMA.

The light emitting elements LD may be supplied to each pixel area PXA in which the first bank BNK1, the first and second electrodes ELT1 and ELT2, the first insulating layer INS1, the second bank BNK2, and the like are formed, to be aligned between the first and second electrodes ELT1 and ELT2. For example, a plurality of light emitting elements LD may be supplied to the emission area EMA of each pixel through an inkjet process, a slit coating process, or other various processes. The light emitting elements LD may be aligned with directionality between the first and second electrodes ELT1 and ELT2 by an alignment signal (e.g., a predetermined alignment signal or alignment voltage) applied to each of the first and second electrodes ELT1 and ELT2.

In some embodiments, at least some of the light emitting elements LD may be disposed in a horizontal direction, an oblique direction, or the like between a pair of adjacent first and second electrodes ELT1 and ELT2 such that both end portions (i.e., first and second end portions EP1 and EP2) in a length direction thereof overlap with the pair of first and second electrodes ELT1 and ELT2. In another embodiment, at least some of the light emitting elements LD may be disposed between a pair of adjacent first and second electrodes ELT1 and ELT2 not to overlap with the first electrode ELT1 and/or the second electrode ELT2, and each of the light emitting elements LD may be electrically connected to the pair of first and second electrodes ELT1 and ELT2 through the first and second contact electrodes CNE1 and CNE2. In some embodiments, the light emitting elements LD may overlap with the first electrode ELT1 and/or the second electrode ELT2 or may not overlap with the first electrode ELT1 and/or the second electrode ELT2. The light emitting elements LD may be electrically connected between the first and second electrodes ELT1 and ELT2 by the first and second contact electrodes CNE1 and CNE2.

The second insulating layer INS2 may be disposed on one areas of the light emitting elements LD. For example, the second insulating layer INS2 may be disposed one area of each of the light emitting elements LD to expose the first and second end portions EP1 and EP2 of each of the light emitting elements LD. For example, the second insulating layer INS2 may be locally disposed only on the top of one area including a central area of each of the light emitting elements LD.

The second insulating layer INS2 may be formed as an independent pattern in the emission area EMA of each pixel PXL, but the present disclosure is not limited thereto. In some embodiments, the second insulating layer INS2 may be omitted, and one end of each of the first and second contact electrodes CNE1 and CNE2 may be directly located on an upper surface of each of the light emitting elements LD.

The second insulating layer INS2 may be configured as a single layer or a multi-layer, and include at least one inorganic insulating material and/or at least one organic insulating layer. For example, the second insulating layer INS2 may include various organic/inorganic insulating materials including silicon nitride (SiNx), silicon oxide (SiOx), aluminum oxide ($Al_2O_3$), a photoresist (PR) material, etc.

When the second insulating layer INS2 is formed on light emitting elements LD after the light emitting elements LD are completely aligned, the light emitting elements LD can be prevented from being separated from positions at which the light emitting elements LD are aligned. In some embodiments, when a separation space exists between the first insulating layer INS1 and the light emitting elements LD due to a step difference formed by the first and second electrodes ELT1 and ELT2, the separation space may be filled with an insulating material introduced in a process of forming the second insulating layer INS2. Accordingly, the light emitting elements LD can be more stably supported. However, in some embodiments, the separation space may not be completely filled. For example, the second insulating layer INS2 may be formed only at an upper portion of each of the light emitting elements LD, or may be formed at both upper and lower portion of each of the light emitting elements LD.

Both end portions, i.e., the first and second end portions EP1 and EP2 which are not covered by the second insulating layer INS2 may be respectively covered by the first and second contact electrodes CNE1 and CNE2. The first and second contact electrodes CNE1 and CNE2 are formed to be spaced from each other. For example, adjacent first and second contact electrodes CNE1 and CNE2 may be disposed on the first and second end portions EP1 and EP2 of at least one adjacent light emitting element LD to be spaced from each other with second insulating layer INS2 interposed therebetween.

In addition, the first and second contact electrodes CNE1 and CNE2 may be disposed on the top of the first and second electrodes ELT1 and ELT2 to cover an exposed area of each of the first and second electrodes ELT1 and ELT2. For example, the first and second contact electrodes CNE1 and CNE2 may be disposed on at least one area of each of the first and second electrodes ELT1 and ELT2 to be in direct/indirect contact with each of the first and second electrodes ELT1 and ELT2 at an upper portion of the first bank BNK1 or at the periphery of the first bank BNK1.

Accordingly, the first and second contact electrodes CNE1 and CNE2 may be electrically connected respectively to the first and second electrodes ELT1 and ELT2. In addition, each of the first and second electrodes ELT1 and ELT2 may be electrically connected to the first or second end portion EP1 or EP2 of at least one light emitting element LD through the first and second contact electrodes CNE1 and CNE2.

In some embodiments, the first and second contact electrodes CNE1 and CNE2 may be sequentially formed in different layers on the one surface of the base layer BSL as shown in FIG. 9A. The third insulating layer INS3 may be additionally disposed between the first contact electrode CNE1 and the second contact electrode CNE2 (e.g., see FIG. 9E).

The third insulating layer INS3 may be disposed over the second contact electrode CNE2 to cover the second contact electrode CNE2. For example, the third insulating layer INS3 may be disposed over the second insulating layer INS2 and the second contact electrode CNE2 such that one end portion of the third insulating layer INS3 is interposed between the first contact electrode CNE1 and the second contact electrode CNE2. One end portion of the first contact electrode CNE1 may be disposed on the one end portion of the third insulating layer INS3.

Figure 9E:
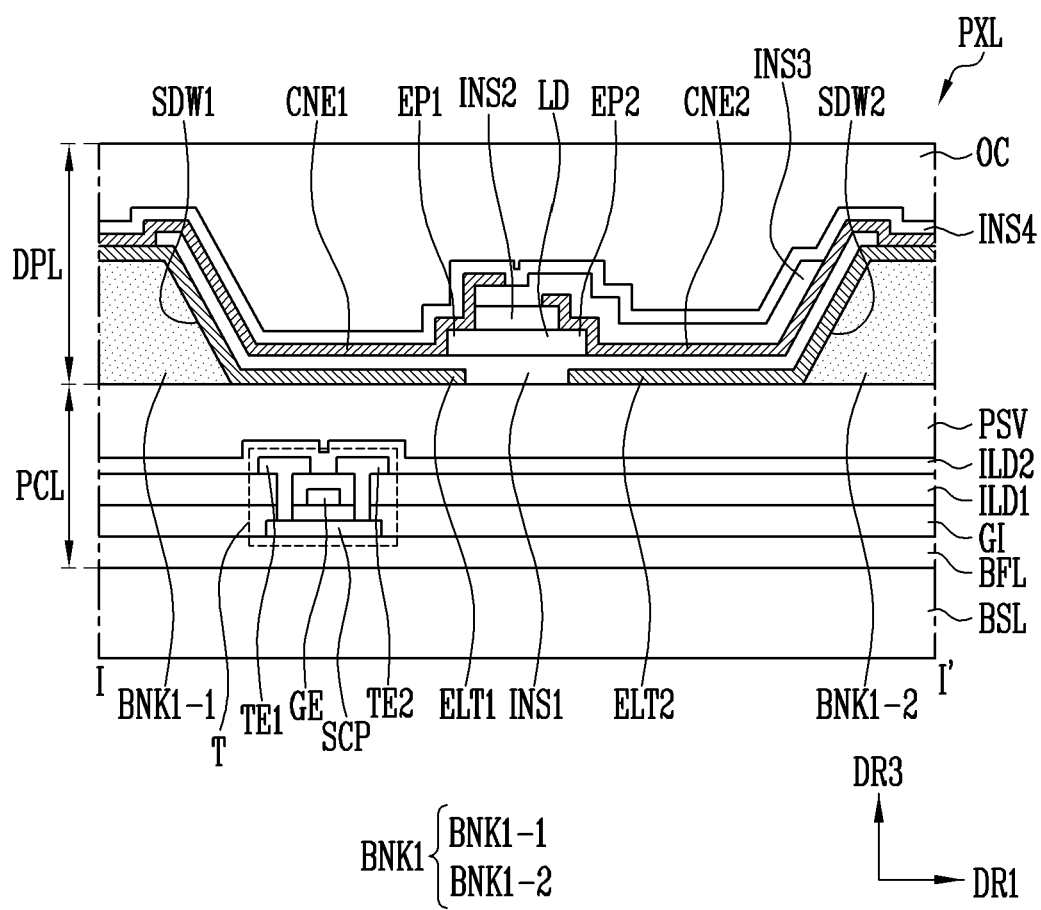
FIG. 9E is a sectional view illustrating a pixel in accordance with an one or more example embodiments of the present disclosure.

As described herein, in one or more embodiments, the second contact electrode CNE2 may be first formed before the first contact electrode CNE1 is formed, and the first contact electrode CNE1 may be formed on the one end portion of the third insulating layer INS3 after the third insulating layer INS3 is formed to cover the second contact electrode CNE2 and the second insulating layer INS2 (e.g., see FIG. 9E). In some embodiments, an order in which the first and second contact electrodes CNE1 and CNE2 are formed may be changed. For example, in another embodiment, the first contact electrode CNE1 may be first formed before the second contact electrode CNE2 is formed, and the second contact electrode CNE2 may be formed on the one end portion of the third insulating layer INS3 after the third insulating layer INS3 is formed to cover the first contact electrode CNE1 and the second insulating layer INS2.

When the second and third insulating layers INS2 and INS3 are formed on the top of the light emitting elements LD, the electrical stability between the first and second end portions EP1 and EP2 of the light emitting elements LD can be ensured. For example, the first and second contact electrodes CNE1 and CNE2 can be stably separated from each other by the second and third insulating layers INS2 and INS3. Accordingly, a short-circuit defect can be effectively prevented from occurring between the first and second end portions EP1 and EP2 of the light emitting elements LD.

The third insulating layer INS3 may be configured as a single layer or a multi-layer, and include at least one inorganic insulating material and/or at least one organic insulating material. For example, the third insulating layer INS3 may include various organic/inorganic insulating materials including silicon nitride (SiNx), silicon oxide (SiOx), aluminum oxide ($Al_2O_3$), a photoresist (PR) material, etc.

In some embodiments, the first and second contact electrodes CNE1 and CNE2 may be formed in the same layer. For example, as shown in FIGS. 9B and 9C, the first and second contact electrodes CNE1 and CNE2 may be formed in the same layer on the one surface of the base layer BSL. The first and second contact electrodes CNE1 and CNE2 may be concurrently formed (or simultaneously formed) in the same process, or be sequentially formed. In some embodiments, the third insulating layers INS3 may be omitted. A manufacturing process of the pixel PXL and the display device including the same can be simplified.

The first and second contact electrodes CNE1 and CNE2 may be made of various transparent conductive materials. For example, the first and second contact electrodes CNE1 and CNE2 may include at least one of various transparent conductive materials including ITO, IZO, ITZO, ZnO, AZO, GZO, ZTO, and FTO, and may be implemented substantially transparently or translucently to satisfy a suitable transmittance (e.g., a predetermined transmittance). Accordingly, lights emitted from the light emitting elements LD through the first and second end portions EP1 and EP2 can be emitted to the outside of the display panel PNL while being transmitted through the first and second contact electrodes CNE1 and CNE2.

The fourth insulating layer INS4 may be disposed on the first and second contact electrodes CNE1 and CNE2 and/or the third insulating layer INS3. For example, the fourth insulating layer INS4 may be entirely formed and/or disposed on the display area DA to cover the first and second banks BNK1 and BNK2, the first and second electrodes ELT1 and ELT2, the first insulating layer INS1, the second insulating layer INS2, and/or the third insulating layer INS3, the light emitting elements LD, and the first and second contact electrodes CNE1 and CNE2. The fourth insulating layer INS4 may include at least one inorganic layer and/or at least one organic insulating layer.

The fourth insulating layer INS4 may be configured as a single layer or a multi-layer, and include at least one inorganic insulating material and/or at least one organic insulating material. For example, the fourth insulating layer INS4 may include various organic/inorganic insulating materials including silicon nitride (SiNx), silicon oxide (SiOx), aluminum oxide ($Al_2O_3$), etc.

In some embodiments, the fourth insulating layer INS4 may include a thin film encapsulation layer having a multi-layered structure. For example, the fourth insulating layer INS4 may be configured as a thin film encapsulation layer having a multi-layered structure including at least two inorganic insulating layers and at least one organic insulating layer interposed between the at least two inorganic insulating layers. However, the material and/or structure of the fourth insulating layer INS4 may be variously modified. In some embodiments, at least one overcoat layer OC and/or an upper substrate may be further disposed on the top of the fourth insulating layer INS4.

The overcoat layer OC may include epoxy or siloxane-based filler, but the present disclosure is not limited thereto. For example, the overcoat layer OC may be a filler layer including at least one kind of filler.

The overcoat layer OC may include a material having a relatively small refractive index such that lights emitted from the light emitting elements LD can be smoothly emitted in the front direction of the display panel PNL, which includes the third direction DR3. For example, the overcoat layer OC may have a refractive index (e.g., about 1.5 to 1.6) smaller than those of the first and second electrodes ELT1 and ELT2 and the first and second contact electrodes CNE1 and CNE2.

Similarly, the first and fourth insulating layers INS1 and INS4 may be made of a material having a relatively small refractive index, so that lights emitted from the light emitting elements LD can be more smoothly emitted in the front direction of the display panel PNL. For example, each of the first and fourth insulating layers INS1 and INS4 may include a low refractive material having a refractive index (e.g., about 1.4 to 1.6) similar or equal to that of the overcoat layer OC. For example, each of the first and fourth insulating layers INS1 and INS4 may include silicon oxide (SiOx) having a refractive index of 1.52.

For example, lights emitted from the light emitting elements LD are controlled to further advance in the front direction of the display panel PNL through refractive index matching of at least some insulating layers and/or the overcoat layer OC, so that the light efficiency of the pixel PXL can be improved.

The second insulating layer INS2 and/or the third insulating layer INS3 may include a low refractive material, e.g., silicon oxide (SiOx) having a refractive index similar or equal to that of the first and fourth insulating layers INS1 and INS4, but the present disclosure is not limited thereto. For example, in some embodiments, the second and third insulating layers INS2 and INS3 may be formed with a suitable thickness (e.g., a predetermined thickness) or more to ensure the electrical stability between the first and second end portions EP1 and EP2 of the light emitting elements LD, and may be concurrently etched (or simultaneously etched) to simplify a process. For example, the second insulating layer INS2 may be primarily etched to expose second end portions of light emitting elements LD, after the second insulating layer INS2 is entirely formed in the display area DA in which the light emitting elements LD are arranged. Subsequently, the second insulating layer INS2 may be etched once more after the third insulating layer INS3 is primarily formed. For example, after the third insulating layer INS3 is entirely formed to cover the second contact electrode CNE2, etc., the second and third insulating layers INS2 and INS3 may be concurrently etched (e.g., simultaneously etched) such that first and second end portions EP1 and EP2 of the light emitting elements LD are exposed.

In order to prevent damage of the light emitting elements LD located on the bottom of the second and third insulating layers INS2 and INS3 while concurrently etching (or simultaneously etching) smoothly the second and third insulating layers INS2 and INS3, the second and third insulating layers INS2 and INS3 may be formed of a material having an excellent etching rate. For example, the second and third insulating layers INS2 and INS3 may be formed of the same material. For example, the second and third insulating layers INS2 and INS3 may include silicon nitride (SiNx) having an excellent etching rate. However, the silicon nitride (SiNx) has a refractive index greater than that of silicon oxide (SiOx), etc. Accordingly, the second and third insulating layers INS2 and INS3 may include a high refractive material having a refractive index (e.g., about 1.9) greater than that of the first and fourth insulating layers INS1 and INS4.

In addition, the first and second contact electrodes CNE1 and CNE2 located on a path through which lights emitted from the light emitting elements LD can advance may include a transparent electrode material such as ITO. The first and second contact electrodes CNE1 and CNE2 may also have a refractive index greater than that of the first and fourth insulating layers INS1 and INS4.

The pixel in accordance with the above-described embodiments emits light with a desired luminance by using the light emitting elements LD as a light source. For example, a driving current corresponding to a grayscale to be expressed in the pixel PXL by using the pixel circuit PXC may be supplied to the light emitting elements LD. Lights may be generated in the light emitting elements LD by the driving current, and the generated lights may be emitted to the outside of the pixel PXL via at least one electrode, at least one insulating layer, and/or at least one overcoat layer OC, which are disposed in the display layer DPL. In FIG. 9A, dotted arrows represent that light generated from each light emitting element LD can be emitted in a plurality of directions which are not specified.

In some embodiments, some of lights generated in the light emitting elements LD may be emitted in the third direction DR3 and the like as upper directions, to be emitted in the front direction of the display panel PNL via the second insulating layer INS2, the third insulating layer INS3, and/or the fourth insulating layer INS4, the first or second contact electrode CNE1 or CNE2, and/or the overcoat layer OC. In addition, some the other lights generated in the light emitting elements LD may be first emitted in the first direction DR1, and the like from the light emitting elements LD, and then advance in the front direction of the display panel PNL.

For example, some of lights emitted from the first and second end portions EP1 and EP2 of the light emitting elements LD may first advance toward the first and second electrodes ELT1 and ELT2, and then may be reflected by the first and second electrodes ELT1 and ELT2 to advance in the front direction of the display panel PNL via the first insulating layer INS1, the first or second contact electrode CNE1 or CNE2, the third insulating layer INS3 and/or the fourth insulating layer INS4, and/or the overcoat layer OC.

Some of the other lights emitted from the first and second end portions EP1 and EP2 of the light emitting elements LD do not incident into the first and second electrodes ELT1 and ELT2 but may pass through high refractive layers such as the first or second contact electrodes CNE1 or CNE2 and/or the third insulating layer INS3 and then may be emitted in the front direction of the display panel PNL.

However, light loss of the pixel may occur in this process. For example, some of lights emitted from the light emitting elements LD may disappear due to light absorption caused by the first and second electrodes ELT1 and ELT2 and/or light waveguide in a non-front direction (e.g., the first or second direction DR1 or DR2) of the display panel PNL, which is caused by high refractive layers such as the first and second contact electrodes CNE1 and CNE2 and the third insulating layer INS3.

For example, as shown in FIG. 9D, some of lights incident into high refractive layers such as the first and second contact electrodes CNE1 and CNE2 and the third insulating layer INS3 may not be emitted to the outside of the pixel PXL while being surface-propagated through total reflection at the inside of the high refractive layers. For example, as indicated by dotted arrows shown in FIG. 9D, some of lights incident into the high refractive layers may not be emitted to an upper portion of the pixel PXL while being surface-propagated without escaping from the high refractive layers even on the upper surface of the first bank BNK1. Therefore, the light efficiency of the pixel PXL may be reduced.

Accordingly, hereinafter, various embodiments will be disclosed, in which loss of lights emitted from the light emitting elements LD is reduced or prevented, so that the light efficiency of the pixel PXL can be improved.

FIG. 9E is a sectional view illustrating a pixel PXL in accordance with one or more example embodiments of the present disclosure. For example, FIG. 9E illustrates an embodiment of a section of the pixel PXL taken along line I-I' shown in FIG. 8A, and the shape and/or position of the third insulating layer INS3 is changed as compared with the embodiment shown in FIG. 9A. In the embodiment shown in FIG. 9E, detailed descriptions of components similar or identical to those of the above-described embodiments (e.g., the embodiment shown in FIG. 9A) will be omitted.

Referring to FIG. 9E, the third insulating layer INS3 may be formed such that one end (e.g., one end located at one side of an area in which light emitting elements LD are disposed, e.g., one end at a right side) of the third insulating layer INS3 is ended on (or ends at) the second sidewall SDW2 of the first bank BNK1. For example, the one end of the third insulating layer INS3 may be ended at a highest height or less of the second sidewall SDW2 (or highest height or less of the first insulating layer INS1 and/or the second contact electrode CNE2 on the second sidewall SDW2) such that the third insulating layer INS3 is not continued to the upper surface of the first bank BNK1 via the second sidewall SDW2.

In some embodiments, an upper surface of the one end of the third insulating layer INS3 may be ended in a flat shape on the second sidewall SDW2. According to one or more example embodiments, when an upper surface is described as being flat with respect to a specific component located on the base layer BSL or a portion thereof is described as being flat, it may mean that the upper surface is substantially parallel to the base layer BSL (e.g., one surface of the base layer BSL, on which each pixel PXL is formed).

In the above-described embodiment, the third insulating layer INS3 is formed such that the upper surface of the one end of the third insulating layer INS3, which is located at the one side of the area in which the light emitting elements LD are disposed, faces in an upper direction of the pixel PXL. Accordingly, light waveguided in the third insulating layer INS3 may be emitted to an upper portion of the pixel PXL. For example, light which is incident into the third insulating layer INS3 made of a high refractive insulating material and advances in a side direction of the pixel PXL while being locked in an optical waveguide formed by the third insulating layer INS3 may be ended on the second sidewall SDW2 such that the third insulating layer INS3 faces the upper portion of the pixel PXL. Therefore, the light may be emitted in the upper direction of the pixel PXL. Accordingly, the light emitting efficiency of the pixels PXL may be improved, and the amount of light emitted in the front direction of the display panel PNL may be increased.

Figure 10A:
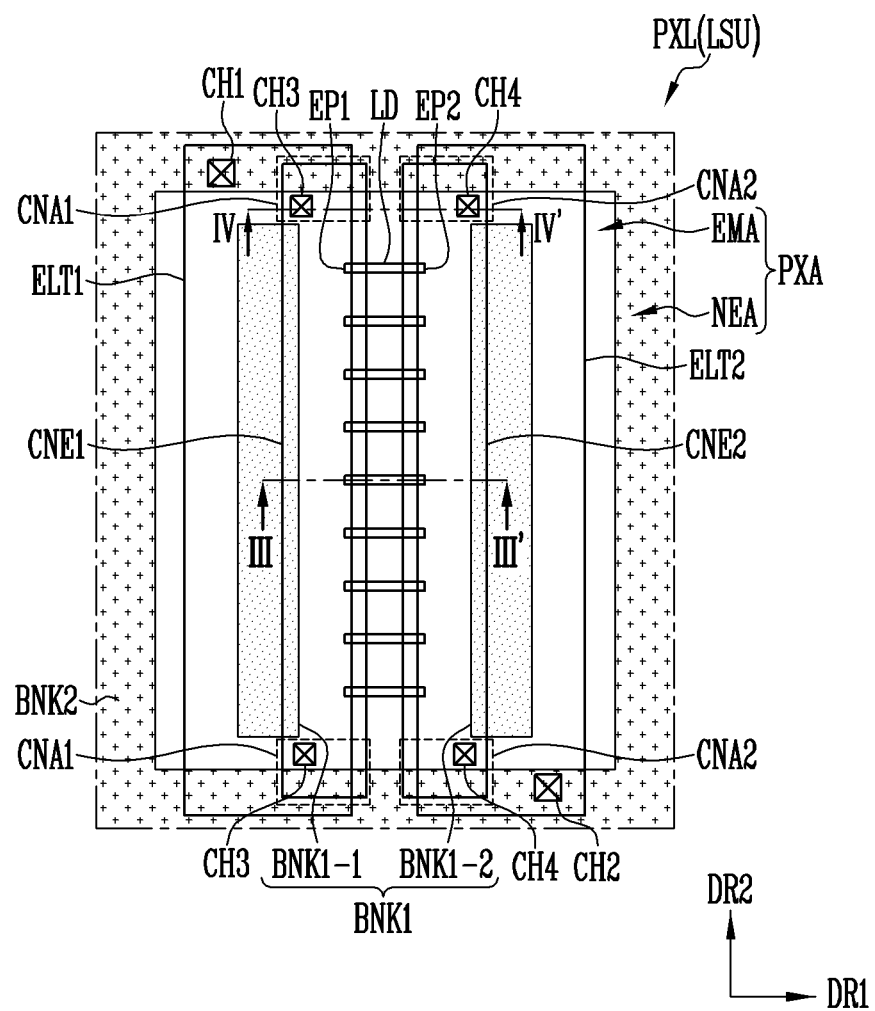
FIGS. 10A-10C are plan views each illustrating a pixel in accordance with one or more example embodiments of the present disclosure.
Figure 10B:
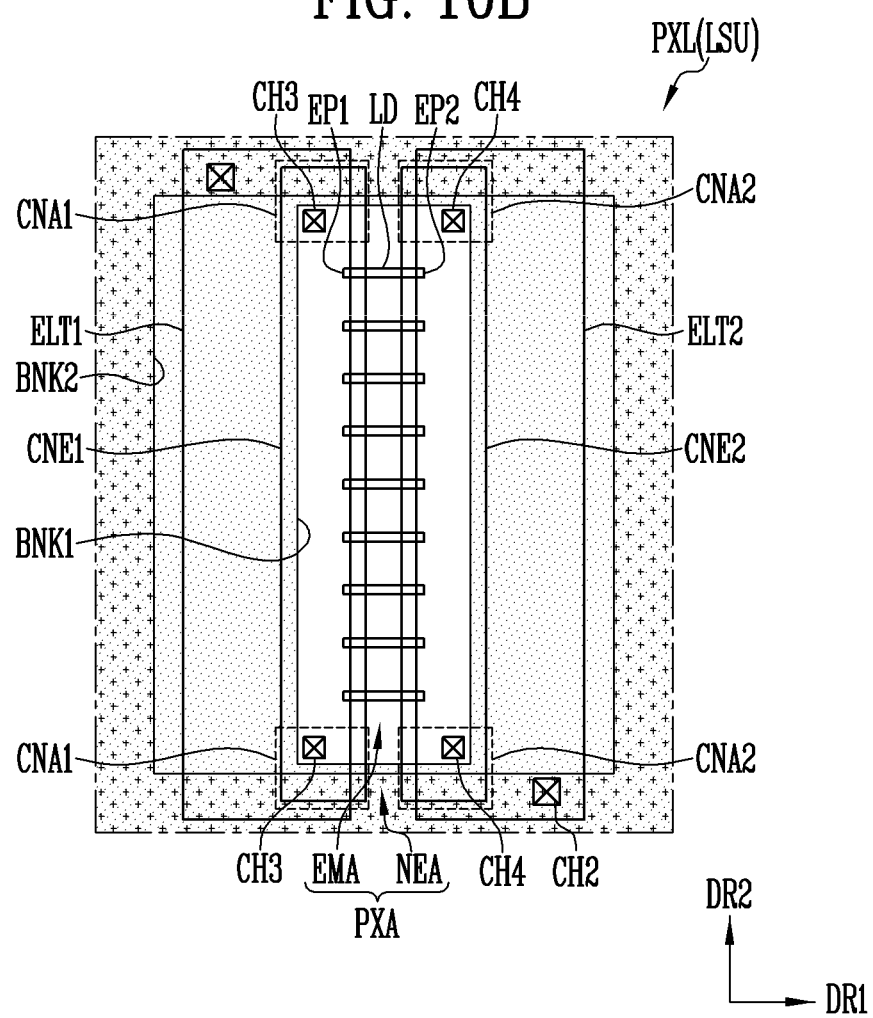
Figure 10C:
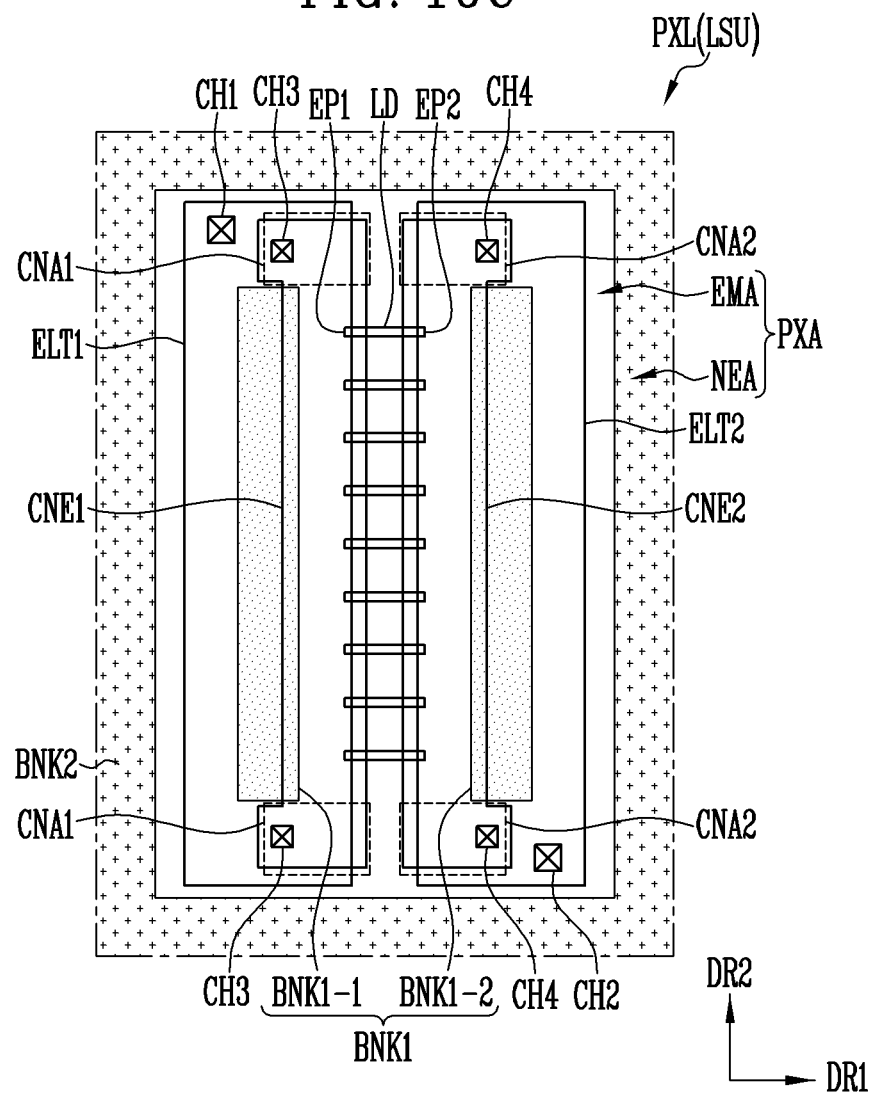

FIGS. 10A-10C are plan views each illustrating a pixel PXL in accordance with one or more example embodiments of the present disclosure. For example, FIGS. 10A and 10B illustrate modified embodiments of the pixel PXL in accordance with the embodiment shown in FIGS. 8A and 8B, and FIG. 10C illustrates a modified embodiment of the example embodiment shown in FIG. 10A.

Figure 11A:
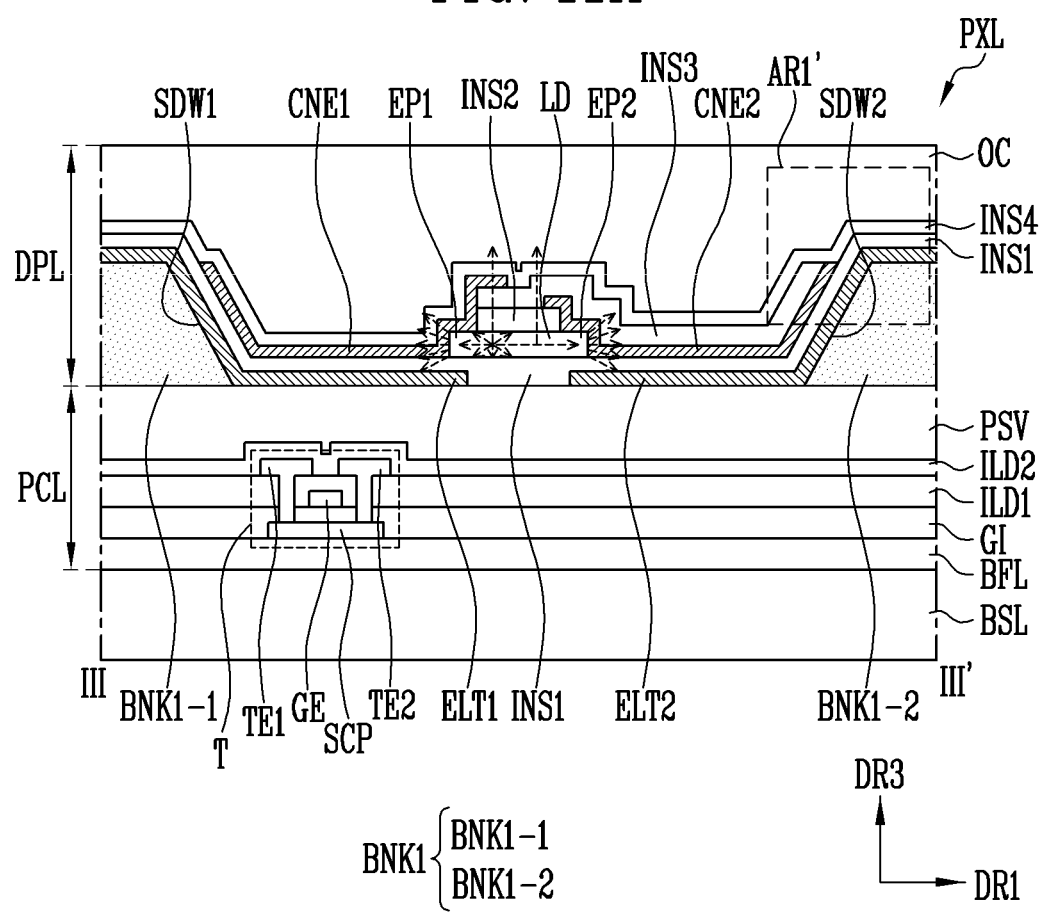
Figure 11B:
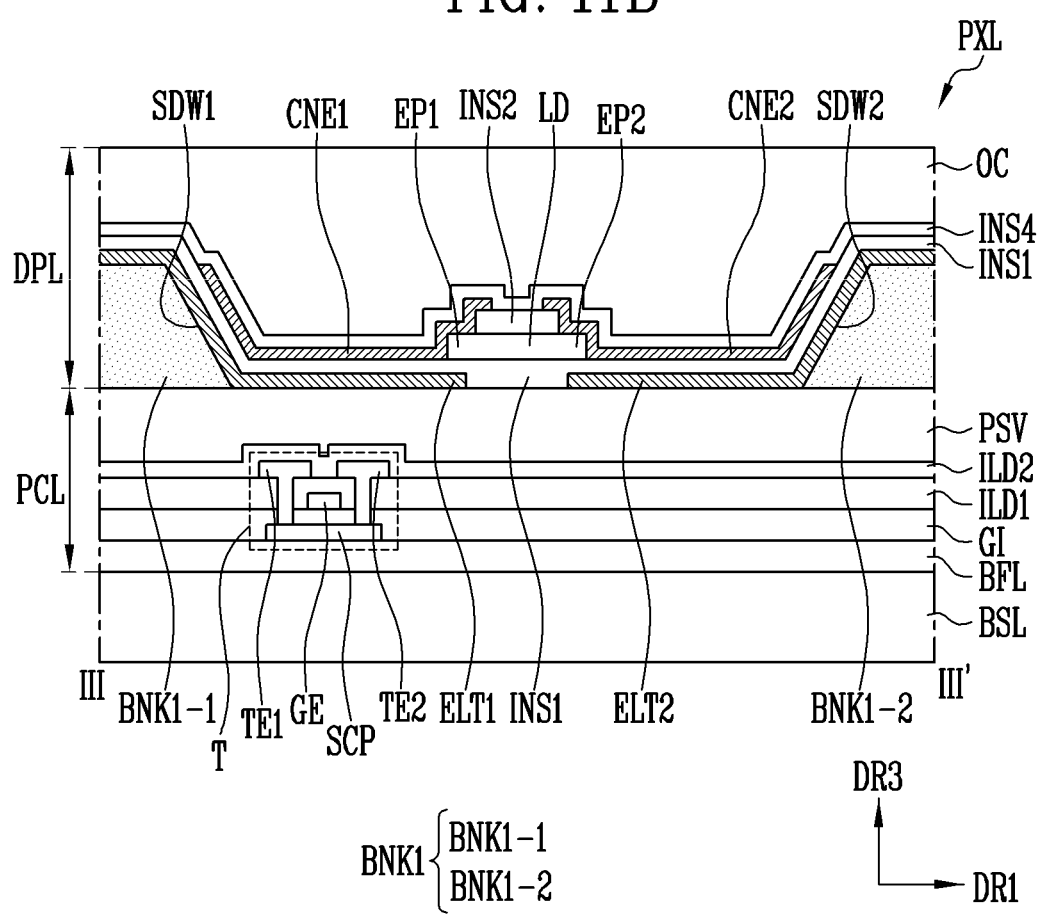
Figure 11C:
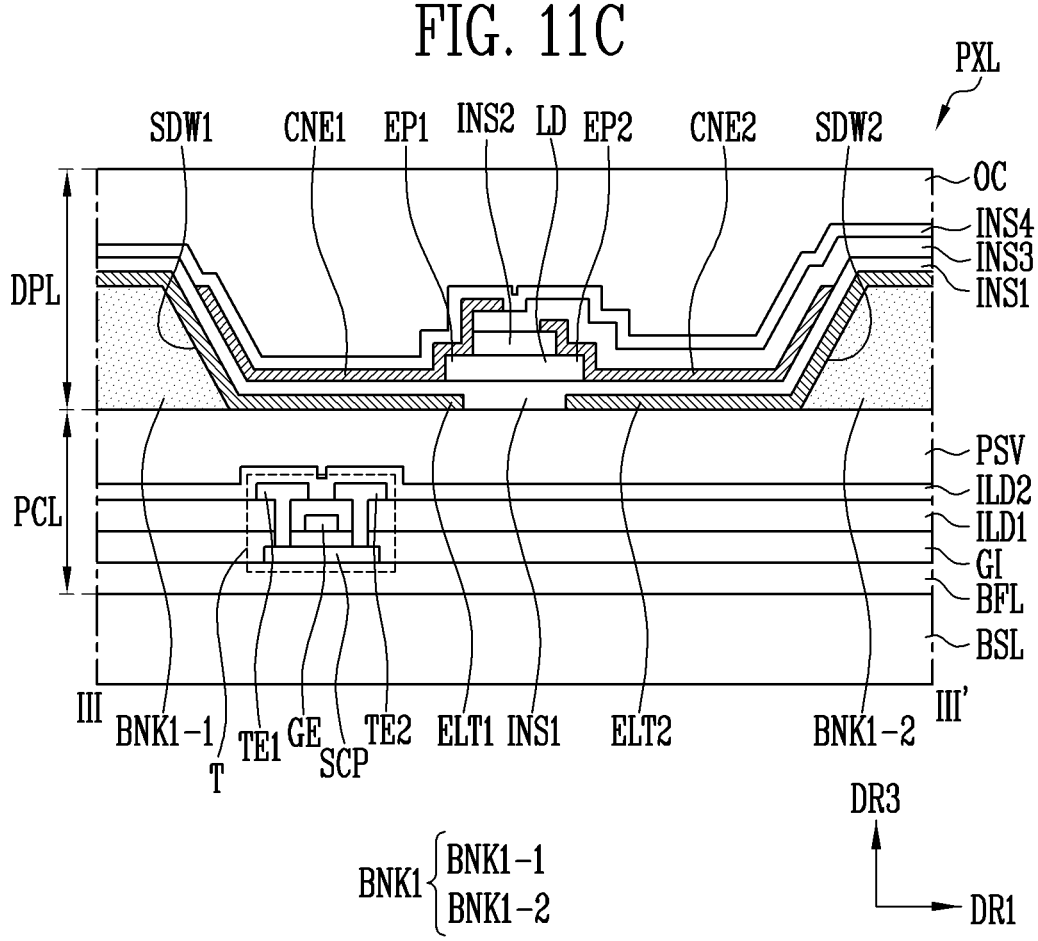

FIGS. 11A-11D are sectional views each illustrating a pixel PXL in accordance with one or more example embodiments of the present disclosure. For example, FIGS. 11A-11C illustrate different embodiments of a section of the pixel PXL taken along the line III-III' shown in FIG. 10A. For example, FIG. 11A illustrates an embodiment in which, like embodiment shown in FIG. 9A, first and second contact electrodes CNE1 and CNE2 are formed in different processes, and a third insulating layer INS3 is interposed between the first and second contact electrodes CNE1 and CNE2. FIG. 11B illustrates an embodiment in which, like the embodiments shown in FIG. 9B, the first and second contact electrodes CNE1 and CNE2 are formed in the same layer. FIG. 11C illustrates a modified embodiment of the embodiment shown in FIG. 11A. FIG. 11D illustrates an embodiment of a section of the pixel PXL taken along the line IV-IV' shown in FIG. 10A.

Figure 11E:
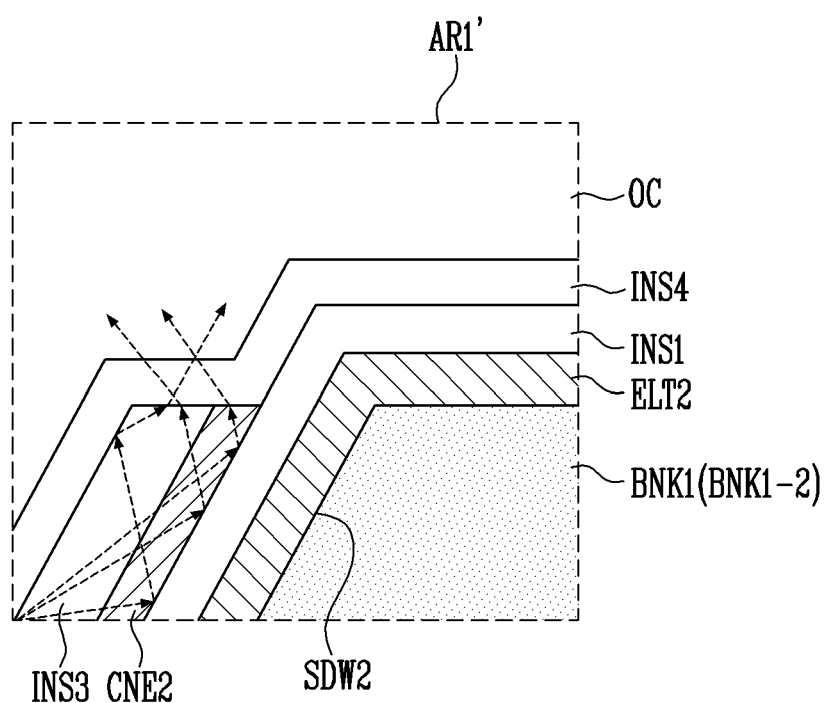
FIG. 11E is an enlarged view of one area shown in FIG. 11A.

FIG. 11E is an enlarged view of one area shown in FIG. 11A. For example, FIG. 11E illustrates an enlarged view of area AR1' shown in FIG. 11A and an example propagation path of some of lights passing through the area AR1'.

In the example embodiments shown in FIG. 10A-11E, components similar or identical to those of the above-described embodiments (e.g., components corresponding thereto) are designated by like reference numerals, and their detailed descriptions will be omitted.

Referring to FIGS. 10A-11E, the first contact electrode CNE1 may be formed such that one end (e.g., one end located at one side of an area in which light emitting elements LD are disposed) of the first contact electrode CNE1 is ended on the first sidewall SDW1 of the first bank BNK1. For example, the first contact electrode CNE1 may be formed such that a left end portion of the first contact electrode CNE1 overlaps with the first sidewall SDW1 of the first bank BNK1 and has a narrower width in the first direction DR1 not to extend onto the upper surface of the first bank BNK1.

Similarly, the second contact electrode CNE2 may be formed such that one end (e.g., one end located at one side of the area in which the light emitting elements LD are disposed) of the second contact electrode CNE2 is ended on the second sidewall SDW2 of the first bank BNK1. For example, the second contact electrode CNE2 may be formed such that a right end portion of the second contact electrode CNE2 overlaps with the second sidewall SDW2 of the first bank BNK1 and has a narrower width in the first direction DR1 not to extend onto the upper surface of the first bank BNK1.

In some embodiments, the one ends, respectively, of the first and second contact electrodes CNE1 and CNE2 may be ended such that upper surfaces of the one ends are flat respectively on the first sidewall SDW1 and the second sidewall SDW2 (e.g., the upper surfaces are parallel to the base layer BSL). For example, the one ends (e.g., one ends facing one ends located on the first and second end portions EP1 and EP2 of the light emitting elements LD) of the first and second contact electrodes CNE1 and CNE2 may be respectively disconnected in oblique directions inclined with respect to extending directions of the first sidewall SDW1 and the second sidewall SDW2 such that the upper surfaces of the one ends are substantially flat.

When a third insulating layer INS3 covering the second contact electrode CNE2 is further provided in the embodiment shown in FIG. 11A and the like, one end (e.g., a right end as one end located at one side of the area in which the light emitting elements LD are disposed) of the third insulating layer INS3 may be ended such that an upper surface of the one end is flat on the second sidewall SDW2. For example, the one end of the third insulating layer INS3 may be ended on the second sidewall SDW2 to have a height equal to or different from that of the second contact electrode CNE2.

In another embodiment, as shown in FIG. 11C, the third insulating layer INS3 may be continued up to the upper surface of the first bank BNK1 via an upper portion of the second sidewall SDW2, even when the one end of the second contact electrode CNE2 is ended on the second sidewall SDW2.

In some embodiments, the one ends of the first contact electrode CNE1, the second contact electrode CNE2, and/or the third insulating layer INS3 may have a height substantially similar or equal to that of the first sidewall SDW1 and/or the second sidewall SDW2. For example, the one ends of the first contact electrode CNE1, the second contact electrode CNE2, and/or the third insulating layer INS3 may be ended at a highest height or less of the first sidewall SDW1 and/or the second sidewall SDW2 (or a highest height or less of the first insulating layer INS1 on the first sidewall SDW1 and/or the second sidewall SDW2). For example, the one end of the first contact electrode CNE1 may be ended at the highest height or less of the first sidewall SDW1 with respect to the base layer BSL. In addition, the one end of the second contact electrode CNE2 and/or the third insulating layer INS3 may be ended at the highest height or less of the second sidewall SDW2 with respect to the base layer BSL. For example, the one end of the first contact electrode CNE1 may be ended at the highest height of the first sidewall SDW1, and the one end of the second contact electrode CNE2 and/or the one end of the third insulating layer INS3 may be ended at the highest height of the second sidewall SDW2. Accordingly, the first contact electrode CNE1, the second contact electrode CNE2, and/or the third insulating layer INS3 can be prevented from being located on the upper surface of the first bank BNK1 via the first sidewall SDW1 and/or the second sidewall SDW2.

In some embodiments, the one ends of the first and second contact electrodes CNE1 and CNE2 may end at the same height with respect to the base layer BSL, but the present disclosure is not limited thereto. In addition, the first and second side walls SDW1 and SDW2 may be formed at the same height with respect to the base layer BSL, but the present disclosure is not limited thereto.

Also, in some embodiments, the one end of the first contact electrode CNE1 and/or the one end of the second contact electrode CNE2 may be ended at a height higher than that of the first bank BNK1. For example, the one end of the first contact electrode CNE1 and/or the one end of the second contact electrode CNE2 may be ended at a height similar or equal to those of the first electrode ELT1, the second electrode ELT2, and/or the first insulating layer INS1 on the first and second sidewalls SDW1 and SDW2. However, each of the first and second contact electrodes CNE1 and CNE2 and/or the third insulating layer INS3 may be formed not to be continued up to the upper surface of the first bank BNK1 via an upper portion of the first sidewall SDW1 or the second sidewall SDW2.

When a contact portion for connecting the first and second contact electrodes CNE1 and CNE2 and the first and second electrodes ELT1 and ELT2 is not sufficiently secured because the one end of each of the first and second contact electrodes CNE1 and CNE2 is disconnected on the first and second sidewalls SDW1 and SDW2, lengths of the first and second contact electrodes CNE1 and CNE2 may extend to secure the contact portion with the first and second electrodes ELT1 and ELT2. For example, upper areas and/or lower areas of the first and second contact electrodes CNE1 and CNE2 may extend up to an area overlapping with the second bank BNK2 or an area close thereto, so that overlapping areas of the first and second electrodes ELT1 and ELT2 and the first and second contact electrodes CNE1 and CNE2 can be secured. In addition, the first and second electrodes ELT1 and ELT2 may be directly/indirectly connected to the first and second contact electrodes CNE1 and CNE2 in the secured areas.

For example, the first electrode ELT1 and the first contact electrode CNE1 may be connected to each other at least one first contact portion CNA1 located in the upper area and/or the lower area of the first contact electrode CNE1 when viewed on a plane. In addition, the second electrode ELT2 and the second contact electrode CNE2 may be connected to each other at least one second contact portion CNA2 located in the upper area and/or the lower area of the second contact electrode CNE2 when viewed on a plane.

For example, as shown in FIGS. 10A-10C and 11D, the first electrode ELT1 and the first contact electrode CNE1 may be connected to each other through at least one third contact hole CH3 located at the first contact portion CNA1, and the second electrode ELT2 and the second contact electrode CNE2 may be connected to each other through a fourth contact hole CH4 located at the second contact portion CNA2. The third contact hole CH3 may be formed in an area overlapping with the second bank BNK2, or may be formed in an area which does not overlap with the second bank BNK2. Similarly, the fourth contact hole CH4 may be formed in an area overlapping with the second bank BNK2, or may be formed in an area which does not overlap with the second bank BNK2.

In some embodiments, when the end portions of the first and second contact electrodes CNE1 and CNE2 (e.g., one ends located at respective sides of the light emitting elements LD) are not continued to the upper surface of the first bank BNK1, the first insulating layer INS1 is not opened on the upper surface of the first bank BNK1 but may cover the first and second electrodes ELT1 and ELT2. For example, the first insulating layer INS1 may be selectively opened in an area in which connection between the electrodes is necessary, etc., and cover the first and second electrodes ELT1 and ELT2 in the other area. In another embodiment, the first insulating layer INS1 may remain at only lower portions of the light emitting elements LD.

In the present disclosure, the shapes, sizes, and/or positions of the first electrode ELT1, the second electrode ELT2, the first contact electrode CNE1, and/or the second contact electrode CNE2 may be variously modified in some embodiments.

For example, the first electrode ELT1, the second electrode ELT2, the first contact electrode CNE1, and/or the second contact electrode CNE2 may extend up to an area overlapping with the second bank BNK2 as illustrated in the embodiments shown in FIGS. 10A and 10B. In another embodiment, the first electrode ELT1, the second electrode ELT2, the first contact electrode CNE1, and/or the second contact electrode CNE2 may be formed in an area surrounded by the second bank BNK2 when viewed on a plane, not to overlap with the second bank BNK2 as illustrated in the embodiment shown in FIG. 10C.

In addition, as illustrated in the embodiment shown in FIG. 10C, the first contact electrode CNE1 may have a width (e.g., a width in the first direction DR1) partially extending at each first contact portion CNA1. Similarly, the second contact electrode CNE2 may have a width partially extending at each second contact part CNA2. For example, the second contact electrode CNE2 may have a structure in which the width of the second contact electrode CNE2 partially extends in an area in which each contact portion CNA2 is formed, including a "⊏" shape (e.g., a rotated "U" shape), etc., and the first contact electrode CNE1 may have a shape substantially symmetrical to that of the second contact electrode CNE2. In the first contact portion CNA1 and/or the second contact portion CNA2, when the width of the first contact electrode CNE1 and/or the width of the second contact electrode CNE2 extends, a space for forming the third contact hole CH3 and/or the fourth contact hole CH4 can be sufficiently secured.

In still another embodiment, in each first contact portion CNA1 and/or each second contact portion CNA2, a plurality of third contact holes CH3 and/or a plurality of fourth contact holes CH4 may be formed, or the first insulating layer INS1 may be entirely removed, so that a wider contact area can be secured.

Although an embodiment in which both the first and second contact electrodes CNE1 and CNE2 are disposed at both sides of the light emitting elements LD has been disclosed in the above-described embodiments, the present disclosure is not limited thereto. For example, in another embodiment, the first or second contact electrode CNE1 or CNE2 may be disposed at only any one side of the light emitting elements LD.

In the above-described embodiments, on a path through which lights emitted from the light emitting elements LD can pass, at least one high refractive layer from among high refractive layers (e.g., the first and second contact electrodes CNE1 and CNE2 and/or the third insulating layer INS3) which can become a path of in-plane light propagation may be disconnected on the first sidewall SDW1 and/or the second sidewall SDW2 not to be continued up to the upper surface of the first bank BNK1. Accordingly, as indicated by dotted arrows shown in FIG. 11E, light propagated in plane through the high refractive layer may be emitted in an upper direction of the pixel PXL at one end of the high refractive layer. For example, when the high refractive layer is disconnected in an oblique direction inclined with respect to an extending direction on the first sidewall SDW1 and the second sidewall SDW2 to have a flat upper surface (e.g., when one end of the high refractive layer is formed in a chamfered shape), the incident angle of light propagated in the high refractive layer decreases, and therefore, the light may be emitted to an upper portion of the pixel PXL.

Meanwhile, the second insulating layer INS2 which may be concurrently etched (or simultaneously etched) with the third insulating layer INS3 may include the same high refractive material as the third insulating layer INS3 (e.g., a material having a refractive index greater than those of the first and fourth insulating layers INS1 and INS4). However, the second insulating layer INS2 is locally disposed only on the other area except the first and second end portions EP1 and EP2 of the light emitting elements LD, and light loss caused by in-plane light propagation such as third insulating layer INS3 may hardly occur.

In addition, as described above, the first and fourth insulating layers INS1 and INS4 and the overcoat layer OC may be made of a low refractive material for the purpose of refractive index matching. For example, the first and fourth insulating layers INS1 and INS4 and the overcoat layer OC may have a refractive index smaller than those of the first and second electrodes ELT1 and ELT2, the first and second contact electrodes CNE1 and CNE2, and/or the second and third insulating layers INS2 and INS3.

In accordance with the above-described embodiments, at least one of high refractive layers of the pixel PXL, which are located on a path through which lights emitted from the light emitting elements LD advance, is disconnected on the first sidewall SDW1 and/or the second sidewall SDW2 of the first bank BNK1, so that light propagated in the high refractive layer can be emitted in an upper direction of the pixel PXL. Accordingly, in a structure (e.g., a structure of the embodiments shown in FIGS. 9A-9D) in which a high refractive layer is continued up to the upper surface of the first bank BNK1 via upper portions of the first and second sidewalls SDW1 and SDW2, the amount of light which is not emitted to the outside but disappears because the light is locked in a light waveguide formed by the high refractive layer can be reduced. Accordingly, the light emitting efficiency of the pixels PXL can be improved, and the amount of light emitted in the front direction of the display panel PNL can be increased. FIGS. 12A and 12B, 13A and 13B, and 14A and 14B are sectional views each illustrating a pixel PXL in accordance with one or more example embodiments of the present disclosure. For example, FIGS. 12A and 12B, 13A and 13B, and 14A and 14B illustrate different modified embodiments of the embodiments shown in FIGS. 11A and 11B. In descriptions of the modified embodiments, detailed descriptions of components similar or identical to those of the above-described embodiments will be omitted.

Figure 12A:
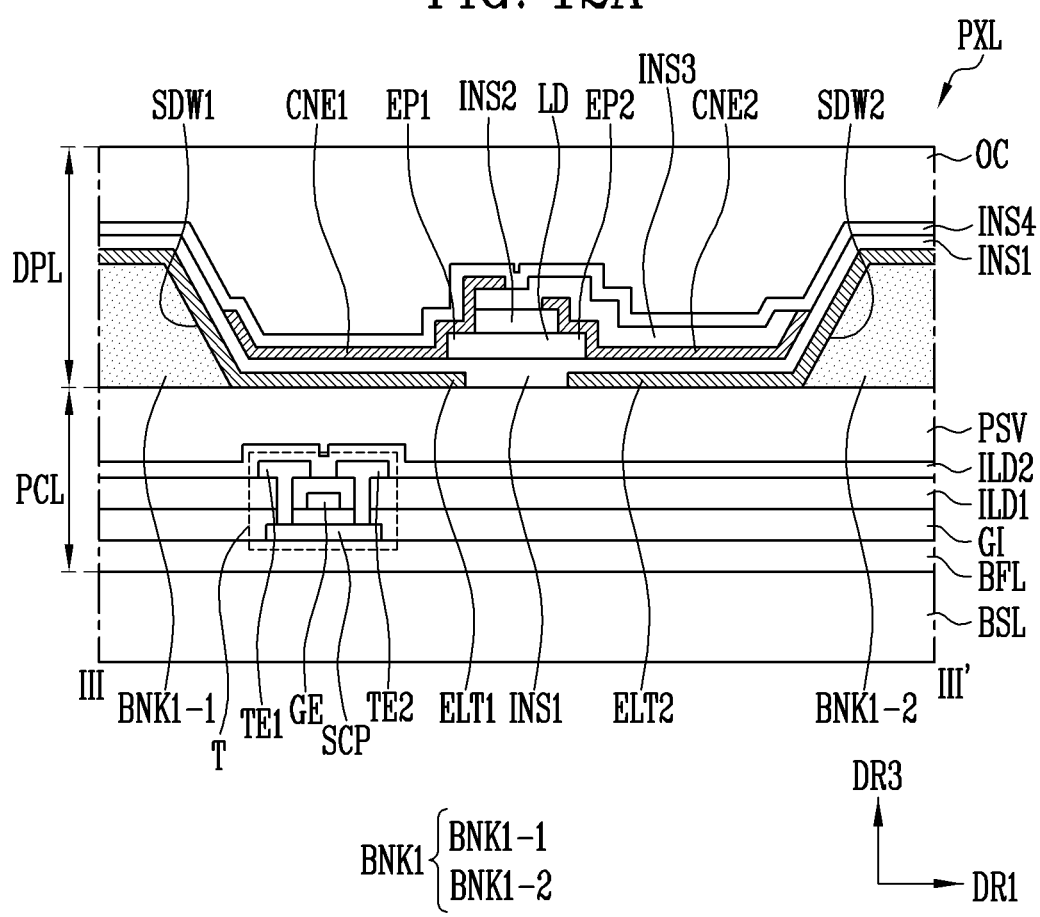
FIGS. 12A and 12B are sectional views each illustrating a pixel in accordance with one or more example embodiments of the present disclosure.
Figure 12B:
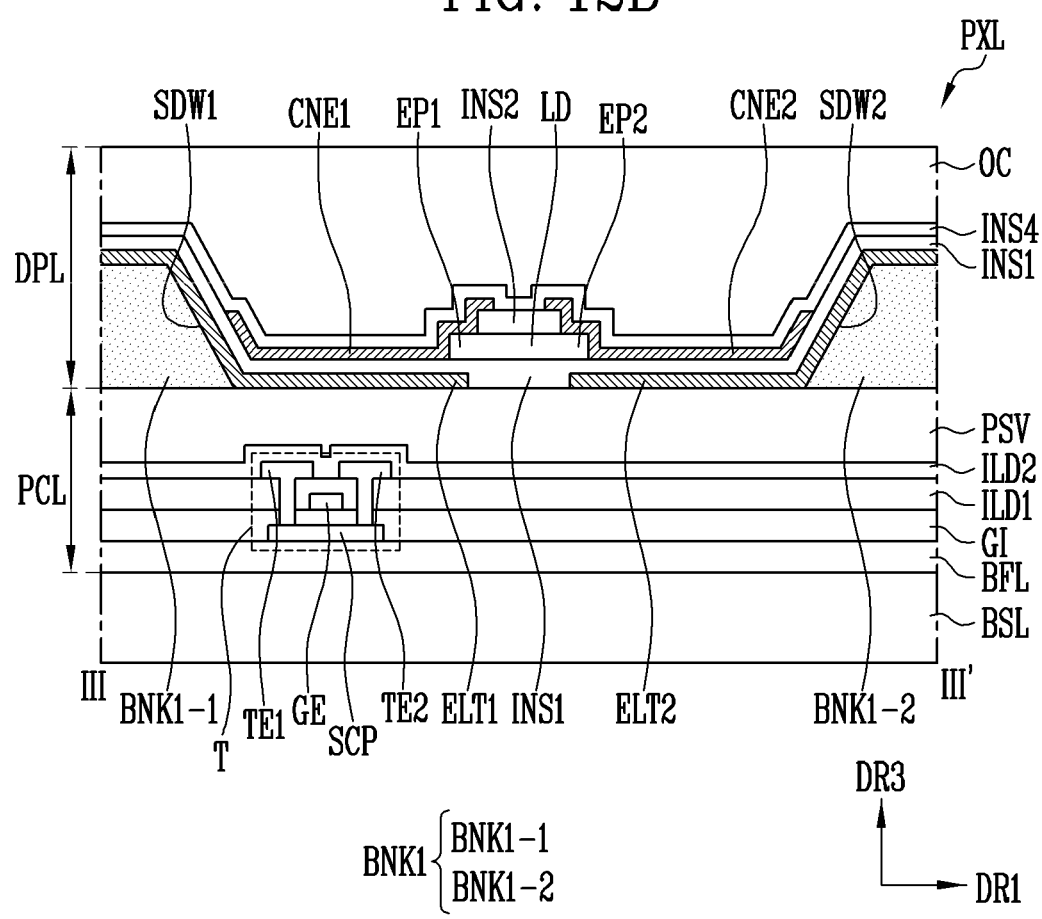
Figure 13B:
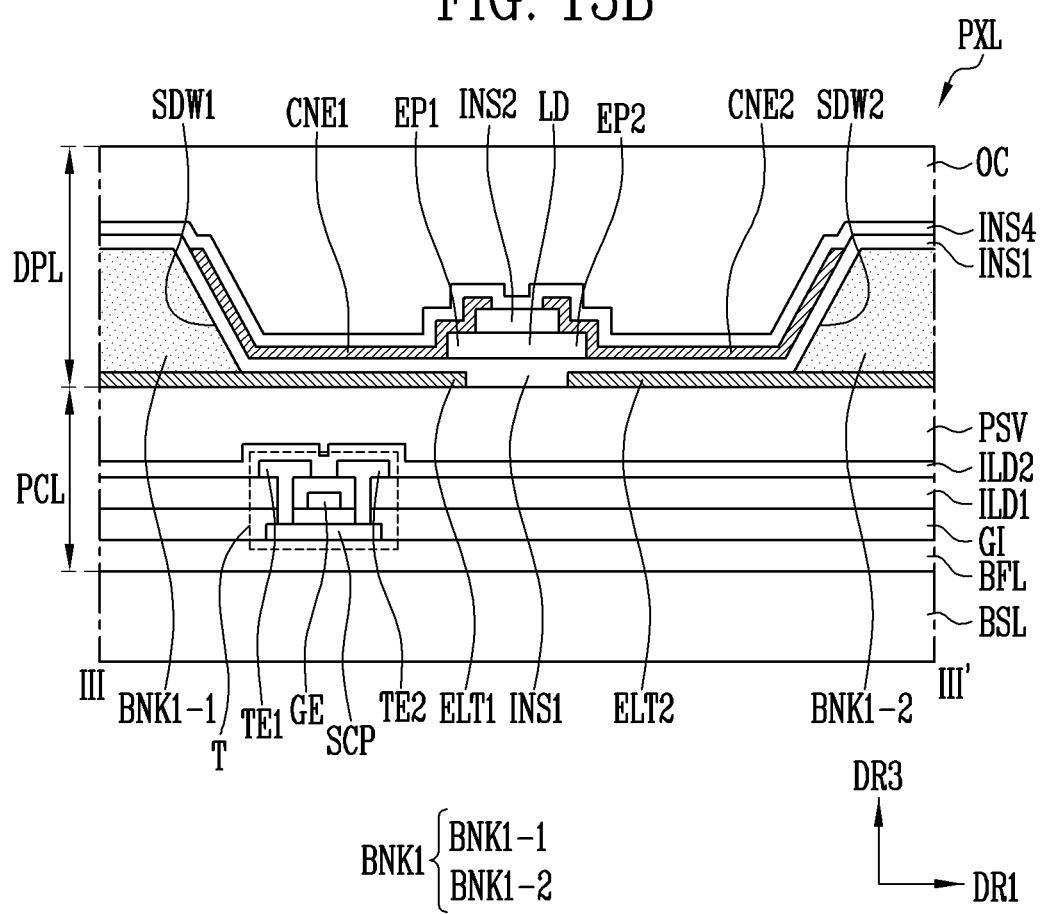
Figure 14A:
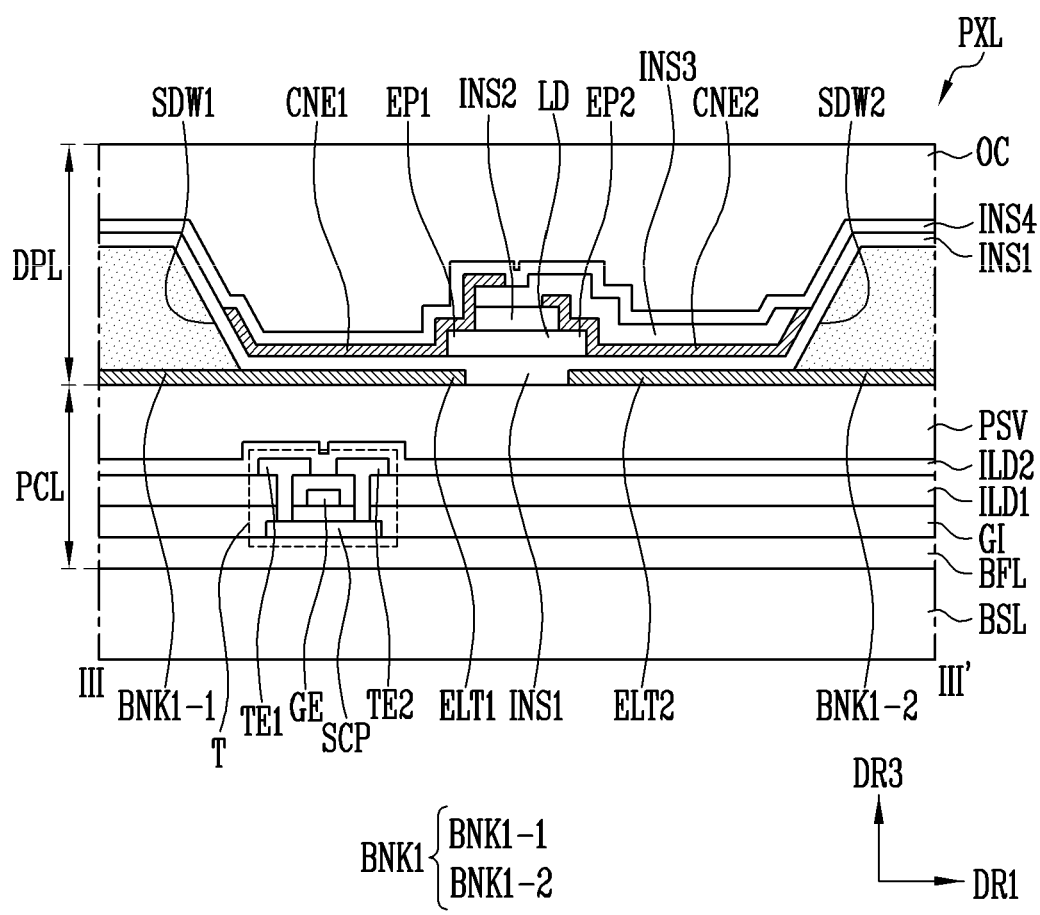
FIGS. 14A and 14B are sectional views each illustrating a pixel in accordance with one or more example embodiments of the present disclosure.
Figure 14B:
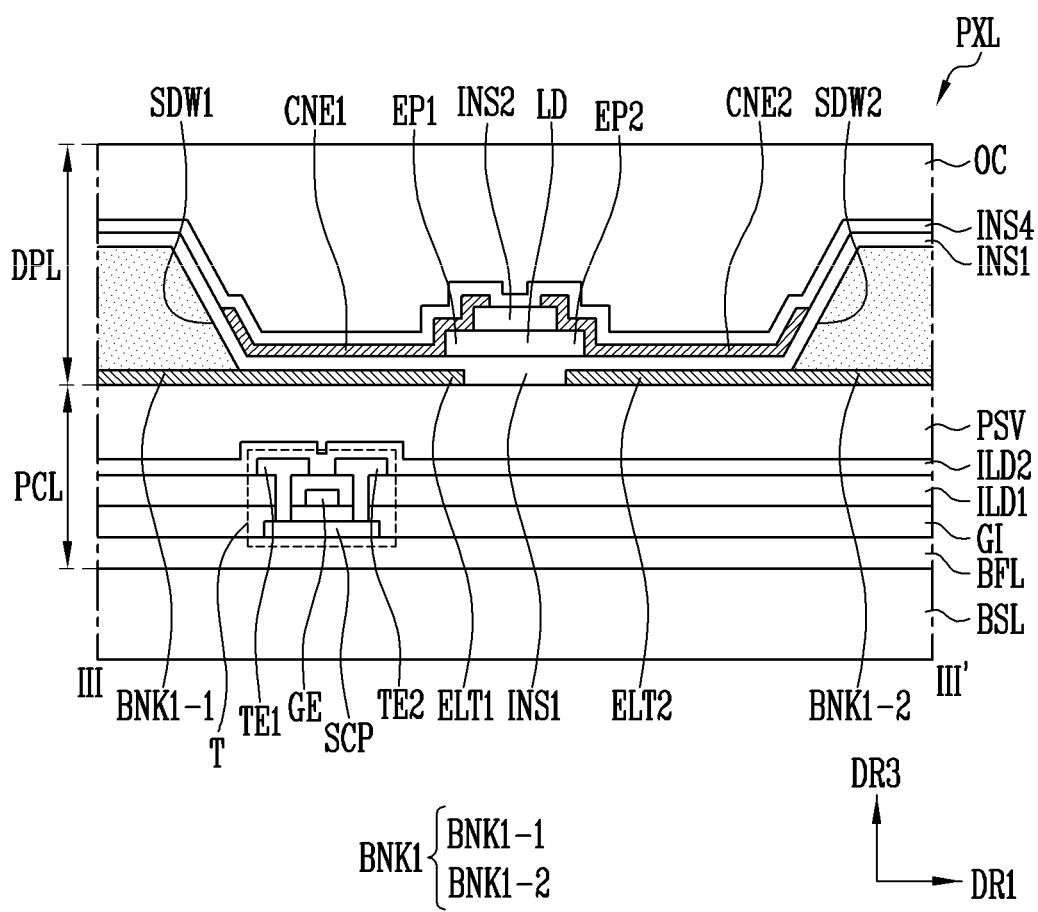

First, referring to FIGS. 12A and 12B, as compared with the embodiments shown in FIGS. 11A and 11B, one ends of first and second contact electrodes CNE1 and CNE2 and/or a third insulating layer INS3 may be ended at a lower height. For example, the one end of the first contact electrode CNE1 may be ended at a height lower than the highest height of the first sidewall SDW1, and the one end of the second contact electrode CNE2 and/or the one end of the third insulating layer INS3 may be ended at a height lower than the highest height of the second sidewall SDW2. For example, the heights at which the first and second contact electrodes CNE1 and CNE2 and/or the third insulating layer INS3 are disconnected on the first and second sidewalls SDW1 and SDW2 may be changed in some embodiments. For example, the heights at which the first and second contact electrodes CNE1 and CNE2 and/or the third insulating layer INS3 are disconnected may be determined according to a design condition of the pixel PXL, a process condition of the pixel PXL, and/or a light emission rate of the pixel PXL.

Referring to FIGS. 13A and 13B, and 14A and 14B, unlike the embodiments shown in FIGS. 11A and 11B and the embodiments shown in FIGS. 12A and 12B, a first electrode ELT1 and a second electrode ELT2 may be disposed on the bottom of the first bank BNK1. For example, the first electrode ELT1 may be disposed on the bottom of one area (e.g., the (1-1)th bank BNK1-1) of the first bank BNK1 including the first sidewall SDW1, and the second electrode ELT2 may be disposed on the bottom of another area (e.g., the (1-2)th bank BNK1-2) of the first bank BNK1 including the second sidewall SDW2. The first and second electrodes ELT1 and ELT2 may have a substantially flat surface.

As described above, when the first and second electrodes ELT1 and ELT2 are disposed on the bottom of the first bank BNK1, an amount of light absorbed by the first and second electrodes ELT1 and ELT2 can be reduced, as compared with when the first and second electrodes ELT1 and ELT2 are disposed on the first and second sidewalls SDW1 and SDW2. Thus, the first and second electrodes ELT1 and ELT2 can be selectively disposed on the top or the bottom of the first bank BNK1 by synthetically considering amounts of light reflected and absorbed by the first and second electrodes ELT1 and ELT2.

In the above-described embodiments, a high refractive layer of the pixel located on a path through which lights emitted from the light emitting elements LD advance is disconnected on the first and second sidewalls SDW1 and SDW2 of the first bank BNK1 not to be continued to the upper surface of the first bank BNK1 via the first sidewall SDW1 and the second sidewall SDW2. Accordingly, light waveguided in the high refractive layer of the pixel PXL can be emitted to an upper surface of the pixel PXL at one end of the high refractive layer. Thus, in the above-described embodiments, the light efficiency of the pixels PXL can be improved, and the amount of light emitted in the front direction of the display panel PNL can be increased.

Figure 15A:
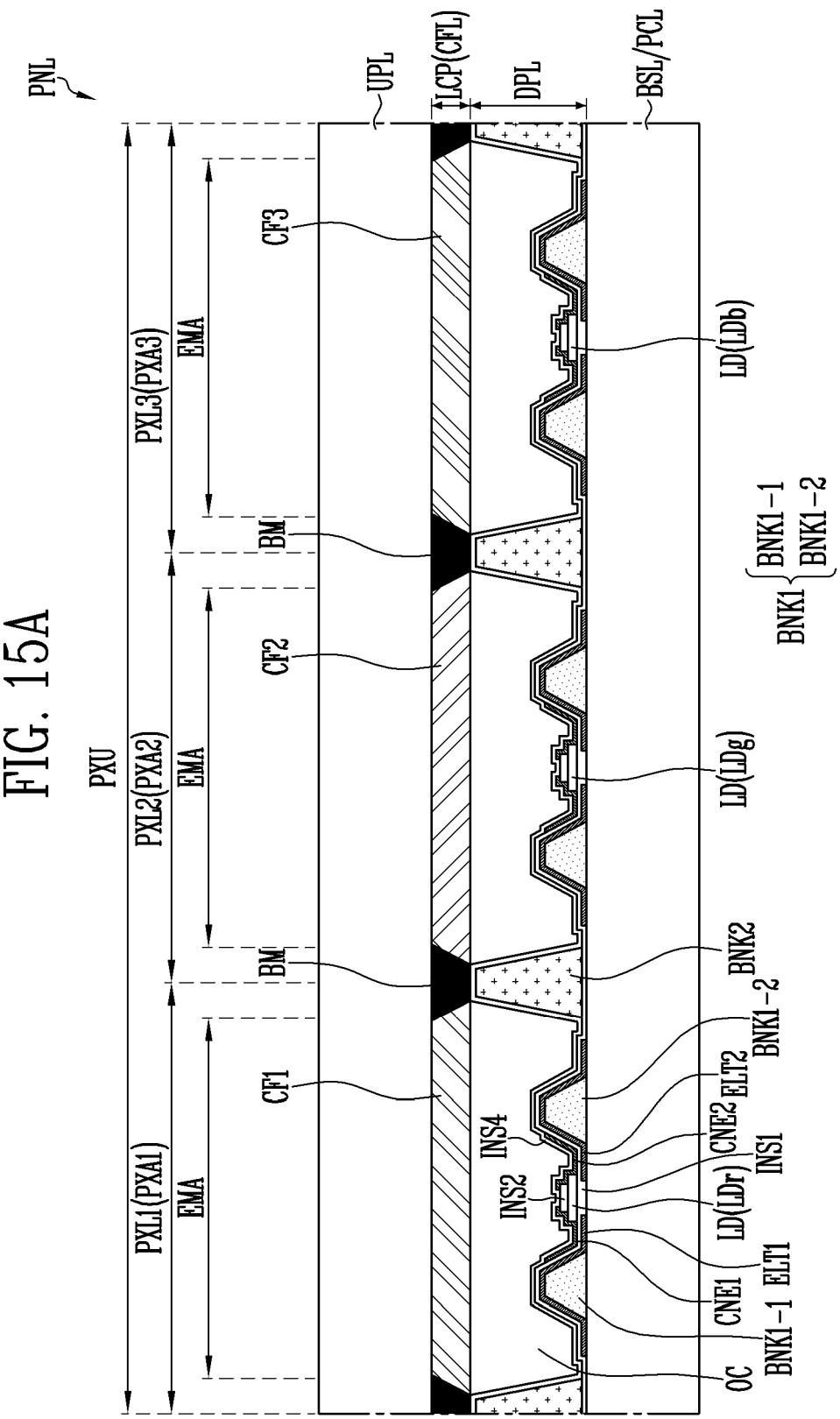
FIGS. 15A and 15B are sectional views each illustrating a display device in accordance with one or more example embodiments of the present disclosure.
Figure 15B:
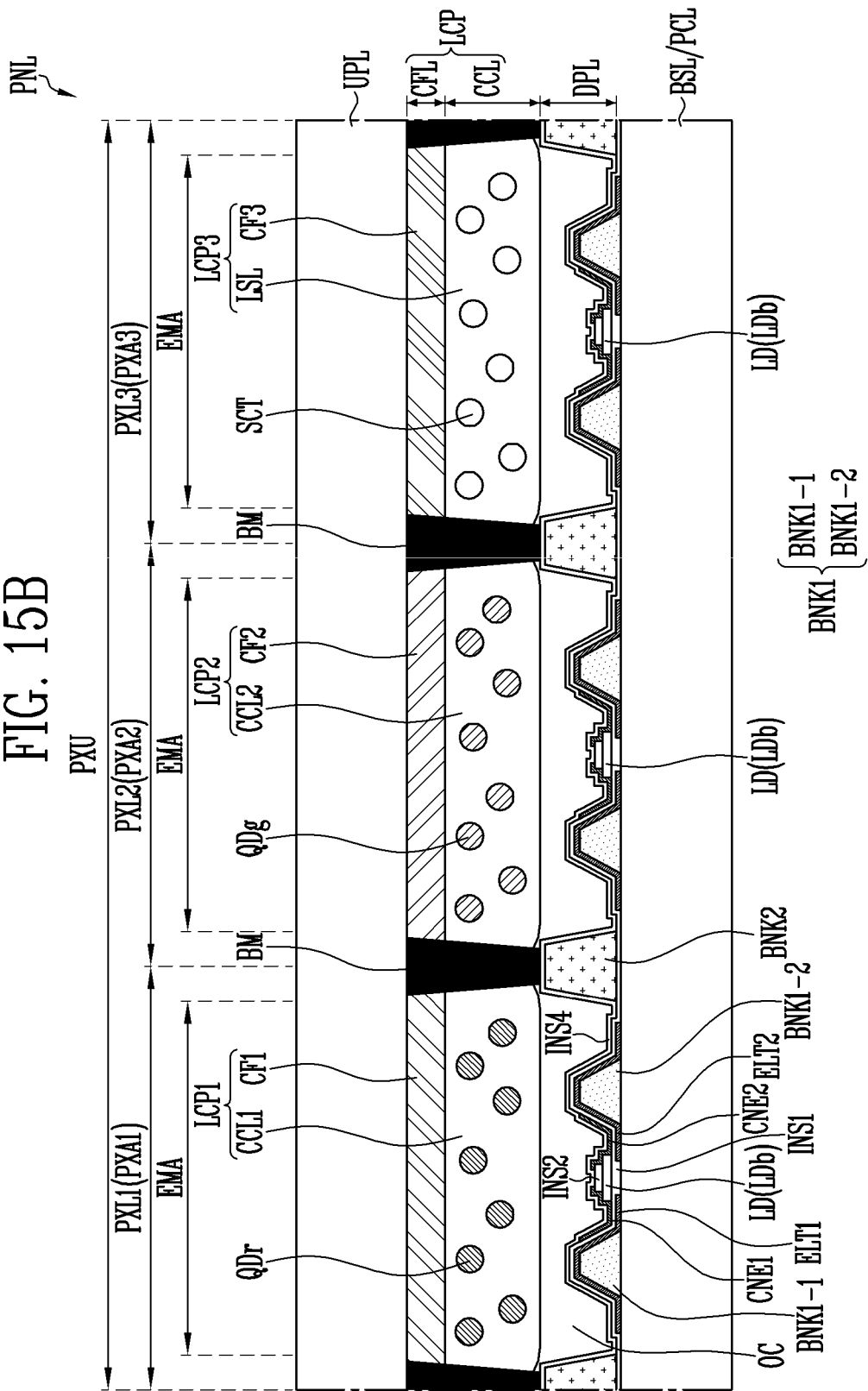

FIGS. 15A and 15B are sectional views each illustrating a display device in accordance with one or more example embodiments of the present disclosure. For example, FIG. 15A discloses an embodiment of a display panel PNL that does not include color conversion particles (e.g., read and green quantum dots QDr and QDg), and FIG. 15B discloses an embodiment of the display panel PNL including the color conversion particles. For example, the display device in accordance with the present disclosure may selectively include color conversion particles disposed at upper portions of pixels PXL.

For convenience, different embodiments of a section of one area of the display panel PNL including the pixel PXL in accordance with the embodiment shown in FIG. 11B will be illustrated in FIGS. 15A and 15B. However, it will be apparent that the structure of the pixel PXL may have a structure of another embodiment from among the above-described embodiments in addition to the embodiment shown in FIG. 11B.

In some embodiments, a section of the display panel PNL will be illustrated based on an area in which any one pixel unit PXU configured with a first color pixel PXL1, a second color pixel PXL2, and a third color pixel PXL3, which are adjacent to each other, is disposed. In some embodiments, an example structure of each pixel PXL has been disclosed in detail with reference to the above-described embodiments, and therefore, a structure of each pixel PXL will be schematically illustrated in FIGS. 15A and 15B, based on one light emitting element LD. In the embodiments shown in FIGS. 15A and 15B, components similar or identical to those of the above-described embodiments are designated by like reference numerals, and their detailed descriptions will be omitted.

First, referring to FIGS. 5-15A, a light source unit LSU of each pixel PXL may be disposed in a display layer DPL on a base layer BSL and/or a circuit layer PCL. For example, a light source unit LSU of a corresponding pixel PXL may be disposed in each emission area EMA of the display layer DPL. In addition, a second bank BNK2 which defines adjacent emission areas EMA may be disposed between the emission areas EMA.

The light source unit LSU which may be variously configured in some embodiments may be formed in the emission area EMA of each pixel PXL. For example, the first bank BNK1, the first and second electrodes ELT1 and ELT2, the light emitting elements LD, the first and second contact electrodes CNE1 and CNE2, the first, second, and fourth insulating layers INS1, INS2, and INS4, and the overcoat layer OC, which are shown in FIG. 11B, may be located in each emission area EMA. In addition, high refractive layers in each pixel PXL, such as the first and second contact electrodes CNE1 and CNE2, may be disconnected on the first and second sidewalls SDW1 and SDW2 of the bank BNK1.

The first color, second color, and third color pixels PXL1, PXL2, and PXL3 may include light emitting elements LD emitting lights of different colors. For example, each first color pixel PXL1 may include a first color light emitting element LDr, each second color pixel PXL2 may include a second color light emitting element LDg, and each third color pixel PXL3 may include a third color light emitting element LDb. In some embodiments, the first color light emitting element LDr, the second color light emitting element LDg, and the third color light emitting element LDb may be respectively a red light emitting element, a green light emitting element, and a blue light emitting element, but the present disclosure is not limited thereto.

The second bank BNK2 may be disposed in a boundary area of first color, second color, and third color pixel areas PXA1, PXA2, and PXA3 in which the first color, second color, and third color pixels PXL1, PXL2, and PXL3 are respectively provided, to surround the emission area EMA of each pixel PXL. Also, the second bank BNK2 may be disposed at an edge of a display area DA in which the pixels PXL are disposed, to surround the display area DA. Hereinafter, when an arbitrary pixel area from among the first color, second color, and third color pixel areas PXA1, PXA2, and PXA3 is designated or when two or more pixel areas are inclusively designated, the pixel area or the pixel areas will be referred to as a "pixel area PXA" or "pixel areas PXA."

The position (e.g., position for each layer on a section) or forming process of the second bank BNK2 may be variously modified in some embodiments. Also, the shape, size, and/or material of the second bank BNK2 may be variously changed according to a design condition of the display panel PNL, etc. For example, the second bank BNK2 may be a single- or multi-layered pattern having a section with various shapes including a trapezoidal shape, a semicircular shape, a semi-elliptical shape, and the like, and the size (e.g., width and/or height) or material of the pattern may be variously changed.

In some embodiments, an upper substrate UPL may be disposed on the top of the pixels PXL. For example, the upper substrate UPL (also, referred to as an "encapsulation substrate" or "color filter substrate") which encapsulates at least the display area DA may be disposed on one surface of the base layer BSL, on which the pixels PXL are disposed.

The upper substrate UPL may selectively include a light conversion layer LCP overlapping with the pixels PXL. For example, the light conversion layer LCP including a color filter layer CFL may be disposed on one surface of the upper substrate UPL, which faces the pixels PXL.

The color filter layer CFL may include a color filter corresponding to a color of each pixel PXL. For example, the color filter layer CFL may include a first color filter CF1 disposed on the top of the first color pixel PXL1 to allow light generated from the first color pixel PXL1 to be selectively transmitted therethrough, a second color filter CF2 disposed on the top of the second color pixel PXL2 to allow light generated from the second color pixel PXL2 to be selectively transmitted therethrough, and a third color filter CF3 disposed on the top of the third color pixel PXL3 to allow light generated from the third color pixel PXL3 to be selectively transmitted therethrough. In some embodiments, the first color filter CF1, the second color filter CF2, and the third color filter CF3 may be respectively a red color filter, a green color filter, and a blue color filter, but the present disclosure is not limited thereto. Hereinafter, when an arbitrary color filter from among the first color filter CF1, the second color filter CF2, and the third color filter CF3 is designated or when two or more color filters are inclusively designated, the color filter or the color filters will be referred to as a "color filter CF" or "color filters CF."

The first color filter CF1 may be disposed between the first color pixel PXL1 and the upper substrate UPL in the first color pixel area PXA1, and include a color filter material that allows light of a first color, which is generated from the first color pixel PXL1, to be selectively transmitted therethrough. For example, when the first color pixel PXL1 is a red pixel, the first color filter CF1 may include a red color filter material.

The second color filter CF2 may be disposed between the second color pixel PXL2 and the upper substrate UPL in the second color pixel area PXA2, and include a color filter material that allows light of a second color, which is generated from the second color pixel PXL2, to be selectively transmitted therethrough. For example, when the second color pixel PXL2 is a green pixel, the second color filter CF2 may include a green color filter material.

The third color filter CF3 may be disposed between the third color pixel PXL3 and the upper substrate UPL in the third color pixel area PXA3, and may include a color filter material that allows light of a third color, which is generated from the third color pixel PXL3, to be selectively transmitted therethrough. For example, when the third color pixel PXL3 is a blue pixel, the third color filter CF3 may include a blue color filter material.

A black matrix BM may be disposed between the color filters CF. For example, the black matrix BM may be disposed on the one surface of the upper substrate UPL to face the second bank BNK2. The black matrix BM may be disposed in the boundary area of the pixel areas PXA not to cover each emission area EMA.

The black matrix BM may include at least one black matrix material (e.g., at least one light blocking material currently known to those or ordinary skill in the art) from among various kinds of black matrix materials, and/or a color filter material of a specific color. Also, the black matrix BM may be formed of the same material as the second bank BNK2, but the present disclosure is not limited thereto. For example, the black matrix BM and the second bank BNK2 may include the same material or different materials.

In some embodiments, a space between a lower plate of the display panel PNL, which includes the base layer BSL, the display layer DPL, and the like, and an upper plate of the display panel PNL, which includes the upper substrate UPL, the light conversion layer LCP, and the like, may be filled with the overcoat layer OC having a relatively low refractive index in a range of about 1 to 1.6. In another embodiment, the space between the lower plate and the upper plate of the display panel PNL may be filled with an air layer.

Although an embodiment in which the upper substrate UPL is disposed on the top of the base layer BSL on which the pixels PXL are disposed has been disclosed in FIG. 15A, the present disclosure is not limited thereto. For example, the pixels PXL may be encapsulated by using a thin film encapsulation layer, etc. The color filters CF and/or the black matrix BM may be selectively provided in a window (not shown) disposed on the top of the display panel PNL.

Referring to FIG. 15B, the upper substrate UPL may include a light conversion layer LCP overlapping with the pixels PXL. The light conversion layer LCP may include a color filter layer CFL and/or a color conversion layer CCL, disposed on the upper substrate UPL to face the pixels PXL. The color conversion layer CCL may be disposed between the color filter layer CFL and the pixels PXL, and include color conversion particles.

The light conversion layer LCP may include a first light conversion layer LCP1 disposed on the top of the first color pixel PXL1, a second light conversion layer LCP2 disposed on the top of the second color pixel PXL2, and a third light conversion layer LCP3 disposed on the top of the third color pixel PXL3. Hereinafter, when an arbitrary light conversion layer from among the first light conversion layer LCP1, the second light conversion layer LCP2, and the third light conversion layer LCP3 is designated or when two or more light conversion layers are inclusively designated, the light conversion layer and the light conversion layers will be referred to as a "light conversion layer LCP" or "light conversion layers LCP."

At least some of the first, second, and third light conversion layers LCP1, LCP2, and LCP3 may include a color conversion layer CCL and/or a color filter layer CFL, which corresponds to a suitable color (e.g., a predetermined color). For example, the first light conversion layer LCP1 may include at least one of a first color conversion layer CCL1 including first color conversion particles corresponding to the first color and a first color filter CF1 that allows light of the first color to be selectively transmitted therethrough. Similarly, the second light conversion layer LCP2 may include at least one of a second color conversion layer CCL2 including second color conversion particles corresponding to the second color and a second color filter CF2 that allows light of the second color to be selectively transmitted therethrough. In some embodiments, the third color conversion layer LCP3 may include at least one of a light scattering layer LSL including light scattering particles SCT and a third color filter CF3 that allows light of the third color to be selectively transmitted therethrough.

In some embodiments, at least one insulating layer (not shown) may be disposed on a surface of each of the first color conversion layer CCL1, the second color conversion layer CCL2, and/or the light scattering layer LSL. For example, each insulating layer (e.g., a capping layer, a buffer layer, and/or a barrier layer) for protecting the first color conversion layer CCL1, the second color conversion layer CCL2, and/or the light scattering layer LSL may be disposed between the first color conversion layer CCL1, the second color conversion layer CCL2, and/or the light scattering layer LSL and each color filter CF and/or on the surface of each of the first color conversion layer CCL1, the second color conversion layer CCL2, and/or the light scattering layer LSL.

In some embodiments, the first color, the second color, and the third color pixels PXL1, PXL2, and PXL3 may include light emitting elements LD emitting light of the same color. For example, the first color, the second color, and the third color pixels PXL1, PXL2, and PXL3 may include third color light emitting elements LDb emitting light of the third color, e.g., blue, which belongs to a wavelength band of about 400 nm to 500 nm. In addition, a color conversion layer CCL including at least one kind of color conversion particles may be disposed on at least some pixels PXL from among the first color, the second color, and the third color pixels PXL1, PXL2, and PXL3. Accordingly, the display device in accordance with example embodiments of the present disclosure can display a full-color image.

The first color conversion layer CCL1 may be disposed on the one surface of the upper substrate UPL to face the first color pixel PXL1, and include first color conversion particles which convert light of the third color, which is emitted from a third color light emitting element LDb disposed in the first color pixel PXL1, into light of the first color. For example, when the third color light emitting element LDb disposed in the first color pixel PXL1 is a blue light emitting element emitting light of blue color, and the first color pixel PXL1 is a red pixel, the first color conversion layer CCL1 may include a red quantum dot QDr that converts light of blue color, which is emitted from the blue light emitting element, into light of red color.

For example, the first color conversion layer CCL1 may include a plurality of red quantum dots QDr dispersed in a matrix material (e.g., a predetermined matrix material) such as transparent resin. The red quantum dot QDr may absorb blue light and emit red light having a wavelength band of about 620 nm to 780 nm by shifting a wavelength of the blue light according to energy transition. In some embodiments, when the first color pixel PXL1 is a pixel of another color, the first color conversion layer CCL1 may include a first quantum dot corresponding to the color of the first color pixel PXL1.

In some embodiments, the second color conversion layer CCL2 may be disposed on the one surface of the upper substrate UPL to face the second color pixel PXL2, and include second color conversion particles which convert light of the third color, which is emitted from a third color light emitting element LDb disposed in the second color pixel PXL2, into light of the second color. For example, when the third color light emitting element LDb disposed in the second color pixel PXL2 is a blue light emitting element emitting light of blue color, and the second color pixel PXL2 is a green pixel, the second color conversion layer CCL2 may include a green quantum dot QDg that converts light of blue color, which is emitted from the blue light emitting element, into light of green color.

For example, the second color conversion layer CCL2 may include a plurality of green quantum dots QDg dispersed in a matrix material (e.g., a predetermined matrix material) such as transparent resin. The green quantum dot QDg may absorb blue light and emit green light having a wavelength band of about 500 nm to 570 nm by shifting a wavelength of the blue light according to energy transition. In some embodiments, when the second color pixel PXL2 is a pixel of another color, the second color conversion layer CCL2 may include a second quantum dot corresponding to the color of the second color pixel PXL2.

Each of the first quantum dot and the second quantum dot (e.g., the red quantum dot QDr and the green quantum dot QDg) may be selected from a Group II-IV compound, a Group IV-VI compound, a Group IV element, a Group IV compound, and any combination thereof, but the present disclosure is not limited thereto.

The first quantum dot and the second quantum dot may have a full width of half maximum (FWHM) of the light-emitting wavelength spectrum of about 45 nm or less, and light emitted through the first quantum dot and the second quantum dot may be emitted in all directions. Accordingly, the viewing angle of the display device can be improved.

In some embodiments, the first quantum dot and the second quantum dot may have a form such as a spherical, pyramidal, multi-arm type or cubic type nanoparticle, a nanotube, a nanowire, a nano fiber, or a nanoplate-like particle, but the present disclosure is not limited thereto. For example, the form of the first quantum dot and the second quantum dot may be variously modified.

In some embodiments of the present disclosure, light of blue color, which has a relatively short wavelength in a visible ray region, is incident into each of the red quantum data QDr and the green quantum dot QDg, so that the absorption coefficients of the red quantum data QDr and the green quantum dot QDg can be increased. Accordingly, the efficiency of light finally emitted from the first color pixel PXL1 and the second color pixel PXL2 can be improved, and excellent color reproducibility can be ensured. Further, the light source unit LSU of the first color, second color, and third color pixels PXL1, PXL2, and PXL3 is configured by using light emitting elements LD of the same color (e.g., the third color light emitting elements LDb), so that the manufacturing efficiency of the display device can be improved.

In some embodiments, the light scattering layer LSL may be disposed on the one surface of the upper substrate UPL to face the third color pixel PXL3. For example, the light scattering layer LSL may be disposed between the third color pixel PXL3 and the third color filter CF3.

In some embodiments, when a third color light emitting element LDb disposed in the third color pixel PXL3 is a blue light emitting element for emitting blue light, and the third color pixel PXL3 is a blue pixel, the light scattering layer LSL may be selectively provided to efficiently use light emitted from the third color light emitting element LDb. The light scattering layer LSL may include at least one kind of light scattering particles SCT.

For example, the light scattering layer LSL may include a plurality of light scattering particles SCT dispersed in a matrix material (e.g., a predetermined matrix material) such as transparent resin. For example, the light scattering layer LSL may include light scattering particles SCT such as titanium dioxide ($TiO_2$) or silica. In the present disclosure, the material constituting the light scattering particles SCT is not particularly limited, and the light scattering layer LSL may include various kinds of light scattering particles SCT. In some embodiments, the light scattering particles SCT is not to be disposed only in the third pixel area PXA3 in which the third color pixel PXL3 is formed. For example, the light scattering particles SCT may be selectively included in the first color conversion layer CCL1 and/or the second color conversion layer CCL2.

In some embodiments, the black matrix BM may extend in at least a thickness (or height) direction to be disposed even between the first color conversion layer CCL1, the second color conversion layer CCL2, and the light scattering layer LSL. For example, the black matrix BM may be a pattern having a single or multi-layered structure, which has a thickness corresponding to the entire thickness of the light conversion layer LCP including the color filter layer CFL and the color conversion layer CCL (e.g., a thickness substantially equal or similar to the entire thickness of the light conversion layer LCP). When the black matrix BM is disposed between the first color conversion layer CCL1, the second color conversion layer CCL2, and the light scattering layer LSL in a shape capable of defining an area in which the first color conversion layer CCL1, the second color conversion layer CCL2, and the light scattering layer LSL are formed, the first color conversion layer CCL1, the second color conversion layer CCL2, and/or the light scattering layer LSL may be formed through an inkjet process, etc.

In accordance with the embodiment shown in FIG. 15B, the pixels PXL and the display device including the same can be manufactured by using light emitting elements LD of a single color (e.g., the light emitting elements LDb of the third color). Further, the color conversion layer CCL is disposed on at least some pixels PXL, so that the full-color pixel unit PXU and the display device including the same can be manufactured.

In the pixel and the display device including the same in accordance with the present disclosure, at least one high refractive layer located on a path through which light emitted from a light emitting element of the pixel advances is formed such that one end of the high refractive layer is ended on the first and second sidewalls of the first bank. Thus, light waveguided in the high refractive layer is emitted to the outside of the pixel. Accordingly, the light efficiency of the pixel can be improved, and the amount of light emitted in the front direction of the display panel can be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and equivalents thereof.

What is claimed is:

1. A display device comprising:
   a pixel in a display area on a base layer,
   wherein the pixel comprises:
   a first electrode and a second electrode, the first and second electrodes being spaced from each other;
   a light emitting element between the first electrode and the second electrode, the light emitting element comprising a first end portion and a second end portion;
   a first bank overlapping with one area of each of the first electrode and the second electrode in a plan view, the first bank comprising a first sidewall adjacent to the first end portion of the light emitting element and a second sidewall adjacent to the second end portion of the light emitting element;
   at least one of a third electrode on the first end portion of the light emitting element to connect the first end portion of the light emitting element to the first electrode and a fourth electrode on the second end portion of the light emitting element to connect the second end portion of the light emitting element to the second electrode;
   a first insulating layer over the first electrode and the second electrode;
   a second insulating layer on one area of the light emitting element, the second insulating layer exposing the first end portion and the second end portion of the light emitting element; and
   a third insulating layer over the second insulating layer and the fourth electrode, and wherein one end of at least one of the third electrode, the fourth electrode, and the third insulating layer ends at at least one of the first sidewall and the second sidewall.

2. The display device of claim 1, wherein one end of the third electrode and one end of the fourth electrode are respectively ended on the first sidewall and the second sidewall such that upper surfaces of the one end of the third electrode and the one end of the fourth electrode are parallel to the base layer.

3. The display device of claim 1, further comprising a fourth insulating layer on top of the first to fourth electrodes and the light emitting element.

4. The display device of claim 3, wherein the third insulating layer has a refractive index greater than those of the first insulating layer and the fourth insulating layer.

5. The display device of claim 4, wherein one end of the third insulating layer ends at the second sidewall such that an upper surface of the one end of the third insulating layer is parallel to the base layer.

6. The display device of claim 4, wherein one end of the third insulating layer ends at a same height as the fourth electrode on the second sidewall.

7. The display device of claim 3, further comprising an overcoat layer on the fourth insulating layer, wherein the overcoat layer has a refractive index smaller than those of the first to fourth electrodes.

8. The display device of claim 1, wherein the second insulating layer comprises a same material as the third insulating layer, and is located only on top of the one area of the light emitting element.

9. The display device of claim 1, wherein one end of the third electrode ends at a height less than a highest height of the first sidewall with respect to the base layer, and one end of the fourth electrode ends at a height less than a highest height of the second sidewall with respect to the base layer.

10. The display device of claim 1, wherein the first electrode is on top of an one area of the first bank comprising the first sidewall, and the second electrode is on top of another area of the first bank comprising the second sidewall.

11. The display device of claim 1, wherein the first electrode is at bottom of one area of the first bank comprising the first sidewall, and the second electrode is at bottom of another area of the first bank comprising the second sidewall.

12. The display device of claim 1, wherein the first bank comprises:
a (1-1)th bank overlapping with the first electrode and the third electrode in a plan view; and
a (1-2)th bank overlapping with the second electrode and the fourth electrode in a plan view, the (1-2)th bank being separated from the (1-1)th bank.

13. The display device of claim 1, wherein the first bank surrounds an area in which the light emitting element is disposed, while having an opening or groove corresponding to the area in which the light emitting element is disposed.

14. The display device of claim 1, wherein the first electrode and the third electrode are connected to each other at at least one first contact portion located in an upper area or a lower area of the third electrode in a plan view, and the second electrode and the fourth electrode are connected to each other at at least one second contact portion located in an upper area or a lower area of the fourth electrode in a plan view.

15. The display device of claim 14, further comprising:
at least one first contact hole located at the first contact portion to connect the first electrode and the third electrode; and
at least one second contact hole located at the second contact portion to connect the second electrode and the fourth electrode.

16. A display device comprising:
a pixel in a display area on a base layer,
wherein the pixel comprises:
a first electrode and a second electrode, the first and second electrodes being spaced from each other;
a light emitting element between the first electrode and the second electrode, the light emitting element comprising a first end portion and a second end portion;
a first bank overlapping with one area of each of the first electrode and the second electrode in a plan view, the first bank comprising a first sidewall adjacent to the first end portion of the light emitting element and a second sidewall adjacent to the second end portion of the light emitting element;
at least one of a third electrode on the first end portion of the light emitting element to connect the first end portion of the light emitting element to the first electrode or a fourth electrode on the second end portion of the light emitting element to connect the second end portion of the light emitting element to the second electrode; and
an insulating layer over the fourth electrode, and
wherein one end of at least one of the third electrode, the fourth electrode, or the insulating layer ends at at least one of the first sidewall or the second sidewall,
wherein one end of the third electrode ends at a highest height of the first sidewall with respect to the base layer, and
one end of the fourth electrode ends at a highest height of the second sidewall with respect to the base layer.

17. A pixel comprising:
a first electrode and a second electrode, the first and second electrodes on one surface of a base layer to be spaced from each other;
a light emitting element between the first electrode and the second electrode, the light emitting element including a first end portion and a second end portion;
a first bank overlapping with one area of each of the first electrode and the second electrode in a plan view, the first bank comprising a first sidewall adjacent to the first end portion of the light emitting element and a second sidewall adjacent to the second end portion of the light emitting element;
at least one of a third electrode on the first end portion of the light emitting element to connect the first end portion of the light emitting element to the first electrode and a fourth electrode on the second end portion of the light emitting element to connect the second end portion of the light emitting element to the second electrode;
a first insulating layer over the first electrode and the second electrode;
a second insulating layer on one area of the light emitting element, the second insulating layer exposing the first end portion and the second end portion of the light emitting element; and
a third insulating layer over the second insulating layer and the fourth electrode, wherein one end of at least one of the third electrode, the fourth electrode, and the third insulating layer ends at at least one of the first sidewall and the second sidewall.

18. The pixel of claim 17, wherein one end of at least one of the third electrode or the fourth electrode ends at respective one of the first sidewall and the second sidewall such that an upper surface of each of the one end of at least one of the third electrode or the fourth electrode is parallel to the base layer.

19. The pixel of claim 17, wherein the third insulating layer ends at the second sidewall such that an upper surface of the third insulating layer is parallel to the base layer.

20. The pixel of claim 17, wherein the first electrode and the second electrode are on top of the first bank.

21. The pixel of claim 17, wherein the first electrode and the second electrode are at bottom of the first bank.

* * * * *